United States Patent

Paz de Araujo et al.

Patent Number: 6,080,592
Date of Patent: Jun. 27, 2000

[54] METHOD OF MAKING LAYERED SUPERLATTICE MATERIALS FOR FERROELECTRIC, HIGH DIELECTRIC CONSTANT, INTEGRATED CIRCUIT APPLICATIONS

[75] Inventors: Carlos A. Paz de Araujo; Joseph D. Cuchiaro; Michael C. Scott; Larry D. McMillan, all of Colorado Springs, Colo.

[73] Assignee: Symetrix Corporation, Colorado Springs, Colo.

[21] Appl. No.: 08/477,331

[22] Filed: Jun. 7, 1995

Related U.S. Application Data

[62] Division of application No. 08/154,927, Nov. 18, 1993, Pat. No. 5,519,234, which is a division of application No. 07/965,190, Oct. 23, 1992, which is a continuation-in-part of application No. 07/807,439, Dec. 13, 1991, which is a continuation-in-part of application No. 07/660,428, Feb. 25, 1991.

[51] Int. Cl.$^7$ .......... H01L 21/00; H01L 21/8242
[52] U.S. Cl. .................. 438/3; 438/240
[58] Field of Search .................. 437/47, 49, 52, 437/60, 919; 257/295; 365/65, 117, 145, 149; 361/321.1, 321.2; 501/137; 438/3, 240, 239, 238

[56] References Cited

U.S. PATENT DOCUMENTS

| | | | |
|---|---|---|---|
| 2,695,396 | 11/1954 | Anderson | 340/173 |
| 2,992,929 | 7/1961 | Clement et al. | 106/39 |
| 3,529,978 | 9/1970 | Taylor et al. | |
| 3,619,744 | 11/1971 | Stephenson | 317/258 |
| 3,977,887 | 8/1976 | McIntosh | 106/46 |
| 4,144,591 | 3/1979 | Brody | 365/228 |
| 4,149,301 | 4/1979 | Cook | 29/25.42 |
| 4,244,722 | 1/1981 | Tsuya et al. | 65/32 |
| 4,360,896 | 11/1982 | Brody | 365/145 |
| 4,503,482 | 3/1985 | Hennings et al. | 361/321 |
| 4,697,222 | 9/1987 | Kaneko et al. | 361/321 |

(List continued on next page.)

FOREIGN PATENT DOCUMENTS

| | | |
|---|---|---|
| 0415751A1 | 3/1991 | European Pat. Off. . |
| 2232974 | 9/1990 | Japan . |
| 2304796 | 12/1990 | Japan . |

OTHER PUBLICATIONS

Melnick, B.M. et al., "Process Optimization and Characterization of Device Sol–gel Based PZT for Ferroelectric Memories," Ferroelectrics, 1990, vol. 109.

Lines, M.E., et al. "Principles and Applications of Ferroelectrics and Related Materials," Clarendon Press, Oxford 1977.

Smolenskii, G.A., et al, "Ferroelectrics and Related Materials," Gordon and Breach, 1984 with $(Ba_xSr_{1-x})TiO_3$ for 256M Dram IEDM Dec. 1991.

(List continued on next page.)

Primary Examiner—Brian Dutton
Attorney, Agent, or Firm—Duft, Graziano & Forest, P.C.

[57] ABSTRACT

An integrated curcuit includes a layered superlattice material having the formula $A1_{w1}^{+a1}A2_{w2}^{+a2}\ldots Aj_{wj}^{+aj}S1_{x1}^{+s1}S2_{x2}^{+s2}\ldots Sk_{xk}^{+sk}B1_{y1}^{+b1}B2_{y2}^{+b2}\ldots Bl_{yl}^{+bl}Q_z^{-2}$, where A1, A2 ... Aj represent A-site elements in a perovskite-like structure, S1, S2 ... Sk represent superlattice generator elements, B1, B2 ... Bl represent B-site elements in a perovskite-like structure, Q represents an anion, the superscripts indicate the valences of the respective elements, the subscripts indicate the number of atoms of the element in the unit cell, and at least w1 and y1 are non-zero. Some of these materials are extremely low fatigue ferroelectrics and are applied in non-volatile memories. Others are high dielectric constant materials that do not degrade or breakdown over long periods of use and are applied in volatile memories.

18 Claims, 30 Drawing Sheets

U.S. PATENT DOCUMENTS

| | | | |
|---|---|---|---|
| 4,700,457 | 10/1987 | Matsukawa | 437/52 |
| 4,792,463 | 12/1988 | Okada et al. | 427/126.3 |
| 4,917,810 | 4/1990 | Tsunooka et al. | 252/62.9 |
| 4,918,350 | 4/1990 | Ando et al. | 310/320 |
| 4,978,646 | 12/1990 | Bardhan et al. | 501/134 |
| 5,024,964 | 6/1991 | Rohrer et al. | 437/49 |
| 5,046,043 | 9/1991 | Miller et al. | 365/145 |
| 5,109,357 | 4/1992 | Eaton, Jr. | 365/145 |
| 5,109,771 | 5/1992 | Lewis et al. | 101/453 |
| 5,122,923 | 6/1992 | Matsubara et al. | 361/321 |
| 5,146,299 | 9/1992 | Lampe et al. | 357/23.5 |
| 5,219,787 | 6/1993 | Carey et al. | 437/187 |
| 5,369,068 | 11/1994 | Kaneko | 501/135 |

OTHER PUBLICATIONS

Smolenskii, G.A., et al. "Dielectric Polarization of a Number of Complex Compounds" Fizika Tverdogo Tela, V. 1, No. 10, pp. 1562–1572 (Oct. 1959).

Smolenskii, G.A., et al., "New Ferroelectrics of complex Composition," Soviet Physics–Technical Physics, 907–908 (1959).

Smolenskii, G.A., et al., "Ferroelectrics of the Oxygen–Octahedral Type with Layered Structure," Soviet Physics–Solid State v. 3, No. 3. pp 651–566, Sep. 1961.

Subbarao, E.C., "A Family of Ferroelectric Bismuth Compounds," J. Phys. Chem. Solids, V. 23, pp. 665–676 (1962) & Chapt. 8, pp. 241–292 & pp. 624–625.

Wu, Shu–Yau, "A New Ferroelectric Memory Device, Metal–Ferroelectric–Semiconductor Transistor," IEEE Transactions on Electron Devices, Aug. '74, vol. ED–21, No. 8, pp. 499–504.

Scott, J.F., et al., "Integrated Ferroelectrics," vol. I, No. 3 1992 Condensed.

Abt, N.E., et al., Anamolous Remanent Polarization in Ferroelectric Capacitors Integrated Ferroelectrics, 1992, vol. 2 pp. 121–131.

"Ferroelectric Thin Films for Integrated Electronics," 17 slides presented in a talk presented by Donald Lampe of Westinghouse Advanced Technology Divisions Science and Technology Center at the International Symposium on Applications of Ferroelectrics (ISAF) Aug. 31–Sep. 2, 1992, Greenville, S.C.

Aurivillius, Bengt, "Mixed Oxides With Layer Lattices," Arkiv for Kemiband 2 nr 37, Communicated May 21, 1950, by Arne Westgren & Percy Quensel.

Joshi, P.C., et al., "Structural and Optical Properties of Ferroelectric $Bi_4Ti_3O_{12}$ Thin Films by Sol–Gel Technique," Appl. Phys. Lett., vol. 59, No. 10, Nov.

K. Sugibuchi, Y. Kurogi, & N. Endo, "Ferroelectric Field–Effect memory Device Using $Bi_4Ti_3O_{12}$ Film," Central Research Labs., Nippon Electric Co., Ltd., Kawasaki, Japan (rec'd Oct., 30 1974; in final form Feb. 7 1975).

Wu, S.Y., "Memory Retention and Switching Behavior of Metal–Ferroelectric–Semiconductor Transistors," Ferroelectrics, vol. 11, 1976, pp. 379–383.

Subbarao, E.C., "Ferroelectricity in Mixed Bismuth Oxides with Layered–Type Structure," J.Chem. Physics, vol. 34, 695 (1961).

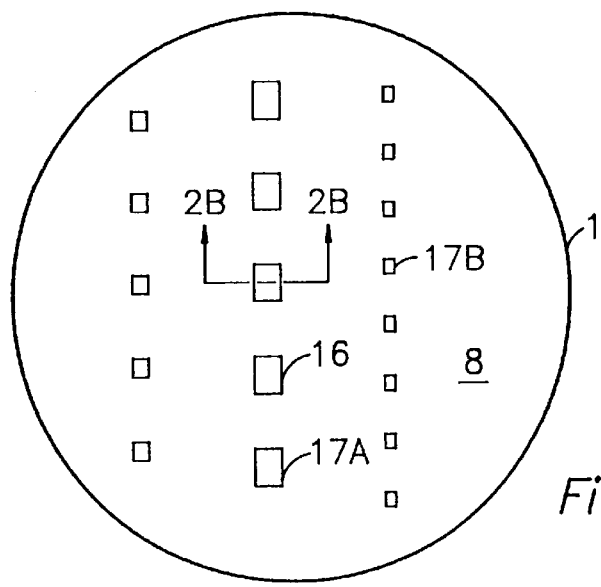
Fig. 2A
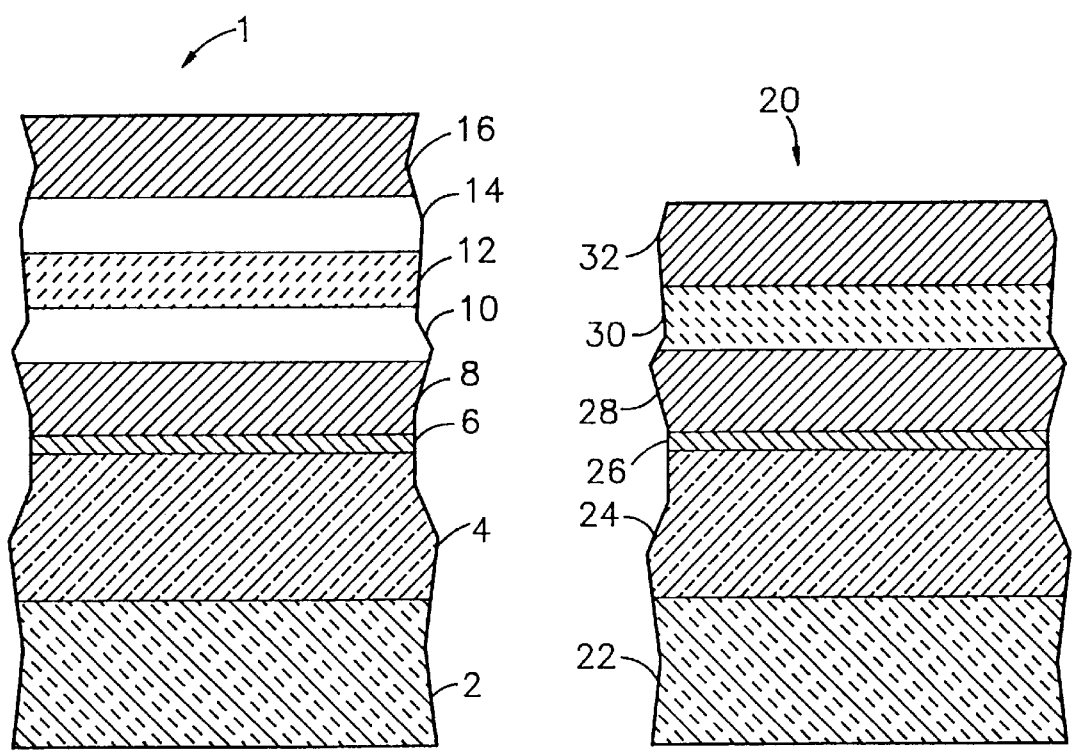
Fig. 2B
Fig. 2C

A  B  Q

A  B  Q $ABi_2B_2^{+5}O_9$ (Prior art material)

(Prior art material)

(Prior art material)

(Prior art material)

(Prior art material)

$SrBi_2Ta_2O_9$

METHOD OF MAKING LAYERED SUPERLATTICE MATERIALS FOR FERROELECTRIC, HIGH DIELECTRIC CONSTANT, INTEGRATED CIRCUIT APPLICATIONS

This application is a division of application Ser. No. 08/154,927 filed Nov. 18, 1993, now U.S. Pat. No. 5,519,234 which itself is a division of U.S. patent application Ser. No. 07/965,190 filed Oct. 23, 1992, which is a continuation-in-part of U.S. patent application Ser. No. 07/807,439 filed Dec. 13, 1991, which in turn is a continuation-in-part of U.S. patent application Ser. No. 07/660,428 filed Feb. 25, 1991. U.S. patent application Ser. No. 07/981,113 filed Nov. 24, 1992 is also a related application.

BACKGROUND OF THE INVENTION

1. Field of the Invention

The invention in general relates to the structure and fabrication of electrical devices such as integrated circuits and more particularly to a new class of materials that provide low fatigue ferroelectric devices, reliable high dielectric constant devices, and are resistant generally to degradation in electronic applications.

2. Statement of the Problem

It has been known for many years that ferro-electric materials potentially offer significant advantages in integrated circuits, particularly integrated circuit memories. For example, the lowest cost, highest capacity integrated circuit memories, including conventional DRAMs, are volatile memories, that is, information stored in the memories remains only so long as power is applied to the integrated circuit. Currently available non-volatile memories, such as EPROMS or flash-type memories, are relatively costly, have relatively low storage density, require extremely high voltage applied for long periods to write and erase data, and generally have a more limited erase and write lifetime than DRAMs. It has long been recognized that ferroelectric materials have polarization states that can be selected or switched by application of an electric field, and that these polarization states remain after the electric field is removed. It is well-known that if a ferroelectric capacitor is substituted for the conventional silicon dioxide dielectric capacitor in the DRAM, instead of simply storing a charge that leaks off quickly, the capacitor can be switched between selected polarization states that will remain indefinitely after power is removed. Thus ferroelectric materials offer the possibility of simple, low cost, high density, non-volatile memories. Further, many semiconductor materials and devices, and in particular the low cost, high capacity memories such as conventional DRAMs, are susceptible to damage or alteration of their states from radiation. It is well-known that ferroelectric materials are highly resistant to radiation damage and that their ferroelectric states are highly resistant to being altered by radiation. Also, ferroelectric memories do not need high voltage for writing or erasing, and can be written to or erased as fast as conventional memories can be read. Thus, considerable research and development has been directed toward the design and manufacture of an integrated circuit memory utilizing the switchable property of ferroelectric materials. Such memories are described in U.S. Pat. No. 2,695,396 issued to Anderson, U.S. Pat. No. 4,144,591 issued to Brody, U.S. Pat. No. 4,149,301 issued to Cook, U.S. Pat. No. 4,360,896 issued to Brody, U.S. Pat. No. 5,046,043 issued to Miller et al., and Japanese Patent No. 2-304796. U.S. Pat. No. 5,028,455 issued to William D. Miller et al. and the article "Process Optimization and Characterization of Device Worthy Sol-Gel Based PZT for Ferroelectric Memories", in *Ferroelectrics*, Vol 109, pp. 1–23 (1990) summarize the various ferroelectric materials utilized in non-volatile memories. These materials include potassium nitrate ($KNO_3$), PLZT ($PbLa_2O_3$—$ZrO_2$—$TiO_2$), lead zirconate titanate or PZT ($PbTiO_3$—$PbZrO_3$), and lead titanate ($PbTiO_3$), with PZT currently being the material of choice. These ferroelectric materials are all random solid solutions meeting the general perovskite formula $ABO_3$. Despite the considerable research and development efforts in ferroelectrics over the last thirty years, only a few specialty ferroelectric integrated circuits have been commercially produced.

A key problem in producing a non-volatile ferroelectric memory has been that up to now every ferroelectric material that has had acceptably high polarizability to be useful for a non-volatile memory has also been characterized by a high fatigue rate. That is, under repeated switching, the polarizability gradually decreases to less than 50% of the original polarizabilty. See the *Ferroelectrics* article referenced above. Moreover, when a series of pulses of the same sign are applied to the prior art materials, they take a set, or an imprint. See for example the article "Anomalous Remanent Polarization In Ferroelectric Capacitors" by Norman E. Abt, Reza Maazzami, and Yoav Nissan-Cohen, in *Integrated Ferroelectrics*, 1992, Vol 2, pp. 121–131, in which the phenomenon is referred to as $\Delta PO$. In terms of the hysteresis loop, the result is a shift in the loop in the direction of the field of the pulse. The effect of this imprinting can perhaps best be understood by considering the effect of point defects creating an internal bias field in the material. A ferroelectric is characterized by an energy diagram having relatively deep double wells, with a relatively low barrier between them. The wells represent the energy in the two polarization states. The wells in the virgin material have the same depth. Imprinting causes at least one well to deepen because of preferred relaxation in the direction of the internal bias field. The energy barrier from the shallower well to the deeper one becomes significantly smaller, and the barrier between the deeper well and the shallower one becomes significantly higher. As a result, when a field is applied to switch the material from the deeper state to the shallower state, it takes a longer time for the material to respond. Moreover, when the material is switched to the polarization state corresponding to the shallower well, the material will relax back into the deeper well state. At worst this causes the material to take a set so that it cannot function as a memory. At best, the timing of the memory must be slowed down considerably to account for the longest switching time.

A further problem with prior art ferroelectric materials is that the effective polarizability changes dramatically with the thickness of the material, generally decreasing as the material becomes thinner. This is believed to be due to surface effects. That is, the dipoles that create the ferroelectric properties are relatively uniformly distributed and continuous throughout the material, and therefore compensating charges occur predominately at the discontinuities, i.e. at the surface. A large surface charge is created in the prior art materials by the polarizing field, and most of the change in potential occurs at the surface of the material. This causes the bulk of the material to see a relatively small field. As the material becomes thinner, the surface effects overwhelm the bulk effects, and the material behaves more like a dielectric material than a ferroelectric material. This problem makes it difficult or impossible to make practical integrated circuits with the prior art materials, because integrated circuits are fabricated using thin films. Another problem has been that the ferroelectric materials tend to be incompatible with the semiconductor materials and structures used in integrated circuits. When the ferroelectric materials are combined with the conventional materials in conventional integrated circuit structures, they tend to interdiffuse with the other materials which either damages the ferroelectrics and other materials, alters their properties, or both. The ferroelectric materials also tend to lose their ferroelectric properties at the relatively sharp bends utilized in conventional memory device fabrication. Thus there remains a need for a ferroelectric integrated circuit structure and fabrication method that results in reliable, low cost, high density integrated circuit devices.

Aside from the non-volatile memory aspect discussed above, there has also been a need for a high dielectric constant material suitable for use in integrated circuits. The most commonly used dielectric material in integrated circuits is silicon dioxide, which has a dielectric constant of about 4. Capacitors using such a material must have a large area in order to provide the capacitive values required in state-of-the-art integrated circuits. These large areas make it difficult to reach high densities of capacitive components in an integrated circuit. However, the use of other materials to provide the dielectric in integrated circuits has been hindered by many of the same problems as ferroelectric memories: leakage of the dielectrics in the integrated circuit environment, degradation and breakdown of the materials caused by the stresses of fabrication and use over long time periods, and incompatibility of the materials with other common integrated circuit materials. As integrated circuits become smaller, this lack of a suitable high dielectric constant material becomes more and more significant. It is considered to be one of the serious roadblocks to 64 megabit and higher integrated circuit memories.

Up to now, the sciences of ferroelectrics and integrated circuit dielectric materials has been phenomenological. Researchers have made and tested a large number of materials and those which are found to be ferroelectric or to have high dielectric constants have been included in lengthy lists. See for example, Appendix F of *Principles and Applications of Ferroelectrics and Related Materials*, by M. E. Lines and A. M. Glass, Clarendon Press, Oxford, 1977, pp. 620–632. Generally the ferroelectrics in these lists have been separated into several classes such as the complex salts, such as $KD_2PO_4$, the TGS type, such as tri-glycine sulfate, the perovskites, such as $BaTiO_3$, $SrTiO_3$ and PZT, or the tungsten bronzes, etc. The various classes a particular author chooses depends on his or her point of view. One class of ferroelectrics discovered by G. A. Smolenskii, V. A. Isupov, and A. I. Agranovskaya had a layered Perovskite structure. See Chapter 15 of the book, *Ferroelectrics and Related Materials*, ISSN 0275-9608, (V.3 of the series Ferroelectrics and Related Phenomena, 1984) edited by G. A. Smolenskii, especially sections 15.3–15.7; G. A. Smolenskii, A. I. Agranovskaya, "Dielectric Polarization of a Number of Complex Compounds", *Fizika Tverdogo Tela*, V. 1, No. 10, pp. 1562–1572 (October 1959); G. A. Smolenskii, A. I. Agranovskaya, V. A. Isupov, "New Ferroelectrics of Complex Composition", *Soviet Physics—Technical Physics*, 907–908 (1959); G. A. Smolenskii, V. A. Isupov, A. I. Agranovskaya, "Ferroelectrics of the Oxygen-Octahedral Type With Layered Structure", *Soviet Physics—Solid State*, V. 3, No. 3, pp. 651–655 (September 1961); E. C. Subbarao, "Ferroelectricity in Mixed Bismuth Oxides With Layer-Type Structure", *J. Chem. Physics*, V. 34, 695 (1961); E. C. Subbarao, "A Family of Ferroelectric Bismuth Compounds", *J. Phys. Chem. Solids*, V. 23, pp. 665–676 (1962) and Chapter 8 pages 241–292 and pages 624 & 625 of Appendix F of the Lines and Glass reference cited above. As outlined in section 15.3 of the Smolenskii book, the layered perovskite-like materials can be classified under three general types:

(I) compounds having the formula $A_{m-1}Bi_2M_mO_{3m+3}$, where $A=Bi^{3+}$, $Ba^{2+}$, $Sr^{2+}$, $Ca^{2+}$, $Pb^{2+}$, $K^+$, $Na^+$ and other ions of comparable size, and $M=Ti^{4+}$, $Nb^{5+}$, $Ta^{5+}$, $Mo^{6+}$, $W^{6+}$, $Fe^{3+}$ and other ions that occupy oxygen octahedra; this group includes bismuth titanate, $Bi_4Ti_3O_{12}$;

(II) compounds having the formula $A_{m+1}M_mO_{3m+1}$, including compounds such as strontium titanates $Sr_2TiO_4$, $Sr_3Ti_2O_7$ and $Sr_4Ti_3O_{10}$; and (III) compounds having the formula $A_mM_mO_{3m+2}$, including compounds such as $Sr_2Nb_2O_7$, $La_2Ti_2O_7$, $Sr_5TiNb_4O_{17}$, and $Sr_6Ti_2Nb_4O_{20}$.

Smolenskii pointed out that the perovskite-like layers may have different thicknesses, depending on the value of m, and that the perovskite $AMO_3$ is in principal the limiting example of any type of layered perovskite-like structure with m=infinity. Smolenskii also noted that if the layer with minimum thickness (m=1) is denoted by P and the bismuth-oxygen layer is denoted by B, then the type I compounds may be described as . . . $BP_mBP_m$ . . . . Further Smolenskii noted that if m is a fractional number then the lattice contains perovskite-like layers of various thicknesses, and that all the known type I compounds are ferroelectrics. Similarly, Smolenskii noted that the type two compounds could be represented as . . . $SP_mSP_m$ . . . where P is the perovskite-like layer of thickness m and S is the strontium-oxygen connecting layer, and that since the type I and type II compounds have similar perovskite-like layers, the existence of "hybrid" compounds such as . . . $BP_mSP_nBP_mSP_m$ . . . "should not be ruled out", though none had been obtained at that time.

Up to now, these layered ferroelectric materials have not been considered as being suitable for non-volatile ferroelectric memories, nor have they been recognized as useful high dielectric constant materials. Two of the layered ferroelectric materials, bismuth titanate ($Bi_4Ti_3O_{12}$) and barium magnesium fluoride ($BaMgF_4$), have been used in a switching memory application as a gate on a transistor. See "A New Ferroelectric Memory Device, Metal-Ferroelectric-Semiconductor Transistor", by Shu-Yau Wu, *IEEE Transactions On Electron Devices*, August 1974, pp. 499–504, which relates to the $Bi_4Ti_3O_{12}$ device, and the article "Integrated Ferroelectrics" by J. F. Scott, C. A. Paz De Araujo, and L. D. McMillian in *Condensed Matter News*, Vol. 1, No. 3, 1992, pp. 16–20, which article is not prior art to this disclosure but Section IIB discusses experiments with ferroelectric field effect transistors (FEFETs). However, neither of these devices have been successfully used in a memory. In the case of the $Bi_4Ti_3O_{12}$ device, the ON state decayed logarithmically after only two hours, and in the case of the $BaMgF_4$ device, both states decayed exponentially after a few minutes. See "Memory Retention And Switching Behavior Of Metal-Ferroelectric-Semiconductor Transistors", by S. Y. Wu, *Ferroelectrics*, 1976 Vol. 11, pp. 379–383. Further, it is well known that at annealing temperatures, the titanium in $Bi_4Ti_3O_{12}$ will react with the silicon in the substrate to form titanium silicide, a conductor, which will degrade the device beyond usefulness. Since without annealing $Bi_4Ti_3O_{12}$ is not stable, and further since many of the materials in conventional integrated circuit require annealing for stability, the prior art suggests that useful memories cannot be made with $Bi_4Ti_3O_{12}$. In the case of the BaMgF$_4$ devices, the "polarized" state dissipates so rapidly that it is believed that the BaMgF$_4$ is acting as an electret rather than a ferroelectric; that is, it is taking on a charged state and the state decays because the charge leaks off. Thus the prior art suggests that these materials cannot be used in a practical integrated circuit.

3. Solution to the Problem

The invention solves the above problems by recognizing that a class of materials, called layered superlattice materials herein, are useful in integrated circuits. In particular the materials are highly useful as ferroelectric switching materials and as high dielectric constant materials.

The inventors have discovered that the intermediate layers between the ferroelectric layers in a layered superlattice material provide a "shock absorber" effect. This shock absorber effect prevents degradation of the ferroelectric material by repetitive switching. As a result the materials essentially do not fatigue and do not take an imprint. Further, the layered structure separates the dipoles that create the ferroelectric properties of the into very small domains, each of which has only a tiny space charge associated with it. As a result the surface effects do not occur, and the polarizability of these materials hardly varies with film thickness.

The shock absorber effect also prevents degradation or leaking of high dielectric constant materials.

Moreover, it has been discovered that the layered superlattice structure supports and binds the materials into desirable compounds that would not otherwise be stable without the superlattice. That is, without the superlattice, a desirable compound will degenerate into another less desirable compound.

As a result of the above features, the layered superlattice material lends itself to the creation of stable new materials and integrated circuit structures.

Many of these materials are compatible with conventional integrated circuit materials. For those that are not compatible, such as Bi$_4$Ti$_3$O$_2$, the invention provides buffer layers which prevent diffusion and other material-degrading and electrical property degrading reactions from occurring.

While the layered superlattice materials have not up to now been recognized as being useful in integrated circuits, we have discovered that they are much more useful than any prior ferroelectric and high dielectric constant materials. Moreover, the shock absorber effect of the layered structure prevents the degradation of these properties by integrated circuit fabrication processes and structures, and the repetitive use common for integrated circuits. Thus reliable, durable materials having many desirable properties for integrated circuits and other electrical uses can be many desirable properties for integrated circuits and other electrical uses can be fabricated.

The problem of fatigue in ferroelectric switching devices is solved by utilizing a layered superlattice material as the ferroelectric switching material. The problem of fatigue in ferroelectric memories is solved by using a layered superlattice material in the storage cell of the memory. For example, strontium bismuth tantalate (SrBi$_2$Ta$_2$O$_9$) has been made in thin films suitable for use in integrated circuits and having a polarizability, 2Pr, of 25 microcoulombs/cm$^2$ and showing less than 5% fatigue after $10^{10}$ cycles, which is equivalent to 10 years use in a typical integrated circuit switching device.

The problem of the need for a high dielectric constant material has been solved by utilizing a layered superlattice material as the dielectric in an integrated circuit. As an example, barium bismuth tantalate (BaBi$_2$Ta$_2$O$_9$) having a dielectric constant of 166, measured at 1 Megahertz with a V$_{osc}$ of 15 millivolts, and a leakage current of $7.84 \times 10^{-8}$ amps/cm$^2$ at a field of 200 KV/cm has been made in thin films of less than 2000 Å, which are suitable for use in integrated circuits.

The solution of the above problems leads to other applications for the materials. Now that the function of the layered superlattice structure in providing a shock absorber effect which leads to lower fatigue and greater durability in ferroelectric and dielectric applications is understood, the principal can be applied to many other applications. As used herein, the term "low fatigue" as applied to a device or material capable of being switched from a first state to a second state means a device or material capable of switching $10^9$ times with less than 30% fatigue.

SUMMARY OF THE INVENTION

The invention provides an integrated circuit device comprising: a substrate; and a plurality of layers of material on the substrate forming a plurality of electrically interconnected electrical devices, wherein at least one of the layers of material comprises a layered superlattice material. Preferably, the layered superlattice material comprises a material having the formula $A1_{w1}^{+a1} A2_{w2}^{+a2} \ldots Aj_{wj}^{+aj} S1_{x1}^{+s1} S2_{x2}^{+s2} \ldots Sk_{xk}^{+sk} B1_{y1}^{+b1} B2_{y2}^{+b2} \ldots Bl_{yl}^{+bl} Q_z^{-2}$, where A1, A2 . . . Aj represent A-site elements in a perovskite-like structure, S1, S2 . . . Sk represent superlattice generator elements, B1, B2 . . . Bl represent B-site elements in a perovskite-like structure, Q represents an anion, the superscripts indicate the valences of the respective elements, the subscripts indicate the average number of atoms of the element in the unit cell, and at least w1 and y1 are non-zero. Preferably, the A-site element comprises one or more of the elements from the group comprising strontium, calcium, barium, bismuth, cadmium, and lead. Preferably, the B-site element comprises one or more elements from the group comprising titanium, tantalum, hafnium, tungsten, niobium and zirconium. Preferably, the superlattice generator element comprises one or more elements from the group comprising bismuth, scandium, yttrium, lanthanum, antimony, chromium, and thallium. Preferably, the anion comprises an element from the group comprising oxygen, chlorine, fluorine, and hybrids thereof. Preferably, the layered superlattice material comprises SrBi$_2$Ta$_2$O$_9$, SrBi$_2$TaNbO$_9$, BaBi$_2$Ta$_2$O$_9$, or PbBi$_2$Ta$_2$O$_9$. The layered superlattice material may also comprise a solid solution of two or more materials having the formula. Preferably, the layered superlattice material comprises a material having a localized structure, within a grain or other larger or smaller unit, which localized structure contains predominately repeatable units containing one or more ferroelectric layers and one or more intermediate non-ferroelectric layers spontaneously linked in an interdependent manner. Or the layered superlattice material comprises a material having a localized structure, within a grain or other larger or smaller unit, which localized structure contains predominately repeatable units containing one or more perovskite-like layers and one or more intermediate non-perovskite-like layers spontaneously linked in an interdependent manner.

In another aspect the invention provides a non-volatile ferroelectric memory comprising: a ferroelectric memory cell including a layered superlattice material capable of existing in a first polarization state and a second polarization state; information write means for placing the ferroelectric memory cell in a first memory cell state or a second memory cell state depending upon information input to the memory, the first memory cell state corresponding to the ferroelectric layered superlattice material being in the first polarization state, and the second memory cell state corresponding to the ferroelectric layered superlattice material being in the second polarization state; and information read means for sensing the state of the memory cell and providing an electrical signal corresponding to the memory cell state; and wherein the memory cell is capable of retaining the first and second memory cell states for periods longer than a day. Preferably the ferroelectric layered superlattice material comprises a material essentially as described above.

In another aspect the invention provides an integrated circuit memory comprising: a capacitor comprising a first electrode, a second electrode, and a layered superlattice material located between the first electrode and the second electrode; information write means for placing the capacitor in a first state or a second state depending upon information input to the memory; and information read means for sensing the state of the capacitor and providing a signal corresponding to the state. Preferably, the layered superlattice material comprises a material as described above. Preferably, the capacitor state is charge state or a state of polarization.

In a further aspect the invention provides an integrated circuit including an electronic component at least a portion of which is made of a material selected from the group: strontium bismuth tantalate, strontium bismuth niobate, strontium bismuth tantalum niobate, lead bismuth niobate, barium bismuth tantalate, lead bismuth tantalate, and barium bismuth niobate.

In yet a further aspect the invention provides an integrated circuit memory including an electronic component at least a portion of which is made of a material selected from the group: strontium bismuth tantalate, strontium bismuth niobate, strontium bismuth tantalum niobate, lead bismuth niobate, barium bismuth tantalate, lead bismuth tantalate, and barium bismuth niobate.

In still another aspect the invention provides an integrated circuit including an electronic component at least a portion of which is made of strontium bismuth tantalate.

In yet another aspect the invention provides an integrated circuit including an electronic component at least a portion of which is made of strontium bismuth tantalum niobate.

In a further aspect the invention provides a device including a material capable of being switched from a first state to a second state, wherein the material comprises a layered superlattice material, and wherein the device is capable of switching $10^9$ times with less than 30% fatigue. Preferably, the layered superlattice material is ferroelectric and the first and second states are polarization states.

The invention not only provides a new class of integrated circuit materials and greatly improved performance of known memory and other integrated circuit devices, but also provides an opening to a whole new integrated circuit technology. Numerous other features, objects and advantages of the invention will become apparent from the following description when read in conjunction with the accompanying drawings.

BRIEF DESCRIPTION OF THE DRAWINGS

FIG. 2A is a top view of a silicon wafer on which thin film capacitors according to the invention are shown greatly enlarged;

FIG. 2B is a portion of the cross-section of FIG. 2A taken through the lines 2B—2B, illustrating a thin film capacitor device having buffer layers according to the invention;

FIG. 2C is a cross-sectional illustration of a portion of a thin film capacitor according to the invention;

DESCRIPTION OF THE PREFERRED EMBODIMENT

1. Overview

The inventors have discovered that a class of materials that have never before been successfully utilized in non-volatile ferroelectric switching memories, in ferroelectric switching capacitors, or as high dielectric constant materials in volatile memories, are considerably superior to all previous materials used in such applications. In particular these materials exhibit low fatigue in switching applications, little or no imprinting, little change in the polarizability with film thickness, long retention of polarization charge even under high stress conditions, a high dielectric constant with low leakage current, and are compatible with, or can be designed to be compatible with, the other materials commonly used in integrated circuits, such as silicon and gallium arsenide. The invention can perhaps best be understood by a description of how the excellent ferroelectric switching and high dielectric constant properties of these materials were discovered.

Figure 4C:
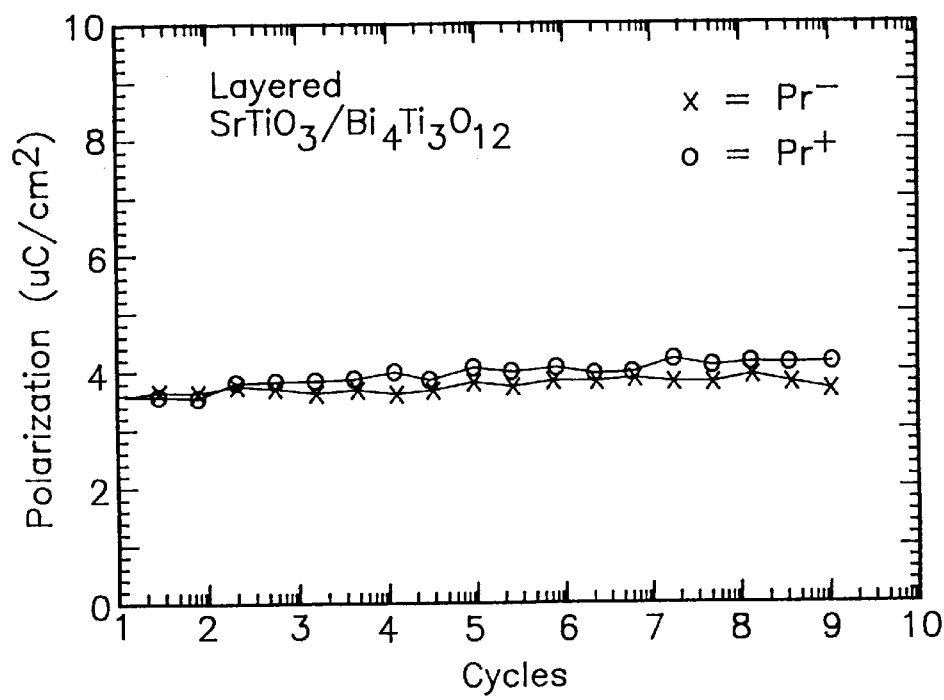
FIG. 4C shows a graph of $P_r^-$ and $P_r^+$ versus number of hysteresis cycles for a hysteresis curve of the device of FIG. 4A, illustrating the low fatigue of the material.
Figure 5A:
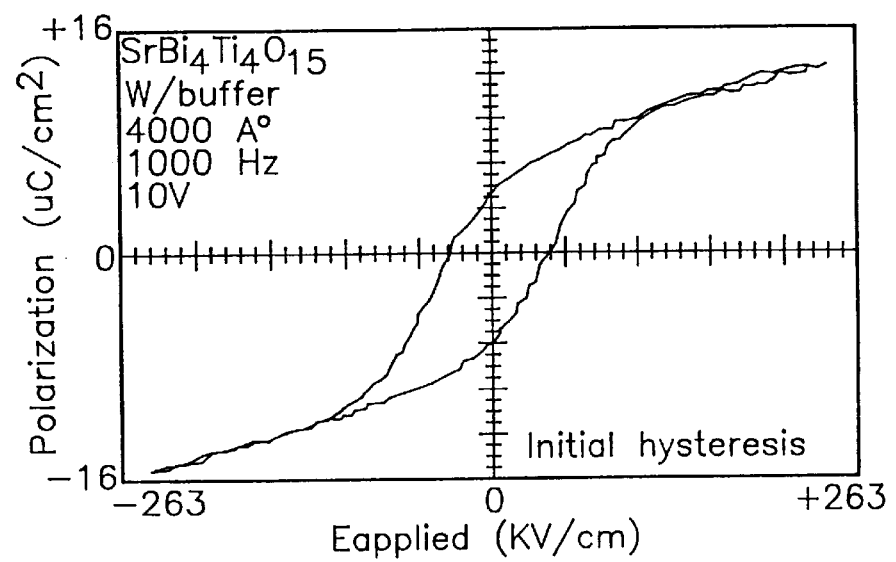
FIG. 5A is an initial hysteresis curve of a device as shown in FIG. 2B having a layer of $SrBi_4Ti_4O_{15}$ between buffer layers of $SrTiO_3$.
Figure 5B:
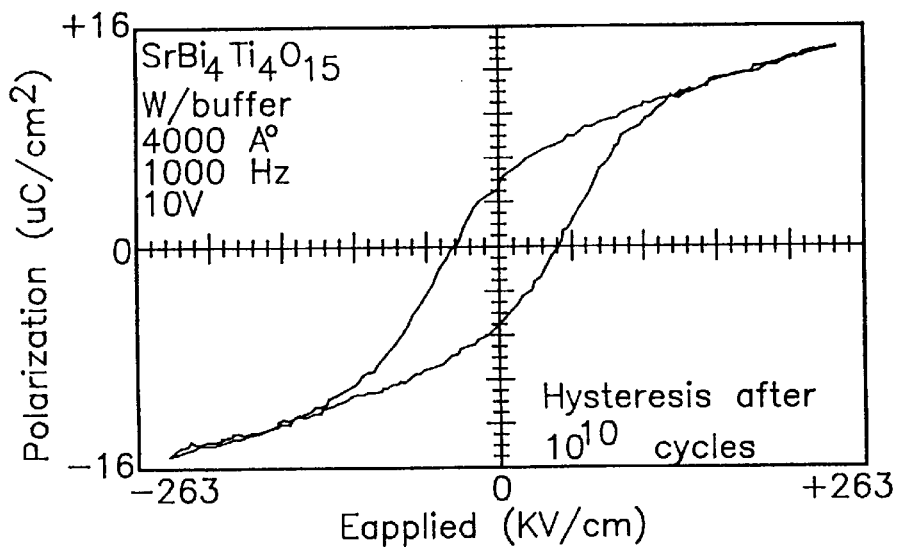
FIG. 5B is the hysteresis curve for the same sample as used to generate the curve of FIG. 5A, except after $10^{10}$ cycles.
Figure 5C:
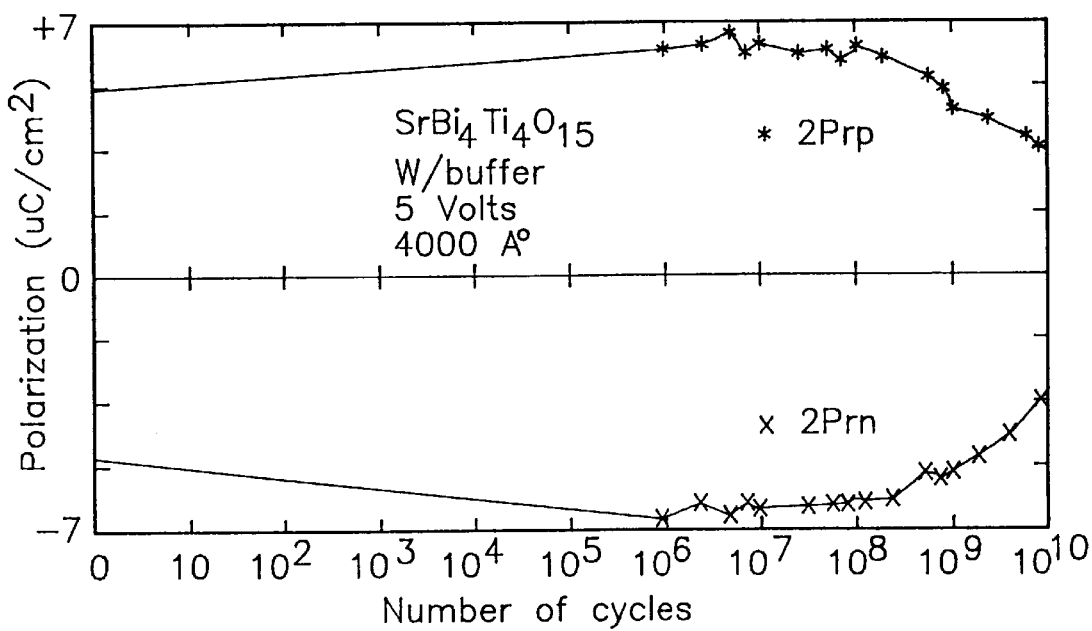
FIG. 5C is a graph of 2Prp and 2Prn versus number of switching cycles for the same sample used in FIGS. 5A and 5B.

As indicated above, it was realized that one of the problems with previous ferroelectric switching capacitors made of materials such as PZT was that a large space charge accumulated at the interfaces of the ferroelectric material and the capacitor electrodes. This space charge screened the interior of the ferroelectric material from the applied field, and thus most of the ferroelectric switching was taking place at the surface of the material. It was postulated that the poor fatigue properties of the prior ferroelectric materials may have been related to this space charge phenomenon. Thus a layered ferroelectric capacitor structure as shown in FIG. 2B was fabricated having a substrate 2 of silicon, a silicon oxide insulating layer 4, a platinum first capacitor electrode 8, platinum second capacitor electrode 16, a thin layer of titanium 6, and a ferroelectric material 12, such as $Bi_4Ti_3O_{12}$, sandwiched between layers 10, 14 of a high dielectric constant material, such as $SrTiO_3$. It was thought that the layered structure of the pure ferroelectric material 12 sandwiched between layers 10, 14 of a high dielectric constant material might make the space charge gradient into the ferroelectric material more gradual. The material of the layers 10 and 14 was also selected to buffer the $Bi_4Ti_3O_{12}$ from the other capacitor layers to prevent diffusion and undesirable reactions. When hysteresis endurance tests were performed on this layered structure, a graph of switching charge versus cycles as illustrated in FIG. 4c showing almost no fatigue out to $10^9$ cycles, which is equivalent to use in a memory for about one year, was generated. At first this was thought to illustrate the success of the layered structure, but capacitance measurements suggested that the ferroelectric switching was occurring in a layer of material much thinner than the layer of $Bi_4Ti_3O_{12}$. It was conjectured that what had happened was that the $SrTiO_3$ and the $Bi_4Ti_3O_{12}$ had interdiffused at their interfaces and that the low fatigue results were that of a material such as $SrBi_4Ti_4O_{15}$ which had hitherto not been suspected of being a likely candidate for a non-volatile memory or other ferroelectric switching application. A structure as shown in FIG. 2B with a layer of 12 of $SrBi_4Ti_4O_{15}$ sandwiched between two layers 10, 14 of $SrTiO_3$ was fabricated. Tests were performed yielding an initial hysteresis curve as shown in FIG. 5A, a hysteresis curve after $10^{10}$ cycles as shown in FIG. 5B, and 2Prp and 2Prn polarization charge versus cycles curves as shown in FIG. 5C, which show fatigue of less than 30%, which is much less than for any ferroelectric material on which endurance tests had been performed in the prior art. It was realized that the $SrBi_4Ti_4O_{15}$ was one of the layered perovskite-like materials catalogued by Smolenskii, and thought that perhaps the natural layered structure of these materials might be the source of the low-fatigue property. Other devices were fabricated having the structure shown in FIG. 2C, i.e. a silicon substrate 22, a silicon dioxide layer 24, a layer of titanium 26, a first platinum electrode 28, a layer 30 of layered superlattice material, and a second platinum electrode 32. These capacitor devices were tested, with results as shown in FIGS. 6A through 11. 16 through 24, and 27; a typical result, FIGS. 6A through 6C, reveals a material, strontium bismuth tantalate ($SrBi_2Ta_2O_9$), that has almost no fatigue at all after $10^{10}$ cycles.

As sample after sample of the layered-perovskite materials that were ferroelectric proved to have lower fatigue than previously measured for non-layered ferroelectrics, it was realized that there was something common to these materials that gave rise to the low fatigue. While the layered nature of the materials leads to a more uniform distribution of the space charge throughout the layered ferroelectrics, the charge-based arguments mentioned above, when examined thoroughly, do not account for the low fatigue. It is now believed that the non-ferroelectric layers act as "shock absorbers" for the ferroelectric layers. To see this, one must understand that the ferroelectric property is caused by a non-uniform charge distribution within the individual unit cell of the ferroelectric lattice, and this non-uniformity of charge can only be maintained because the ferroelectric crystal lattice is an uncommonly rigid one. When the crystal is forced to switch its polarization state over and over again, this rigidity breaks down and the polarizability decreases to the point that the material is not useable in a memory. In the layered superlattice materials, the non-ferroelectric layer is made of a material, such as $(BiO_3)^{3-}$, which has a less rigid lattice structure than the ferroelectric. Since the material alternates with the ferroelectric material, the result is alternate layers of the rigid ferroelectric and the less rigid non-ferroelectric. Thus the less rigid non-ferroelectric absorbs the shocks caused by repeated switching and allows the ferroelectric to maintain its highly polarizable state.

The above explanation immediately leads to a realization of why in over thirty years of extensive research, nobody found a ferroelectric with high polarizability that had low fatigue. Without the shock absorber, the very thing that causes the high polarizability, the rigid crystal structure, also leads to fatigue.

Figure 9:
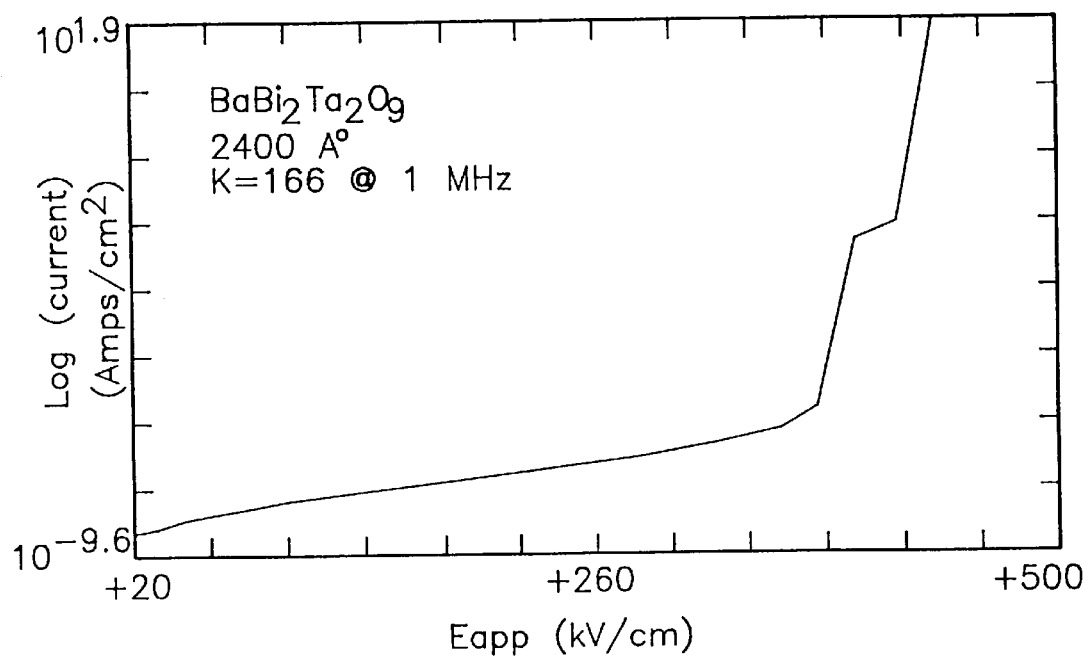
FIG. 9 is a graph of the logarithm of the DC leakage current versus applied field for a capacitor as shown in FIG. 2C utilizing $BaBi_2Ta_2O_9$ as the high dielectric constant material.
Figure 10:
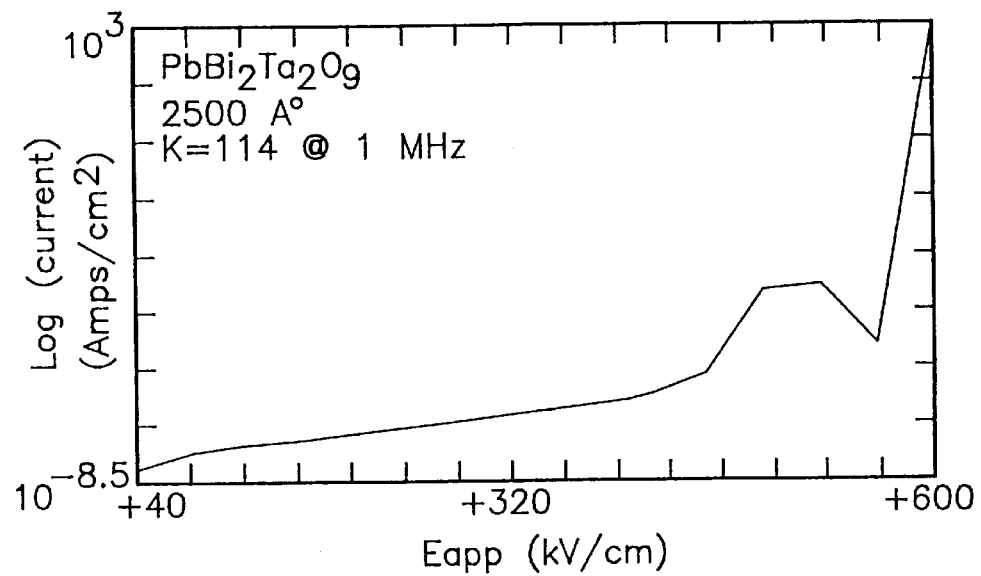
FIG. 10 is a graph of the logarithm of the DC leakage current versus applied field for a capacitor as shown in FIG. 2C utilizing $PbBi_2Ta_2O_9$ as the high dielectric constant material.
Figure 11:
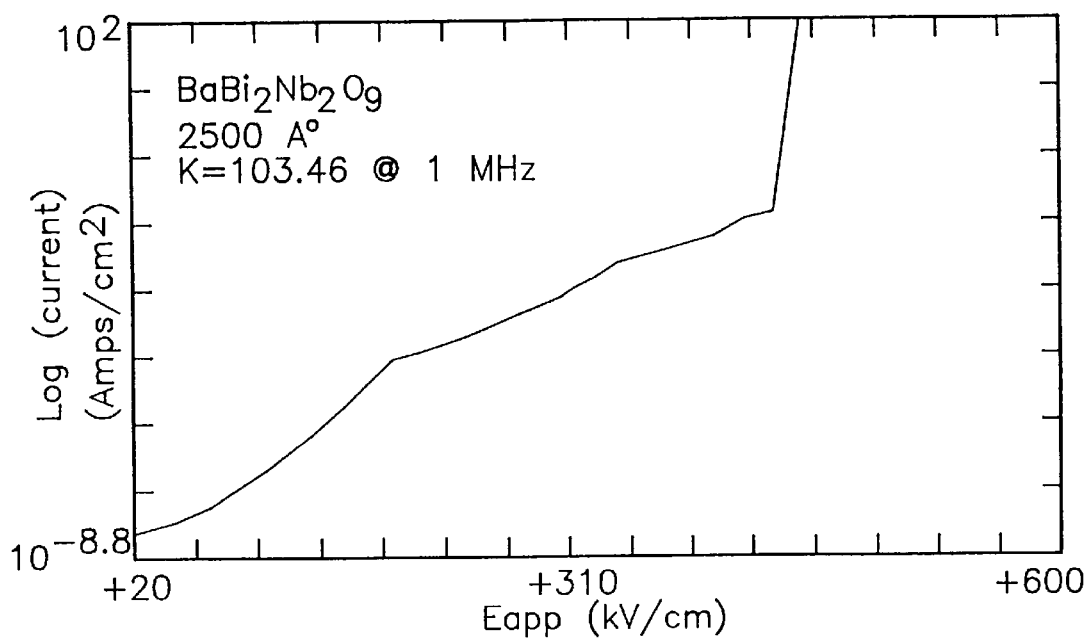
FIG. 11 is a graph of the logarithm of the DC leakage current versus applied field for a capacitor as shown in FIG. 2C utilizing $BaBi_2Nb_2O_9$ as the high dielectric constant material.

High dielectric constant materials also have crystal lattices that are relatively rigid. Thus an understanding of the layered superlattice structure suggests the layered superlattice materials that are not ferroelectric may be high dielectric constant materials that do not degrade or breakdown over long periods of use. This also turns out to be generally true. Further many of these materials have low leakage currents which is highly desirable for integrated circuits. DC leakage current curves and dielectric constants for some layered superlattice materials are shown in FIGS. 9, 10 and 11.

Figure 3A:
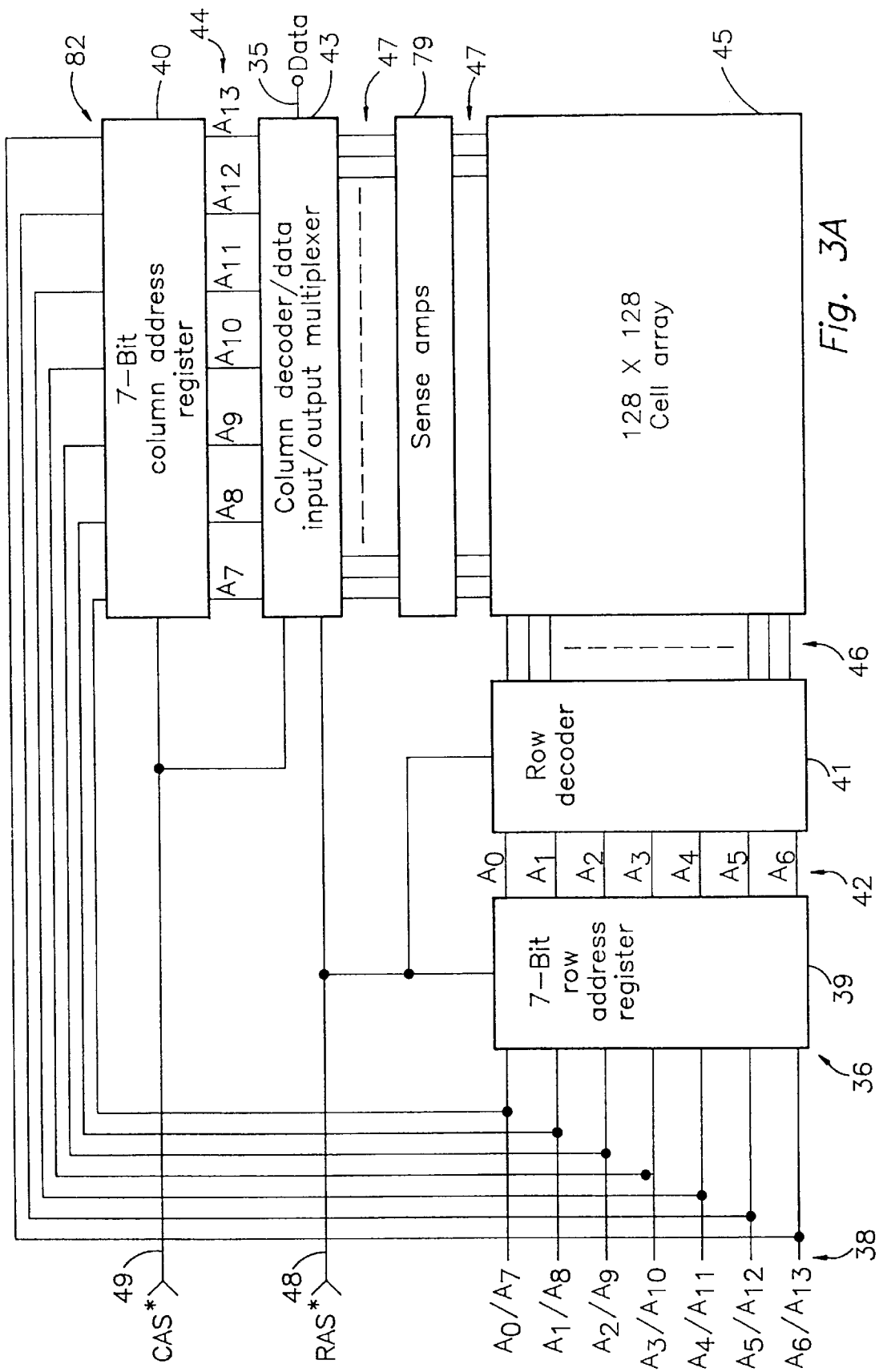
FIG. 3A is a circuit diagram of an integrated circuit memory which is a preferred use of the material according to the invention.
Figure 3B:
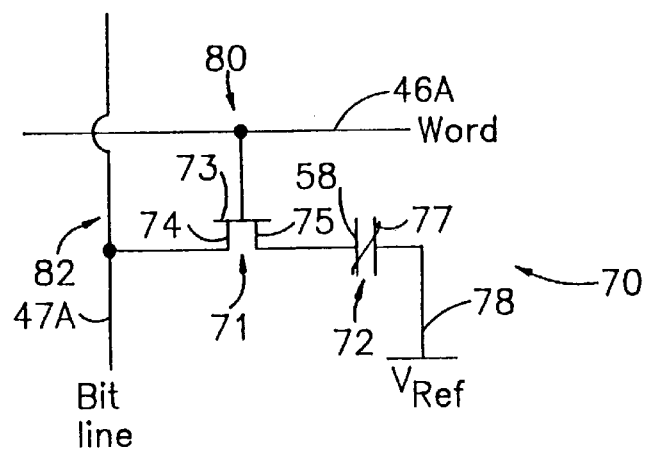
FIG. 3B is a circuit diagram of an individual integrated circuit non-volatile memory cell such as may be used in the memory of FIG. 3A and utilizing the low fatigue ferroelectric switching material according to the invention.
Figure 3C:
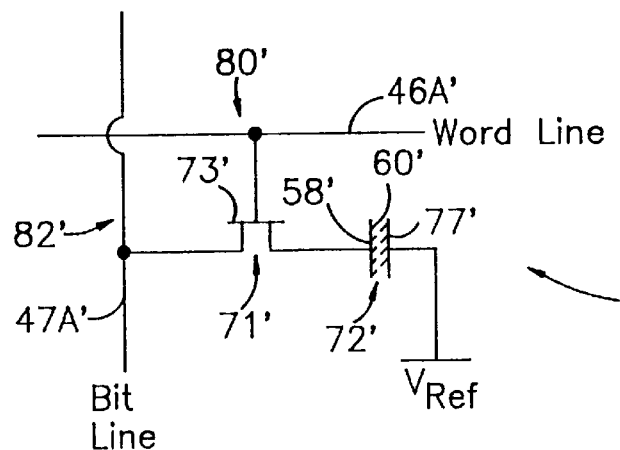
FIG. 3C is a circuit diagram of an individual integrated circuit volatile memory cell such as which may be used in the memory of FIG. 3A and utilizing the high dielectric material according to the invention.
Figure 3D:
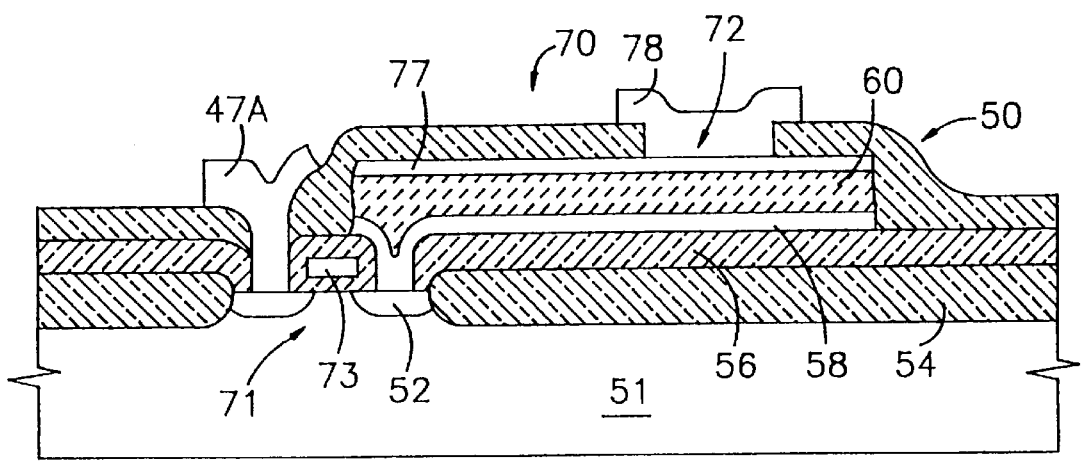
FIG. 3D is an illustration of how the cells of FIGS. 3B and 3C may be implemented in an integrated circuit memory.

Some of the layered superlattice materials are not compatible with some conventional integrated circuit processes and materials. For example, titanium rapidly diffuses into silicon and forms titanium silicide, thus any of the superlattice materials that include titanium, such as $SrBi_4Ti_4O_{15}$, are preferably utilized with buffer layers, as shown in FIG. 2B. However, many layered superlattice materials are highly compatible with conventional integrated circuit materials. For example, strontium bismuth tantalate ($SrBi_2Ta_2O_9$) and barium bismuth tantalate ($BaBi_2Ta_2O_9$) are highly compatible with most conventional integrated circuit materials and processes. The former is a low fatigue ferroelectric that lends itself to switching capacitors having structures as illustrated in FIG. 2C and non-volatile integrated circuit memories as illustrated in FIGS. 3A, 3B and 3D, and the latter is a high dielectric constant material that lends itself to capacitor structures as illustrated in FIG. 2C and volatile integrated circuit memories as illustrated in FIGS. 3A, 3C, and 3D.

Figure 12A:
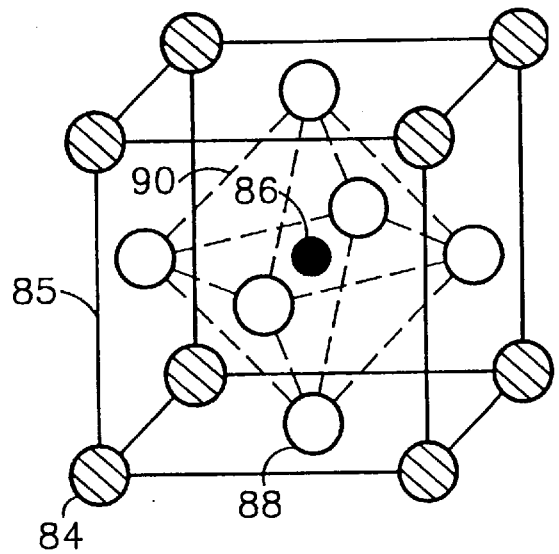
FIG. 12A illustrates the perovskite primitive unit cell.
Figure 12A:
Figure 12A:
Figure 12A:
Figure 12B:
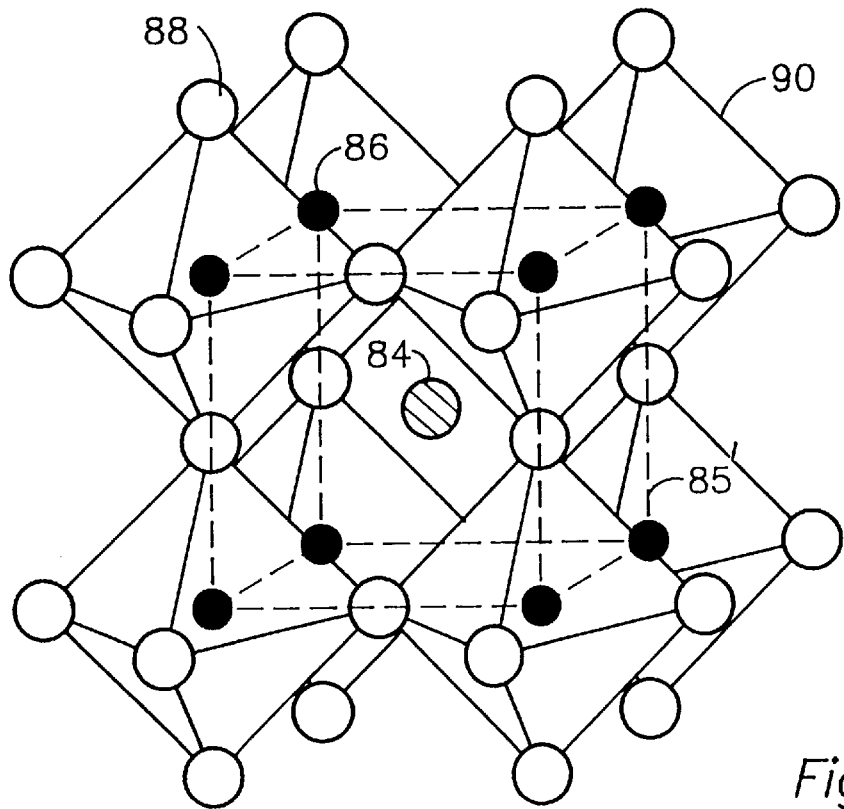
FIG. 12B illustrates another perovskite unit cell which is more useful for describing the invention.
Figure 12B:
Figure 12B:
Figure 12B:
Figure 13:
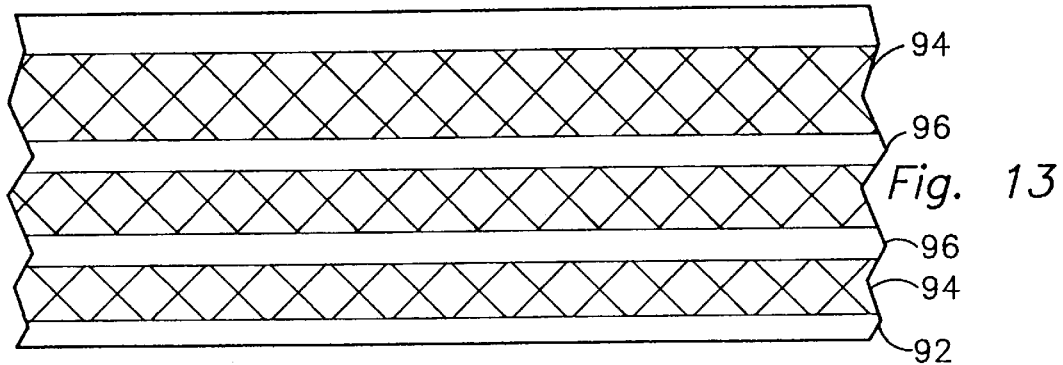
FIG. 13 illustrates a layered superlattice material according to the invention.
Figure 14:
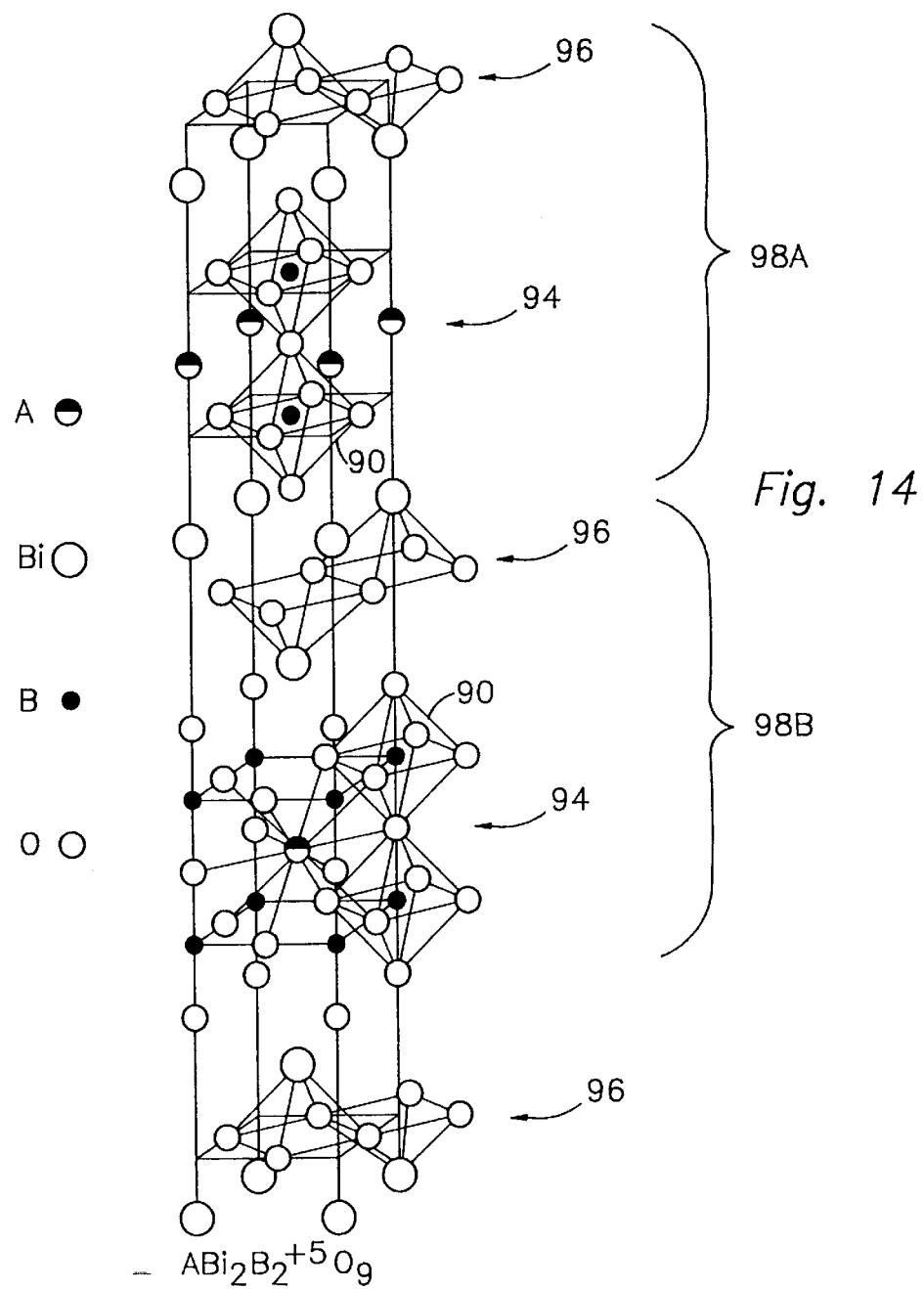
FIG. 14 shows the specific lattice structure for an $ABi_2B_2^{+5}O_9$ layered superlattice material.
Figure 15:
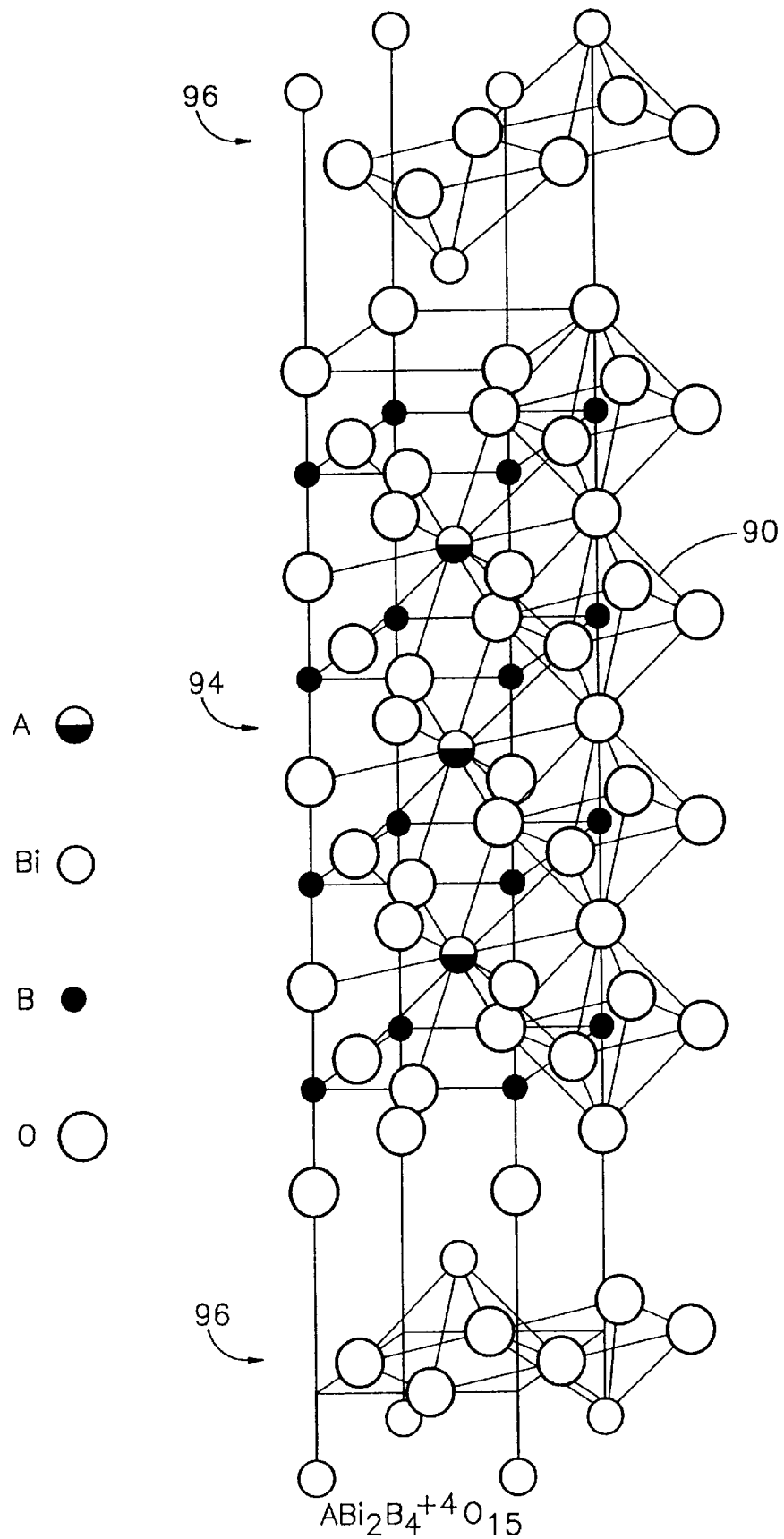
FIG. 15 shows the specific lattice structure for an $ABi_2B_4^{+4}O_9$ layered superlattice material.

It is well-known that compounds having the perovskite structure may be described in terms of the general formula $ABQ_3$, where A and B are cations and Q is an anion. In the prior art, the formula $ABQ_3$ is usually represented as $ABO_3$, or sometimes $ABX_3$, but we shall use $ABQ_3$ since it is more general than $ABO_3$ and the X may cause confusion with other x's that are used in the most general formula for a layered perovskite. A primitive perovskite unit cell as conventionally represented in the literature is shown in FIG. 12A. In terms of this depiction of the unit cell, the perovskite primitive structure is cubic, with the A cations 84, also called the A-site elements, located at the corners of the cube and generally being elements of relatively large size and small valence, and with the B cations 86, also called the B-site elements, located at the center of the cube and generally being elements of relatively small size and large valence, and the Q anions 88, located at the face centers of the cube. Another depiction of the perovskite unit cell, which is not a primitive cell but is more useful for purposes of the invention, is shown in FIG. 12B. In this depiction it is more obvious that the perovskite structure comprises corner-linked octahedrons 90, with the anions 88 at the corners of the octahedrons 90, the B cations 86 being at the centers of the octahedrons 90, and the A cations 84 in the spaces between the octahedrons 90. A cube 85 is shown by dotted lines in FIG. 12B to more clearly show the relationship of the individual atoms, and the octahedron 90 is shown by dotted lines in FIG. 12A. From the depiction of the unit cell in FIG. 12B, it is easy to see how the octahedrons 90, which each have a dipole moment which causes the ferroelectric character of the material, might be able to move slightly as the polarization switches if their upper and lower "points" were attached to a material more flexible than the lattice of a ferroelectric material. Turning to FIG. 13, a layered superlattice material 92 is illustrated. Smolenskii recognized that what we call the layered superlattice materials spontaneously form into layers 94 with a perovskite-like structure which alternate with layers 96 having a simpler structure. Depending on the material, the perovskite-like layers 94 may include one or a plurality of linked layers of perovskite-like octahedrons 90. As an example, FIG. 14 shows a unit cell of the material $ABi_2B_2^{+5}O_9$, which is the formula for strontium bismuth tantalate ($SrBi_2Ta_2O_9$) and other layered superlattice materials, such as tantalum, niobium, and tungsten, having a element with a valence of +5 in the B-site. In this structure, each perovskite-like layer 94 includes two layers of octahedrons 90 which are separated by layers 96 of a material that does not have a perovskite-like structure. In this material the primitive unit cell consists of two perovskite layers 94 and two non-perovskite layers 96, since the structure shifts between the layers 98A and 98B. In FIG. 15 the structure for a layered superlattice material having the formula $ABi_2B_4^{+4}O_{15}$, which is the formula for strontium bismuth titanate ($SrBi_4Ti_4O_{15}$) and other layered superlattice materials having an element, such as titanium, hafnium, and zirconium, having a valence of +4 in the B-sites. In this material each the perovskite-like layer 94 has four layers of octahedrons 90.

As the understanding of what Smolenskii called a layered perovskite-like structure increased, the inventors have realized that these materials are more than a substance which spontaneously forms in layers. This is seen most easily by an example. Strontium bismuth tantalate ($SrBi_2Ta_2O_9$) can be considered to be a combination of a material having the formula $Bi_2O_3$ and a material having the formula $SrTa_2O_6$. $SrTa_2O_6$ has a tungsten bronze structure by itself, but within the layered material 92 has a perovskite structure. Thus the layered structure is in reality a superlattice in which the structures of the individual sublattices of the perovskite layers 94 and the non-perovskite layers 96 are interdependent. Hence we refer to these materials herein as "layered superlattice" materials.

The word "superlattice" herein may mean something slightly different than it means in some physics contexts, such as superconductivity. Sometimes the word "superlattice" carries with it connotations of single crystal structures only. However, the materials according to the invention are not always single crystals, in fact none of the materials produced to date are single crystals, though it is believed that single crystals of these materials can be made. The materials of the invention work well in the polycrystalline state. In the polycrystalline state, the structure of the materials includes grain boundaries, point defects, dislocation loops and other microstructure defects. However, within each grain, the structure is predominately repeatable units containing one or more ferroelectric layers and one or more intermediate non-ferroelectric layers spontaneously linked in a interdependent manner. Thus the layered superlattice materials of the invention which are ferroelectric can be defined as: (A) a material having a localized structure, within a grain or other larger or smaller unit, which localized structure contains predominately repeatable units containing one or more ferroelectric layers and one or more intermediate non-ferroelectric layers spontaneously linked in an interdependent manner. The invention also includes materials that are not ferroelectric, and these can be included in the following definition: (B) a material having a localized structure, within a grain or other larger or smaller unit, which localized structure contains predominately repeatable units containing one or more perovskite-like layers and one or more intermediate non-perovskite-like layers spontaneously linked in an interdependent manner.

It has been discovered that the layered superlattice materials catalogued by Smolenskii et al. are all likely candidates for fatigue free switching ferroelectrics and dielectric materials that are resistant to degradation and breakdown over long periods of use. Rather than being random solid solutions following the general formula $ABO_3$, these materials follow the formulae outlined by Smolenskii:

(I) compounds having the formula $A_{m-1}Bi_2M_mO_{3m+3}$, where A=$Bi^{3+}$, $Ba^{2+}$, $Sr^{2+}$, $Ca^{2+}$, $Pb^{2+}$, $K^+$, $Na^+$ and other ions of comparable size, and M=$Ti^{4+}$, $Nb^{5+}$, $Ta^{5+}$, $Mo^{6+}$, $W^{6+}$, $Fe^{3+}$ and other ions that occupy oxygen octahedral; this group includes bismuth titanate, $Bi_4Ti_3O_{12}$;

(II) compounds having the formula $A_{m+1}M_mO_{3m+1}$, including compounds such as strontium titanates $Sr_2TiO_4$, $Sr_3Ti_2O_7$ and $Sr_4Ti_3O_{10}$; and (III) compounds having the formula $A_mM_mO_{3m+2}$, including compounds such as $Sr_2Nb_2O_7$, $La_2Ti_2O_7$, $Sr_5TiNb_4O_{17}$, $Sr_6Ti_2Nb_4O_{20}$. It is noted that in the case of $Sr_2Nb_2O_7$ and $La_2Ti_2O_7$ the formula needs to be doubled to make them agree with the general formula.

The materials of the invention include all of the above materials plus combinations and solid solutions of these materials. The materials may be summarized more generally under the formula:

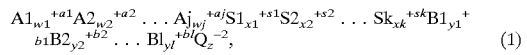

$$A1_{w1}^{+a1}A2_{w2}^{+a2}\ldots Aj_{wj}^{+aj}S1_{x1}^{+s1}S2_{x2}^{+s2}\ldots Sk_{xk}^{+sk}B1_{y1}^{+b1}B2_{y2}^{+b2}\ldots Bl_{yl}^{+bl}Q_z^{-2}, \quad (1)$$

where A1, A2 . . . Aj represent A-site elements in the perovskite-like structure, which may be elements such as strontium, calcium, barium, bismuth, lead, and others S1, S2 . . . Sk represent superlattice generator elements, which usually is bismuth, but can also be materials such as yttrium, scandium, lanthanum, antimony, chromium, thallium, and other elements with a valence of +3, B1, B2 . . . Bl represent B-site elements in the perovskite-like structure, which may be elements such as titanium, tantalum, hafnium, tungsten, niobium, zirconium, and other elements, and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the time Sr is the A-site atom and 25% of the time Ba is the A-site atom. If there is only one A-site element in the compound then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include the cases where either or the sites and the superlattice generator can have multiple elements. The value of z is found from the equation:

$$(a1w1+a2W2 \ldots +ajwj)+(s1x1+s2x2 \ldots +skxk)+(b1y1+b2y2 \ldots +bjyj)=2z. \qquad (2)$$

Formula (1) includes all three of the Smolenskii type compounds: for the type I material, w1=m−1, x1=2, y1=m, z=3m+3 and the other subscripts equal zero; for the type II material, w1=m+1, y1=m, z=3m+1, and the other subscripts equal zero; for the type III material, w1=m, y1=m, z=3m+2, and the other subscripts equal zero. It is noted that the Smolenskii type I formula does not work for M=Ti and m=2, while the formula (1) does work. This is because the Smolenskii formula does not consider valences. The materials according to the invention do not include all materials that can be fit into formula (1), but rather only those materials that spontaneously form layered superlattices. In summary, the materials of the invention include all the materials as described by the definitions (A) and (B) above, the Smolenskii formulas, and the formula (1), plus solid solutions of all the foregoing materials.

2. Detailed Description of the Capacitor and Integrated Circuit Devices According to the Invention An exemplary wafer 1 on which test samples of capacitor devices according to the invention have been fabricated is shown in FIG. 2A. It should be understood that the FIGS. 2A, 2B, and 2C depicting capacitor devices and FIG. 3D depicting an integrated circuit device are not meant to be actual plan or cross-sectional views of any particular portion of an actual capacitor or integrated circuit device, but are merely idealized representations which are employed to more clearly and fully depict the structure and process of the invention than would otherwise be possible. FIG. 2B shows a cross-section of the wafer 1 of FIG. 2A taken through the line 2B—2B. FIG. 2C depicts a similar cross-section taken through a wafer similar to that of FIG. 2A but having a different layered structure. Referring to FIGS. 2A and 2B, the wafer 1 preferably comprises a P-type silicon substrate 2 on which an approximately 5000 Å silicon dioxide insulating layer 4 has been wet grown. A thin layer 6 of titanium metal has been deposited on the silicon dioxide 4, preferably by sputtering in situ, and a 2000 Å thick electrode of platinum has been deposited on the titanium 6, preferably by sputtering in situ. By "in situ" is meant that both the titanium and the platinum are sputtered without breaking vacuum. The titanium diffuses into the silicon dioxide and platinum and assists the platinum 8 in adhering to the silicon dioxide 4, and is optional. A buffer layer 10, is deposited on the platinum electrode 8, followed by a layer 12 of a layered superlattice material according to the invention, followed by another buffer layer 14, via processes that will be described in detail in the Examples below. Another 2000 Å layer of platinum is deposited on the buffer layer 14. The wafer 1 is annealed, patterned with a photo-mask process, and etched down to the electrode layer 8 to produce rectangular capacitor devices 17A, 17B, etc. (FIG. 2A) of various sizes separated by large areas of the electrode 8. The size of the devices 17A, 17B, etc. is greatly exaggerated in FIG. 2A. Each device 17A, 17B, etc. may be tested by connecting one lead of the test device to the platinum electrode layer 8 and contacting the other electrode layer 16 of the particular device 17A, 17B, etc. with a fine probe connected to the other lead of the test device. Devices having the cross-sectional structure of FIG. 2C are similarly fabricated except that the two buffer layers 10, 12 are not deposited. That is, the wafer of FIG. 2C includes a silicon substrate 22, a silicon dioxide layer 24, an optional titanium layer 26, a first platinum electrode 28, a layered superlattice material layer 30, and a second platinum electrode 32. The wafer 20 is similarly pattered to form capacitor devices of various sizes having the cross-section shown in FIG. 2C. The fabrication of exemplary devices of the types shown in both FIGS. 2B and 2C will be described in detail in the Examples below.

FIG. 3A is a block diagram illustrating an exemplary integrated circuit memory 36 in which ferroelectric switching capacitors or high dielectric constant capacitors made with the materials of the invention are utilized. For simplicity, the embodiment shown is for a 16K X1 DRAM; however the material may be utilized in a wide variety of sizes and types of memories, both volatile and non-volatile. In the 16K embodiment shown, there are seven address input lines 38 which connect to a row address register 39 and a column address register 40. The row address register 39 is connected to row decoder 41 via seven lines 42, and the column address register 40 is connected to a column decoder/data input output multiplexer 43 via seven lines 44. The row decoder 41 is connected to a 128×128 memory cell array 45 via 128 lines 46, and the column decoder/data input output multiplexer 43 is connected to the sense amplifiers 79 and memory cell array 45 via 128 lines 47. A RAS* signal line 48 is connected to the row address register 39, row decoder 41, and column decoder/data input/output multiplexer 43, while a CAS* signal line 49 is connected to the column address register 40 and column decoder/data input output multiplexer 43. (In the discussion herein, a * indicates the inverse of a signal.) An input/output data line 35 is connected to the column decoder/data input output multiplexer 43.

Memory cell array 45 contains 128×128=16,384 memory cells, which is conventionally designated as 16K. These cells may be ferroelectric switching capacitor-based cells or dielectric capacitor-based cells. A ferroelectric capacitor-based switching cell 70 is shown in FIG. 3B. The cell includes two electrically interconnected electrical devices: a transistor 71 and a ferroelectric switching capacitor 72. The gate 73 of transistor 71 is connected to line 46A, which is one of the lines 46 (FIG. 3A) which are generally called "word lines". Source/drain 74 of transistor 71 is connected to line 47A, which is one of lines 47 which are generally called "bit lines". The other source/drain 75 of transistor 71 is connected to electrode 58 of switching capacitor 72. The other electrode 77 of switching capacitor 72 is connected to line 78 which is connected to a reference voltage $V_{ref}$. The cell 70 may be fabricated as an integrated circuit as shown in FIG. 3D. The individual elements just described in connection with FIG. 3B are labeled with the same numbers in FIG. 3D.

A dielectric capacitor-based memory cell 70' is shown in FIG. 3C. All the parts 46', 47', 71', 73', 58', 77' etc. of this cell 70' correspond to the parts having the same number (without a "'") in FIG. 3B, although the specifications (threshold voltage of the transistor 71', reference voltage, etc.) may be different, and the capacitor 72' contains a dielectric material 60' instead of a ferroelectric switching material. That is, material corresponding to layer 60 (FIG. 3D) in the integrated circuit implementation will be one of the high dielectric constant materials of the invention rather than one of the low-fatigue ferroelectric switching materials; the cell 70' may be implemented in an integrated circuit as shown in FIG. 3D, with the elements in FIG. 3D having a particular number corresponding to the elements in FIG. 3C having the same number with a "'".

The operation of the memory in FIGS. 3A through 3D is as follows. Row address signals $A_0$ through $A_6$ (FIG. 3A) and column address signals $A_7$ through $A_{13}$ placed on lines 38 are multiplexed by address registers 39, 40 utilizing the RAS* and CAS* signals, and passed to the row decoder 41 and column decoder/data input/output multiplexer 43, respectively. The row decoder 41 places a high signal on the one of the wordlines 46 that is addressed. The column decoder/data input output multiplexer 43 either places the data signal which is input on line 35 on the one of the bit lines 47 corresponding to the column address, or outputs on the data line 35 the signal on the one of the bit lines 47 corresponding to the column address, depending on whether the function is a write or read function. As is known in the art, the read function is triggered when the RAS* signal precedes the CAS* signal, and the write function is triggered when the CAS* signal comes before the RAS* signal. The transistors 71, 71' in the cells connected to the word line that is high turn on, permitting the data signal on the bit line 47A, 47A' to be read into the capacitor 72, 72' or the signal on the capacitor 72, 72' to be output on the bit line 47A, 47A' depending on whether the read or write function is implemented. As is well-known in the art, the sense amplifiers 79 are located along lines 47 to amplify the signals on the lines. Other logic required or useful to carry out the functions outlined above as well as other known memory functions is also included in the memory 36 but is not shown or discussed as it is not directly applicable to the invention. As outlined above, the RAS* and CAS* lines 48 and 49, registers 39, 40, the decoders 41, 42, and the transistor 71 comprise an information write means 80 for placing the memory cell 70 in a first memory state or a second memory state depending upon information input to the memory on data line 35, the first memory cell state corresponding the layer 60 of ferroelectric material being in a first polarization state, and the second memory cell state corresponding to the layer 60 being in a second polarization state; these components plus sense amplifiers 79 comprise an information read means 82 for sensing the state of memory cell 70 and providing an electrical signal corresponding to the state. Test cells made with strontium bismuth tantalate ($SrBi_2Ta_2O_9$) as the layered superlattice material have held their polarization states for over 80 days at 100° C. and other conditions of shock and stress. See the discussion below in connection with FIGS. 16 through 28.

Similarly, the RAS* and CAS* lines 48 and 49, registers 39, 40, the decoders 41, 42, and the transistor 71' comprise an information write means 80' for placing the capacitor 72' in a first charge state or a second charge state depending upon information input to the memory on data line 35; and these components plus sense amplifiers 79 comprise an information read means 82' for sensing the charge state of capacitor 72' and providing an electrical signal corresponding to the charge state.

Figure 1A:
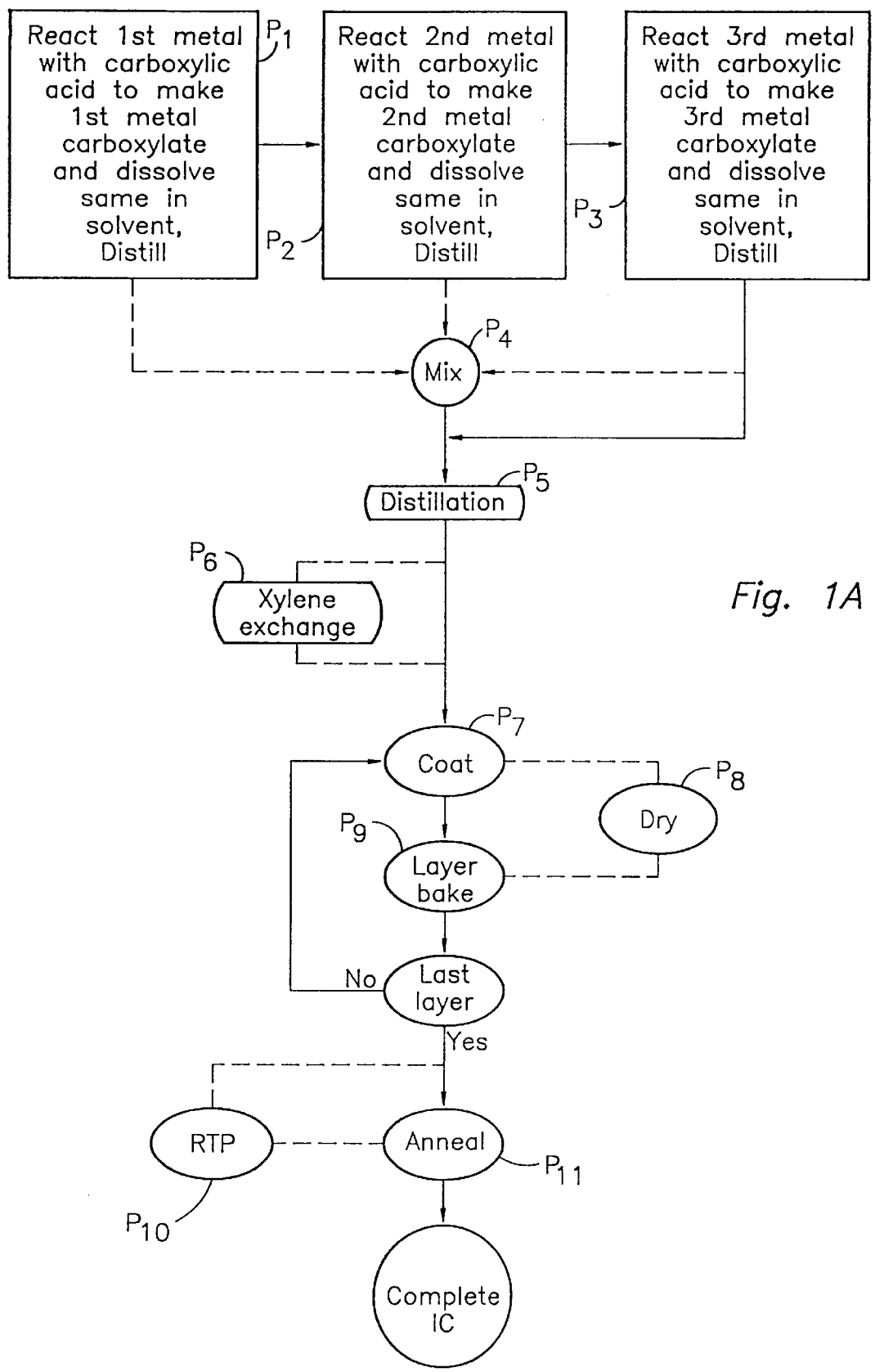
FIG. 1A is a flow chart showing the preferred embodiment of a process for preparing a thin film of the layered superlattice material according to the invention.
Figure 1B:
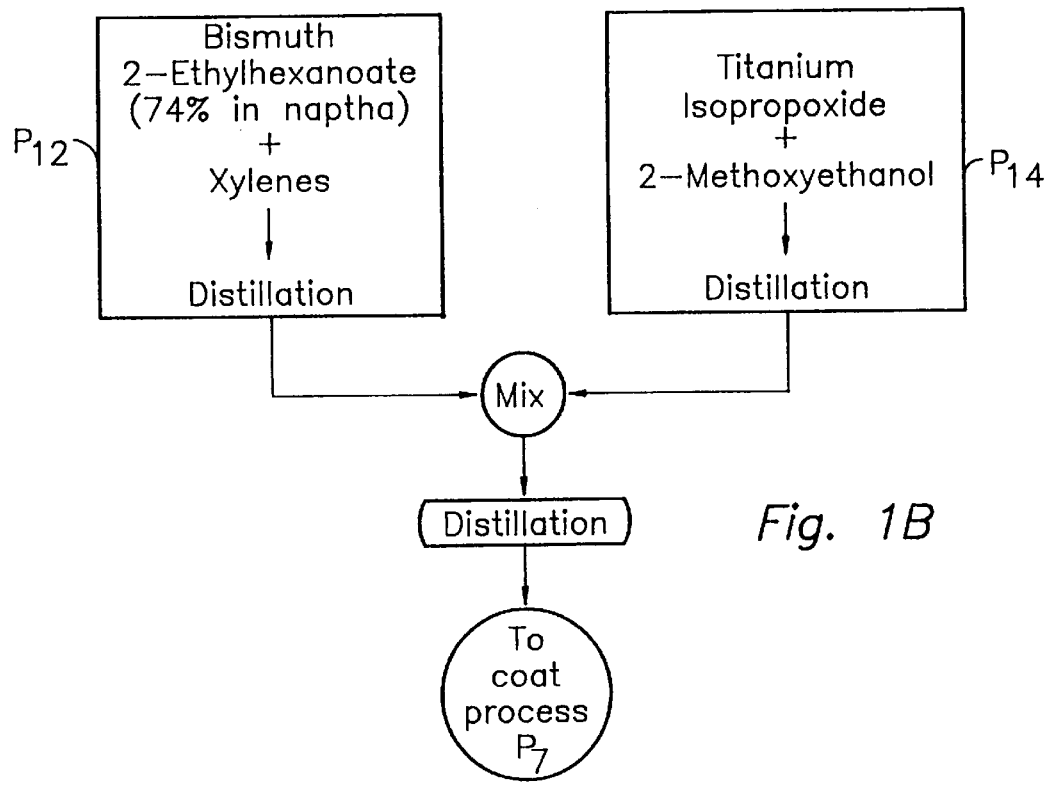
FIG. 1B is a flow chart showing an alternative preferred embodiment of the precursor solution formation portion of the process of FIG. 1A.
Figure 1C:
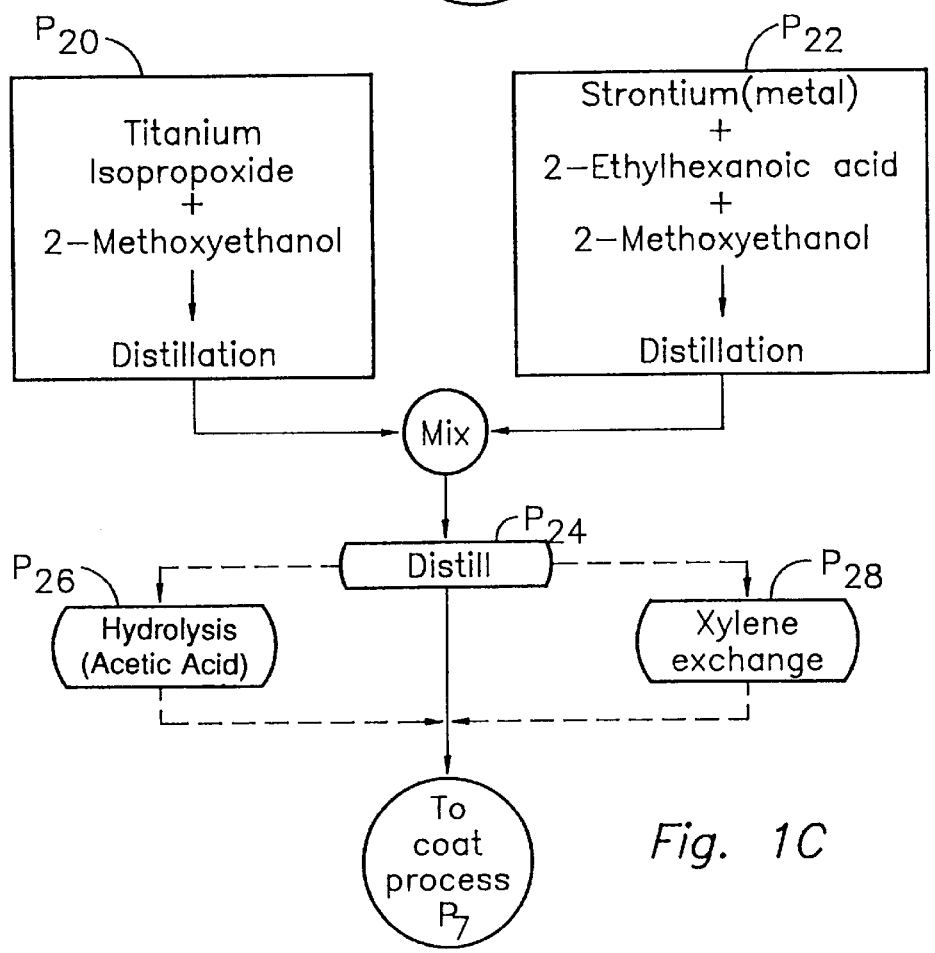
FIG. 1C is a flow chart showing an alternative preferred embodiment of the precursor solution formation portion of the process of FIG. 1A.

3. Detailed Description of the Layered Superlattice Thin Film Fabrication Process Turning now to a detailed description of the preferred processes for fabrication the materials and devices according to the invention, several preferred processes for fabricating layered superlattice thin films as may be incorporated into a capacitor device as shown in FIGS. 2A through 2C or an integrated circuit device as shown in FIG. 3D are illustrated in FIGS. 1A, 1B, and 1C. These processes are simple and relatively inexpensive, and thus lend themselves to large scale manufacturing. However, there are a wide variety of other processes that may be used.

The generalized preferred process for fabricating a layered superlattice material in which there are three metallic elements is shown in FIG. 1A. The process begins by the formation of a liquid precursor. In each of steps P1 through P3 a metal compound is reacted with a carboxylic acid to form a metal carboxylate, which is dissolved in a solvent. The preferred carboxylic acid is 2-ethylhexanoic acid, although others may be used. Preferably the solvent's boiling point should be within the range 110° C.–170° C. The preferred solvents are the xylenes and 2-methoxyethanol, though any of the solvents in Table A may be used.

TABLE A

| Solvent | Boiling Point |
| --- | --- |
| n-Butyl acetate | (bp = 126.5° C.) |
| N,N-dimethylformamide | (bp = 153° C.) |
| 2-Methoxyethyl acetate | (bp = 145° C.) |
| Methyl isobutyl ketone | (bp = 116° C.) |
| Methyl isoamyl ketone | (bp = 144° C.) |
| Isoamyl alcohol | (bp = 132° C.) |
| Cyclohexanone | (bp = 156° C.) |
| 2-Ethoxyethanol | (bp = 135° C.) |
| 2-Methoxyethyl ether | (bp = 162° C.) |
| Methyl butyl ketone | (bp = 127° C.) |
| Hexyl alcohol | (bp = 157° C.) |
| 2-Pentanol | (bp = 119° C.) |
| Ethyl butyrate | (bp = 121° C.) |
| Nitroethane | (bp = 114° C.) |
| Pyrimidine | (bp = 123° C.) |
| 1,3,5 Trioxane | (bp = 115° C.) |
| Isobutyl isobutyrate | (bp = 147° C.) |
| Isobutyl propionate | (bp = 137° C.) |
| Propyl propionate | (bp = 122° C.) |
| Ethyl Lactate | (bp = 154° C.) |
| n-Butanol | (bp = 117° C.) |
| n-Pentanol | (bp = 138° C.) |
| 3-Pentanol | (bp = 116° C.) |

The amounts of the metals used are usually proportioned so that an equivalent weight of each metal equal to the molecular weight of the metal in the stoichiometric formula for the desired layered superlattice material used. An exception is lead. Generally an excess of lead of between 5% and 15%, preferably 10%, of the equivalent stoichiometric amount is included because lead oxide has a higher vapor pressure than the other metals and a significant amount of lead evaporates as lead oxide during baking and annealing. Similarly, excess amounts of other materials, such as bismuth, that evaporate or otherwise are lost in the process may be used. In Example 1 below, an excess of titanium is noted in the $Bi_4Ti_3O_{12}$ material, however this was an accidental excess and is believed to be too small of an excess to make a significant difference, but is noted for completeness.

The steps P1, P2, and P3 are preferably performed by mixing the metal or metal alkoxide, the carboxylic acid, and the solvent together and stirring. Low heat of between about 70° C. and 90° C. may be added to assist the reaction and dissolving, but this is generally not necessary. The solid arrows indicate that generally, the chemist will perform all the steps P1, P2 and P3 in the same container; that is the first metal or metal alkoxide, a first measure of carboxylic acid, and a first solvent are placed in a container, the metal or metal alkoxide and carboxylic acid are reacted, and the reactant dissolved, the second metal or metal alkoxide is then placed in the same container and additional carboxylic acid and solvent are added and stirred to react the second metal or metal alkoxide and dissolve the reactant, then the third metal or metal alkoxide, third carboxylic acid, and third solvent are added, the metal or metal alkoxide is reacted, and the reactant dissolved. In this process the most reactive metal or metal alkoxide is preferably added first, the second most reactive metal or metal alkoxide added second, and the least reactive metal or metal alkoxide added last. It also may be desirable to perform the distillation step after each or some of the metal and/or metal alkoxides are reacted and dissolved. Alternatively, each metal and/or metal alkoxide may be combined with a carboxylic acid and solvent, reacted, and dissolved in a separate container, the result distilled if desirable, and then the three separate solutions mixed in step P4. Variations and combinations of preparing the individual metal precursors separately or in the same container and distillation(s) may be used depending on the solvents used and the form in which metal element is readily available. In addition it should be understood that if the desired superlattice material includes only two metallic elements, then only two metals or metal alkoxides will be reacted and dissolved, and if the desired superlattice material includes four or more metallic elements, then four or more metals or metal alkoxides will be reacted and dissolved. Further, it is understood that any of the steps P1, P2, and P3 may be replaced by using a preprepared metal carboxylate.

When the solution of reacted and dissolved metal carboxylates has been prepared, the mixed precursor solution is then distilled in step P5 by heating and stirring the solution to reduce the solution to the desired volume and viscosity, which may depend on whether the solution is to be stored or used immediately, and/or to remove certain liquids. Generally, if it is desirable to remove certain liquids, the solution is heated to a temperature above the boiling point of the liquids to be removed and below the boiling point of the liquids that are desired to be retained. The solution is distilled until all the solvents that are desired to be removed have evaporated and a desired volume and viscosity are reached. It may be necessary to add solvent several times in the distilling process to remove all undesired solvents and obtain the desired volume and viscosity.

Optionally, either separately or in combination with the steps P1 through P5, a xylene exchange step P6 is performed. In this step xylene is added and the other solvents are distilled away. This xylene exchange step P6 would generally be performed when the coating process P7 is one in which a xylene-based precursor is preferable. This may also depend on the personal preferences and experience of the person who performs the coating process P7. Although the xylene exchange is shown as a separate step P6, if it is known that the xylene-based precursor will be preferable, the xylene may be added with the other solvents in steps P1, P2, and/or P3 and the other solvents distilled away in the distillation step P5. Or, as shown by the dotted lines in FIG. 1A, the precursor may be stored after the distillation step P5, and the xylene exchange performed just prior to use. If it is not known at the time of preparing the precursor solution whether or not a xylene-based solution will be preferable, then the xylene exchange should not be done since the xylene generally has a higher boiling point than the other solvents used in steps P1, P2, and P3 and therefore removing it in favor of the other solvents is difficult.

In step P7 the precursor solution is then applied to a wafer, such as the wafer 1 in FIG. 2B, the wafer 20 in FIG. 2C, or the wafer 50 in FIG. 3D. In the case of wafer 20, the substrate 2 and the layers 4, 6, and 8 will be already formed at the time of coating in step P7 to form layer 10. Then the process of FIG. 1A may be used to form layers 12 and 14. Similarly, in the case of wafer 20, the substrate 22, and the layers 24, 26, and 28 will be formed, and in the case of wafer 50, the substrate 51, the doped areas 52, and the layers 54, 56, and 58 will be formed prior to the coating step P7, in which the layers 30 and 60, respectively, are deposited. Preferably the coating step P7 may be either a mist deposition at ambient temperature in a vacuum as described in the first embodiment in U.S. patent application Ser. No. 660,428, which is incorporated herein by reference, or it may be a spin deposition, which is a well-known form of deposition in which the precursor is placed on a wafer and the wafer is spun to evenly distribute the precursor over the wafer. Preferably the wafer is spun at a spin rate of between 750 RPM and 6000 RPM for a period of 5 seconds to a minute, with these parameters depending on the concentration and viscosity of the solution being applied and the desired thickness of the resulting layer. In general the xylene exchange P6 is performed in preparing the precursor solution if the spin coating method is used, and the xylene exchange P6 is not performed if the mist deposition is used. After the coating process, the wafer 1, 20, 50 is transferred to a hot plate in which it is baked as indicated at P9. Alternatively, an oven may be used in the baking if it is desirable to control ambients. Preferably, the baking is at a temperature in the range of 200° C. and 400° C. for a time period between 30 seconds and 15 minutes. Optionally, a drying step P8 may be preformed between the coating and bake steps. The drying will generally comprise a heating on a hot plate or in an oven or using rapid thermal processing (RTP) at a lower temperature than the bake step. If the initial coating and bake steps do not result in a layer, such as 30 in FIG. 2C, that is as thick as desired, then the coating P7, optionally the drying step P8, and the baking step P9 are repeated until the desired thickness is obtained. After the last layer is coated and baked, the wafer is placed in a diffusion furnace and the layered superlattice material is annealed at step P11. Preferably, the annealing is performed in an oxygen atmosphere at ambient pressure with a flow rate of about 3 liters to 6 liters per minute, and at a temperature of between 600° C. and 850° C. for a time period of between 5 minutes and three hours. The temperature is preferably ramped upward in steps over this period. Optionally, the wafer may be annealed in a rapid thermal process (RTP) step P10 prior to the diffusion furnace anneal step P11. The RTP step utilizes a halogen light source to raise the wafer rapidly to a high temperature in the range from 500° C. to 850° C. for an anneal time of between 15 seconds and 3 minutes. After the annealing P11, the rest of the wafer 1, 20, or 50 is completed.

A variation of the above process used to produce the precursor solution for a bismuth titanate ($Bi_4Ti_3O_{12}$) capacitor device or integrated circuit element according to the invention is shown in FIG. 1B. This process is the same as the precursor solution formation portion of the process of FIG. 1A, except that the reaction and dissolving of the titanium in step P14 does not involve a carboxylic acid. In step P14 titanium isopropoxide is reacted with 2-methoxyethanol to produce titanium 2-methoxyethoxide, isopropanol and water, and the isopropanol and water are distilled off. In step P12 the bismuth metal, bismuth carbonate, or bismuth oxide has already been reacted with a carboxylic acid, i.e. 2-ethylhexanoic acid, to form bismuth 2-ethylhexanoate, a metal carboxylate. Bismuth is readily available commercially in this form. The process of FIG. 1B is the process used to produce the bismuth titanate to produce the samples described below in the discussion of Example 1. However, the process of FIG. 1A, or some combination of the processes of FIGS. 1A and 1B by using various amounts of 2-ethylhexanoic acid and 2-methoxyethanol in step P14 may also be used to produce bismuth titanate. The best results appear to be obtained if small amounts of 2-ethylhexanoic acid are added to partially replace the 2-methoxyethoxide ligands by 2-ethylhexanoate ligands in the titanium solution just prior to coating.

FIG. 1C shows another variation of the precursor solution formation process portion of FIG. 1A. In the process of FIG. 1C, the step P20 is the same as the step P14 of FIG. 1B, and the step P22 is the same as one of the steps P1 through P3 in FIG. 1A: that is, a metal, strontium, a carboxylic acid, 2-ethylhexanoic acid, and a solvent, 2-methoxyethanol, are combined to produce a metal carboxylate, strontium 2-ethylhexanoate, dissolved in a solvent, 2-methoxyethanol. In FIG. 1C optional steps of hydrolysis P26 and xylene exchange P28 are shown after the step of distilling P24. The xylene exchange step was discussed above in connection with step P6 of FIG. 1A. The hydrolysis step involves adding water to the solution to react with the metal alkoxide, i.e. titanium 2-methoxyethoxide, to partially polymerize the metal oxides into chains. This is sometimes useful to prevent the film from cracking after deposition. The acetic acid is optional and slows the rate of hydrolysis to prevent solids from forming and precipitating during hydrolysis. A distillation process is usually done as the final step of the hydrolysis P26. The process of FIG. 1C including the xylene exchange step P28, but not the hydrolysis step P26, was the process used in preparing the strontium titanate ($SrTiO_3$) solution to form the layers 10, 14 of the device of FIG. 2B as described below in Examples 1 and 2.

4. Examples of the Fabrication Process and Ferroelectric and Dielectric Properties for Specific Layered Superlattice Materials A detailed example of the fabrication process for an integrated circuit memory cell as in FIG. 3D is given in U.S. patent application Ser. No. 919,186 which is incorporated herein by reference. Eight examples of the process of fabricating a layered superlattice material and capacitor devices as shown in FIGS. 2A through 2C are given below. Each is preceded by a table listing the reactive components utilized in the fabrication process and each is followed by a description of the ferroelectric and/or the dielectric properties as appropriate. The solvents used are described in a description of the process following each table. In the tables, "FW" indicates formula weight, "g" indicates grams, "mmoles" indicates millimoles, and "Equiv." indicates the equivalent number of moles in solution. "Xylenes" indicates a commercially available xylene solution which includes three different fractionations of xylene. Bismuth 2-ethylhexanoate indicates a commercially available bismuth solution of bismuth 2-ethylhexanoate in 74% naptha; the formula weight in this case is placed in parenthesis to indicate that it is an equivalent formula weight of bismuth in the solution as a whole, rather than the formula weight of the just the bismuth 2-ethylhexanoate, in order to take into account the presence of the naptha. All processes were performed at the atmospheric pressure in Colorado Springs, Colo., except where otherwise noted. In the examples below, all the initial wafer substrates on which the materials described were fabricated were layered substrates as illustrated by layers 2, 4, 6, and 8 in FIG. 2B or layers 22, 24, 26, and 28 in FIG. 2C, with the silicon substrates 2, 22 being made of P-type silicon of between 5 Ohms/cm and 25 Ohms/cm resistivity, having a field oxide layer 4, 24 that was wet grown to about 5000 Å, a 200 Å thick layer 6, 26 of sputtered titanium, and a 2000 Å layer 8, 28 of sputtered platinum. After the layers 10, 12, 14 and 16, for the samples that had buffer layers, or the layers 30 and 32 for the samples that did not have buffer layers, were deposited as described in the examples, the wafer was patterned as illustrated in FIG. 2A using either a positive or negative photo resist in combination with a photo mask step. When a positive photo resist is indicated in an example, the resist is spun on at 5000 RPM, soft-baked on a hot plate at 95° C. for 2 minutes, followed by a standard photo mask process having a 7 second UV exposure, a 1 minute development and 1 minute water rinse, and a 5 minute hard bake at 140° C. When a negative photo resist is indicated in an example, the negative resist is spun on at 5000 RPM, soft-baked on a hot plate at 90° C. for 5 minutes, followed by a standard photo mask process utilizing a 4 second UV exposure, a 1 minute development and 1 minute water rinse, and a 5 minute hard bake at 140° C. When an IPC strip is indicated, this is an oxygen plasma strip using an Ion Plasma Corporation "barrel etcher" at 500 mTorr oxygen and 350 watts. When an rapid thermal process (RTP) is indicated, the process was done with an AG Associates model 410 Heat Pulser, the ramp rate given is for the period of increasing the temperature to the working temperature, and the time period given is the time for which the temperature was held at the working temperature. In all cases an oxygen flow of 3 liters/minute is used in the RTP anneals.

In each of the examples, following the description of the process of making the device with the particular material, there is a discussion of the electrical properties illustrated in the figures. In each figure, the material of the sample, the thickness of the sample, and other relevant parameters are given. The thickness is usually approximate since, as in all layering type processes, the thickness can vary, and it was not measured for each portion of the wafer. For some samples, the given thickness is based on the known thickness that results from the processing parameters; the measurements of thickness that were done confirmed that the thicknesses did not vary sufficiently from that determined from the process parameters to alter the results significantly. The figures include hysteresis curves, such as FIG. 5A, PUND switching curves, such as FIG. 7C, material endurance or "fatigue" curves such as FIG. 4C and FIG. 5C, and leakage current curves, such as FIG. 8G. The hysteresis curves are given in terms of the applied electric field in kilovolts per centimeter versus the polarization in microcoulombs per centimeter squared, except for those of FIGS. 6D, 8D and 8E where the abscissa is in volts. As is well-known, hysteresis curves which suggest good ferroelectric properties tend to be relatively boxy and long in the direction of polarization, the ordinate in the figures herein, as for example the curve in FIG. 7A, rather than thin and linear, as the curves in FIG. 4B. The hysteresis measurements were all made on an uncompensated Sawyer-Tower circuit unless otherwise noted. The PUND switching curves are given in terms of current in amps along the ordinate versus time in nanoseconds along the abscissa, except for those of FIGS. 18, 20, 22A–22D, and 23A–23D, where the ordinate is in $Amp/cm^2$. The PUND curves are generated in a well-known manner by first initializing the sample with a pulse in the negative direction, then measuring the current through a small resistance, typically 50 ohms in the tests herein, for a series of four voltage pulses that give the measurement its name: a positive (P) pulse, a second positive of up (U) pulse, a negative (N) pulse, and then another negative or down (D) pulse. All pulses have the same absolute amplitude. The initial negative pulse makes sure the material starts with a negative polarization. The first positive, "P", pulse therefore switches the material to a positive polarization. Since the sample is already polarized positively, the second, or "U", pulse measures the change between the residual polarization and the saturated polarization in the positive direction. Likewise the "N" pulse measures the negative switching current, and the "D" pulse measures the change between the residual polarization and the saturated polarization in the negative direction. For a standard architecture of a memory cell (but not for all architectures) the PUND curves indicate the suitability of the material for a non-volatile ferroelectric switching memory application. Generally, it is desirable that the "P" and "N" curves are well-separated from the "U" and "D" curves, respectively, which provides a large signal in the standard architecture. It is also desirable that all the curves fall quickly to a low value; a curve that falls quickly indicates that the material completes the current flow, which produces the signal, quickly, that is, it is a "fast switching" material. Generally, in the tests herein, the switching time is taken to be the time to fall to a value of 10% of the maximum amplitude, since this 10% level will generally be within the noise level of a typical integrated circuit. The endurance or "fatigue" curves give the polarization, one of either $P_r^+$, $P_r^-$, Prp or Prn, in microcoulombs per square centimeter versus the number of cycles. These curves are of two types: one type, such as FIG. 4C, is taken from the polarizabilities measured in a hysteresis measurement, and the other type, such as FIG. 5C, is taken from the polarizabilities measured in a PUND switching test. The leakage current curves, such as FIG. 8G are given in terms of the applied electric field in kilo-volts per centimeter as the abscissa versus the log of the current in amps per square centimeter. It is necessary to use the log of current because the curves are measured over an extremely wide range of currents. A leakage current of $10^{-6}$ amps per square centimeter or less is considered excellent for dielectric applications. However, it should be kept in mind that for a given material the leakage current can be decreased simply by making the material thicker, and will be increased if the material is made thinner. Thus the thickness of the material on which the measurement is made must be considered. In state-of-the-art high-density CMOS integrated circuits, the dielectric layers range from about 100 Å for the capacitor dielectric in DRAM capacitors to about 15,000 Å for passivation layers.

EXAMPLE 1

Bismuth Titanate Between Buffer Layers of
Strontium Titanate—$SrTiO_3/Bi_4Ti_3O_{12}/SrTiO_3$ The compounds shown in Table I were measured.

TABLE I

| Compound | FW | g | mmole | Equiv. |
|---|---|---|---|---|
| Bismuth 2-ethylhexanoate | (638.61) | 21.2578 | 24.6328 | 4.00000 |
| Titanium Isopropoxide | 284.26 | 5.2517 | 18.4750 | 3.00006 |
| Strontium | 87.62 | 2.8023 | 31.982 | 1.0000 |
| 2-ethylhex-anoic acid | 144.21 | 9.2283 | 63.992 | 2.0009 |
| Titanium Isopropoxide | 284.26 | 9.0912 | 31.982 | 1.0000 |

The bismuth 2-ethylhexanoate was placed in 90 ml xylenes. The solution was stirred and heated to a maximum temperature of 117° C. to distill out all light hydrocarbon fractions and water. The first measure of titanium isopropoxide was combined with 60 ml of 2-methoxyethanol, and was stirred and heated to a maximum temperature of 116° C. to distill out all water and isopropanol. The bismuth solution and the titanium solution were combined, then heated to a maximum temperature of 136° C. to distill out all 2-methoxyethanol and some xylenes until 60 ml of solution remained. The concentration was 0.1206 moles of $Bi_4Ti_3O_{12}$ per liter with 0.002% excess titanium.

The strontium was placed in the 2-ethylhexanoic acid together with 50 ml 2-methoxyethanol. The solution was stirred and heated to a maximum temperature of 115° C. to distill off all light hydrocarbon fractions and water. The second measure of titanium isopropoxide was dissolved in 50 ml methoxyethanol and stirred and heated to a maximum of 115° C. to distill off the isopropanol and water. The strontium and titanium solutions were combined and stirred and heated to a maximum temperature of 125° C. to distill down to a volume of 60.0 ml. The concentration was 0.533 moles of $SrTiO_3$ per liter. Just prior to use, a xylene exchange was performed by adding 25 ml of xylenes to 5 ml of the above $SrTiO_3$ solution and stirred and heated to a maximum temperature of 128° C. to distill out 7 ml to produce a final solution of 23 ml volume and a concentration of 0.116 moles of $SrTiO_3$ per liter.

The wafer was baked at 140° C. in air for 30 minutes to dehydrate it. An eyedropper was used to place 1 ml of the $SrTiO_3$ solution on a wafer as in FIG. 2B with the layers deposited up to and including the platinum bottom electrode 8. The wafer was spun at 1500 RPM for 20 seconds. The wafer was then placed on a hot plate and baked at 250° C. in air for four minutes. An eyedropper was used to place 1 ml of the $Bi_4Ti_3O_{12}$ solution on the wafer and the wafer was spun at 1500 RPM for 20 seconds. The wafer was placed on a hot plate and baked at 250° C. for 4 minutes. The steps from using an eyedropper to deposit 1 ml of $SrTiO_3$ solution on the wafer through baking on the hot plate were repeated for another $SrTiO_3$ layer 14. The wafer was then transferred to a diffusion furnace and annealed at 700° C. in an oxygen flow of 5 liters/minute for 50 minutes. The top layer 16 of 2000 Å platinum was sputtered, a resist was applied, followed by a standard photo mask process, an ion mill etch, an IPC strip and a final contact anneal at 700° C. in an oxygen flow of 5 l/m for 50 minutes. The resulting sample was tested with the results shown in FIGS. 4A through 4C.

Figure 4A:
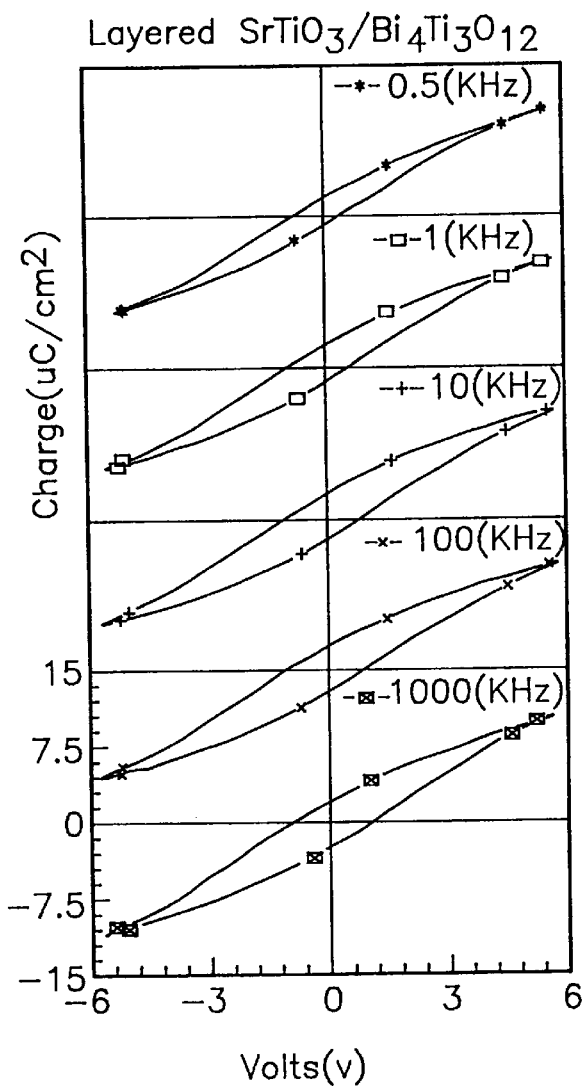
FIG. 4A shows the hysteresis curve at five different frequencies of a device as shown in FIG. 2B having a layer of $Bi_4Ti_3O_{12}$ between buffer layers of $SrTiO_3$.
Figure 4B:
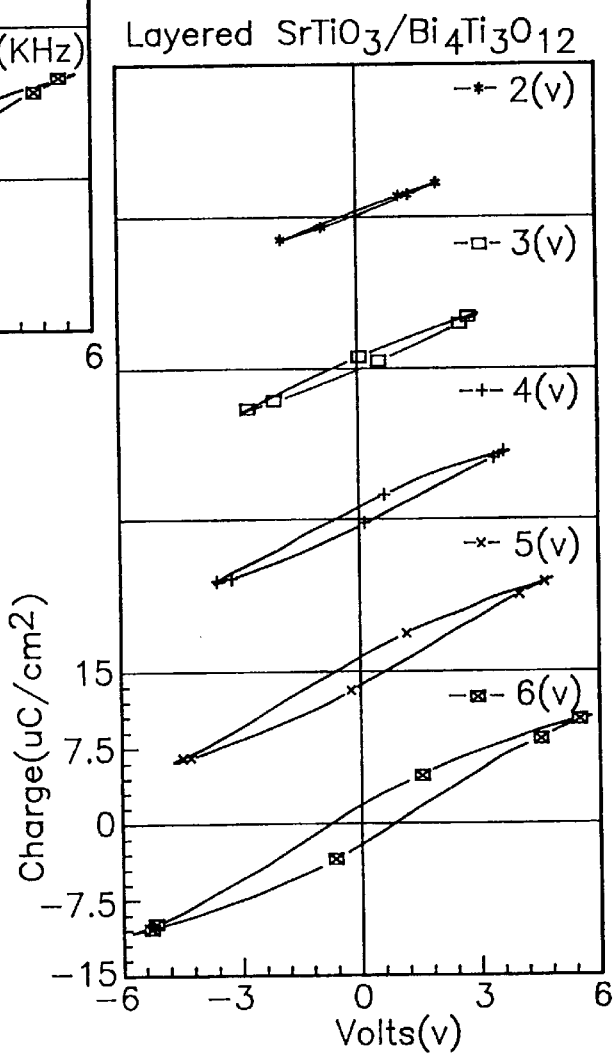
FIG. 4B shows the hysteresis curve at five different voltages of the device of FIG. 4A.

FIGS. 4A and 4B show the measured hysteresis curves for the capacitor device 1 (FIG. 2B) with $Bi_4Ti_3O_{12}$ deposited in a layer 12 with $SrTiO_3$ buffer layers 10, 14. The total thickness of the three layers was about 2500 Å. FIG. 4A shows the hysteresis curves at different frequencies ranging from 0.5 KHz to 1000 KHz, and FIG. 4B shows the hysteresis curves for five different voltages ranging from 2 volts to 6 volts. These hysteresis curves demonstrate that the ferroelectric properties of the sandwich structure are consistent over a wide range of frequencies and increase in a regular manner over the range of voltages that are typical of integrated circuit devices. However, their thin, elongated shape (as compared to the shape, say, of the hysteresis curves of FIGS. 5A and 7A) suggest that either the electric field has fallen off sharply in the buffer layers, or the ferroelectric material displaying the hysteresis is much thinner than the approximately 750 Å of the $Bi_4Ti_3O_{12}$ layer 12. FIG. 4C shows that $P_r^-$ and $P_r^+$ remain almost unchanged all the way out to $10^9$ cycles. Thus, whatever is exhibiting the hysteresis is a very low-fatigue material.

EXAMPLE 2

Strontium Bismuth Titanate Between Buffer Layers of Strontium Titanate—$SrTiO_3/SrBi_4Ti_4O_{15}/SrTiO_3$ The compounds shown in Table II were measured.

TABLE II

| Compound | FW | g | mmole | Equiv. |
|---|---|---|---|---|
| strontium | 87.62 | 0.5310 | 6.0603 | 1.0000 |
| 2-ethylhex-anoic acid | 144.21 | 1.7511 | 12.143 | 2.0037 |
| bismuth 2-ethylhexanoate | (862.99) | 20.919 | 24.240 | 3.9998 |
| Titanium isopropoxide | 284.26 | 6.8910 | 24.242 | 4.0001 |

The strontium was placed in about 80 ml 2-methoxyethanol and reacted to produce strontium 2-methoxyethoxide and evolving hydrogen gas. The 2-ethylhexanoic acid was added, and the mixture stirred and heated to a maximum temperature of about 118° C. to produce strontium 2-ethylhexanoate and distill off all water. The bismuth 2-ethylhexanoate was combined with 50 ml xylenes, and the mixture stirred and heated to a maximum temperature of about 125° C. to distill off all water. The titanium isopropoxide was combined with about 50 ml 2-methoxyethanol, and the mixture was stirred and heated to a maximum temperature of about 116° C. to produce titanium 2-methoxyethoxide and distill off all isopropanol and water. The strontium 2-ethylhexanoate and bismuth 2-ethylhexanoate solutions were combined (total 90 ml) and stirred and heated to a maximum of about 125° C. to distill down to 50 ml. About 40 ml xylenes were added, and the mixture was stirred and heated to a maximum temperature of about 125° C. to distill down to 50 ml again. The titanium 2-methoxyethoxide was added, and the mixture was stirred and heated to a maximum temperature of about 125° C. to distill down to 60.0 ml with a concentration of 0.101 moles of $SrBi_4Ti_4O_{15}$ per liter.

The wafer was baked at 140° C. in air for 30 minutes to dehydrate it. An eyedropper was used to place 1 ml of the $SrTiO_3$ solution described in Example 1 on a wafer as in FIG. 2B with the layers deposited up to and including the platinum bottom electrode 8. The wafer was spun at 5000 RPM for 21 seconds. The wafer was then placed on a hot plate and baked at 250° C. in air for one minute. An eyedropper was used to place 1 ml of the $SrBi_4Ti_4O_{15}$ solution on the wafer and the wafer was spun at 1500 RPM for 21 seconds. The wafer was placed on a hot plate and baked at 250° C. for 1 minute. The steps from using an eyedropper to deposit 1 ml of $SrTiO_3$ solution on the wafer through baking on the hot plate were repeated for another $SrTiO_3$ layer 14. The wafer was then transferred to a diffusion furnace and annealed at 650° C. in an oxygen flow of 5 l/m for 90 minutes. The top layer 16 of 2000 Å platinum was sputtered, a resist was applied, followed by a standard photo mask process, an ion mill etch, an IPC strip and a final contact anneal at 650° C. in an oxygen flow of 5 l/m for 90 minutes. The resulting sample was tested with the results shown in FIGS. 5A through 5C.

FIG. 5A shows the initial hysteresis curve for the $SrTiO_3/SrBi_4Ti_4O_{15}/SrTiO_3$ layered material, and FIG. 5B shows the hysteresis curve after $10^{10}$ cycles. This is clearly a low-fatigue ferroelectric structure, since the hysteresis curve changed only slightly. Moreover, the hysteresis curve is fat and more perpendicular, resulting in a relatively large Pr.

FIG. 5C Shows a graph of 2Prn and 2Prp over $10^{10}$ cycles. This graph is derived from a PUND switching test rather than a hysteresis test. It shows more fatigue than the previous sample, but still the fatigue changes by only about 30% over the entire $10^{10}$ cycles, which is significantly better than the 50% fatigue of the best prior art materials over $10^9$ cycles.

EXAMPLE 3

Strontium Bismuth Tantalate—$SrBi_2Ta_2O_9$

The compounds shown in Table III were measured.

TABLE III

| Compound | FW | g | mmole | Equiv. |
|---|---|---|---|---|
| Tantalum ethoxide | 406.26 | 4.9553 | 12.197 | 2.0000 |
| 2-ethylhex-anoic acid | 144.21 | 8.7995 | 61.019 | 10.006 |
| Strontium | 87.62 | 0.5330 | 6.0831 | 0.9975 |
| 2-ethylhex-anoic acid | 144.21 | 1.7613 | 12.213 | 2.0026 |
| Bismuth 2-ethylhexanoate | (862.99) | 10.525 | 12.196 | 1.9998 |

The strontium was combined with the first measure of 2-ethylhexanoic acid and 80 ml 2-methoxyethanol. The mixture was stirred on low heat of between about 70° C. and 90° C. to hurry the reaction rate. When all the strontium was reacted and the solution had cooled to approximately room temperature, the tantalum ethoxide followed by the second measure of 2-ethylhexanoic acid were added. The mixture was stirred and heated to a maximum temperature of 115° C. to distill out ethanol and water. Then 75 ml xylenes followed by the bismuth 2-ethylhexanoate were added. The solution was stirred and heated with a maximum temperature of about 125° C. until only 60.0 ml of solution remained. The concentration was 0.102 moles of $SrBi_2Ta_2O_9$ per liter. The wafer was baked at 140° C. in air for 30 minutes to dehydrate it. An eyedropper was used to place 1 ml of the $SrBi_2Ta_2O_9$ solution on a wafer as in FIG. 2C with the layers deposited up to and including the platinum bottom electrode 28. The wafer was spun at 1500 RPM for 20 seconds. The wafer was then placed on a hot plate and baked at about 250° C. in air for three minutes. The steps from using an eyedropper to deposit solution on the wafer through baking on the hot plate were repeated for another layer. The wafer was then transferred to a diffusion furnace and annealed at 750° C. in an oxygen flow of 5 l/m for 2 hours. The top layer 32 of 2000 Å platinum was sputtered, a resist was applied, followed by a standard photo mask process, an ion mill etch, an IPC strip and a final contact anneal at 750° C. in an oxygen flow of 5 l/m for 30 minutes. The resulting sample was tested with the results shown in FIGS. 6A through 6C.

Figure 6A:
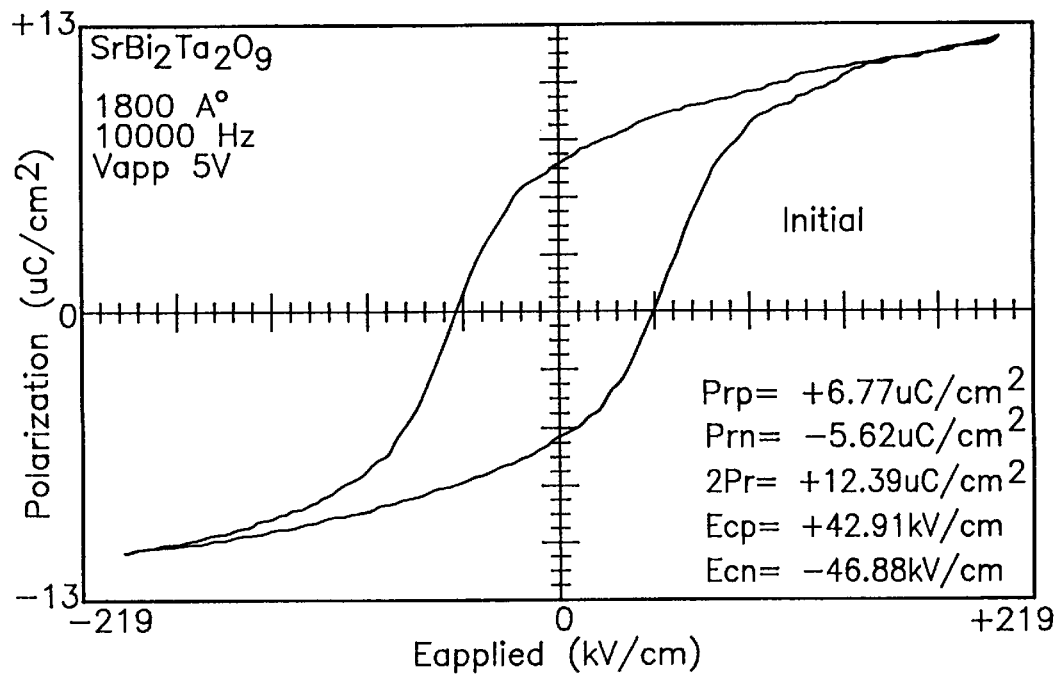
FIG. 6A is an initial hysteresis curve for a ferroelectric capacitor as shown in FIG. 2C utilizing $SrBi_2Ta_2O_9$ as the ferroelectric material.
Figure 6B:
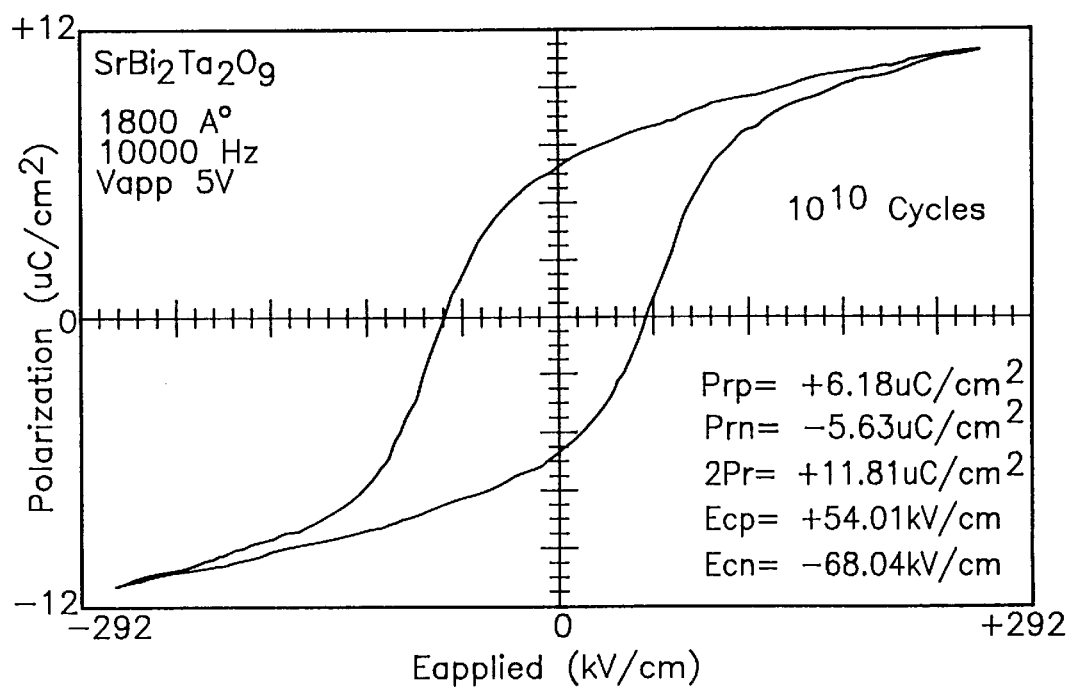
FIG. 6B is the hysteresis curve for the same sample as used to generate the curve of FIG. 6A, except after $10^{10}$ cycles.
Figure 6C:
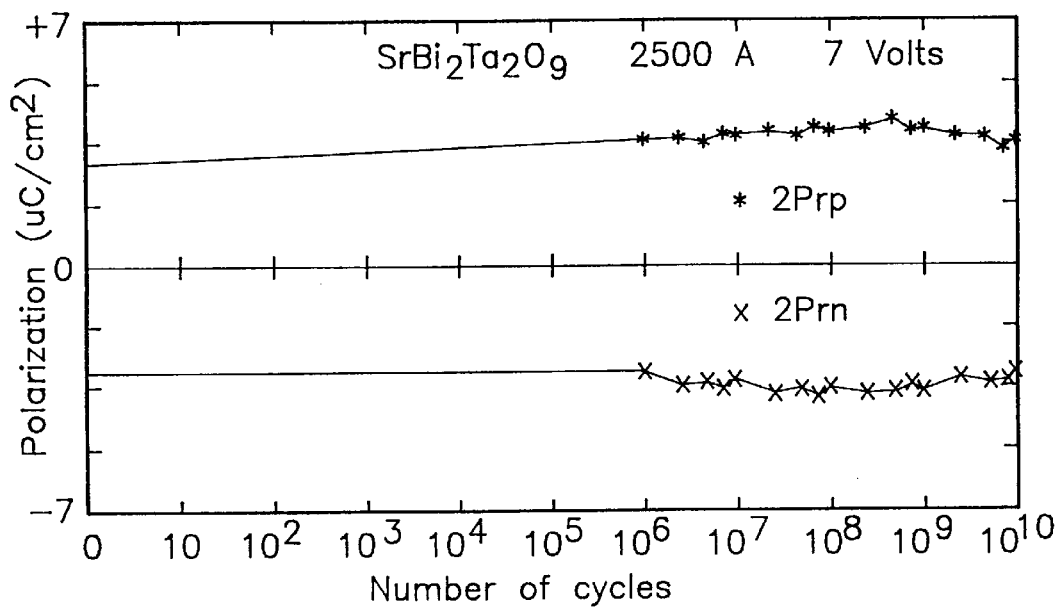
FIG. 6C is 2Prp and 2Prn versus number of switching cycles for the same sample used in FIGS. 6A and 6B.

FIG. 6A shows an initial hysteresis curve for the $SrBi_2Ta_2O_9$ sample while FIG. 6B shows the hysteresis curve for the same sample after $10^{10}$ cycles. Again there is very little change in the two curves, demonstrating low-fatigue. Moreover, the curves are very boxy and vertical, yielding large Pr. FIG. 6C shows a graph of 2Prp and 2Prn over $10^{10}$ cycles, again derived from a PUND switching test. This curve shows negligible fatigue over the entire $10^{10}$ cycles. These results are phenomenal when compared to the prior art materials, and indicate that this layered superlattice material would last indefinitely in a ferroelectric switching memory.

Figure 6D:
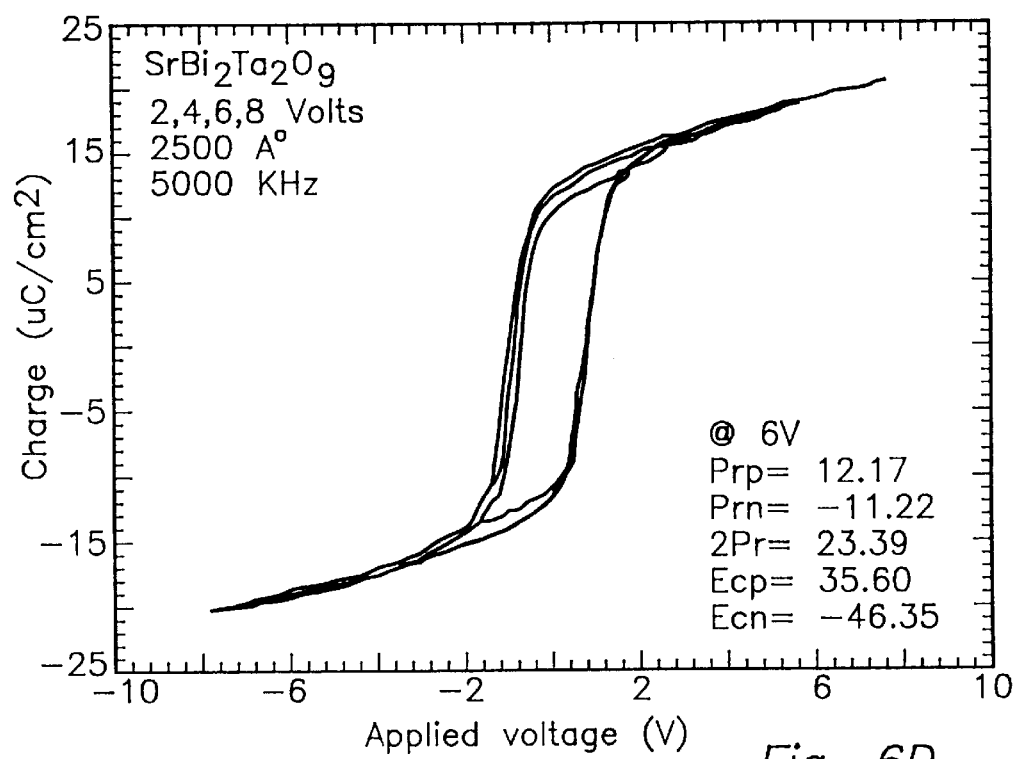
FIG. 6D is shows hysteresis curves at 2, 4, 6, and 8 volts for another ferroelectric capacitor as shown in FIG. 2C also utilizing $SrBi_2Ta_2O_9$ as the ferroelectric material.

FIG. 6D shows hysteresis curves at 2, 4, 6, and 8 volts for another sample capacitor of the type shown in FIG. 2C utilizing strontium bismuth tantalate (SrBi$_2$Ta$_2$O$_9$) as the ferroelectric material. This capacitor was made in a process as described in Example 3 above, except that 10% excess bismuth was used in the precursor solution and other process parameters were more carefully controlled to ensure better stoichiometry. These hysteresis curves are even boxier and more vertical than the curves of 6A and 6B, indicating even better ferroelectric switching performance. Moreover, the hysteresis curves for the four different voltages all nearly overlap, with the curves for the higher voltages simply extending out further along approximately the same line. This feature holds great significance for practical integrated circuit devices, since it means that even if the voltage changes substantially from specifications, as often happens in the real world, the device performance will not change significantly. The value of 2Pr for this sample was 23.39!

Figure 6E:
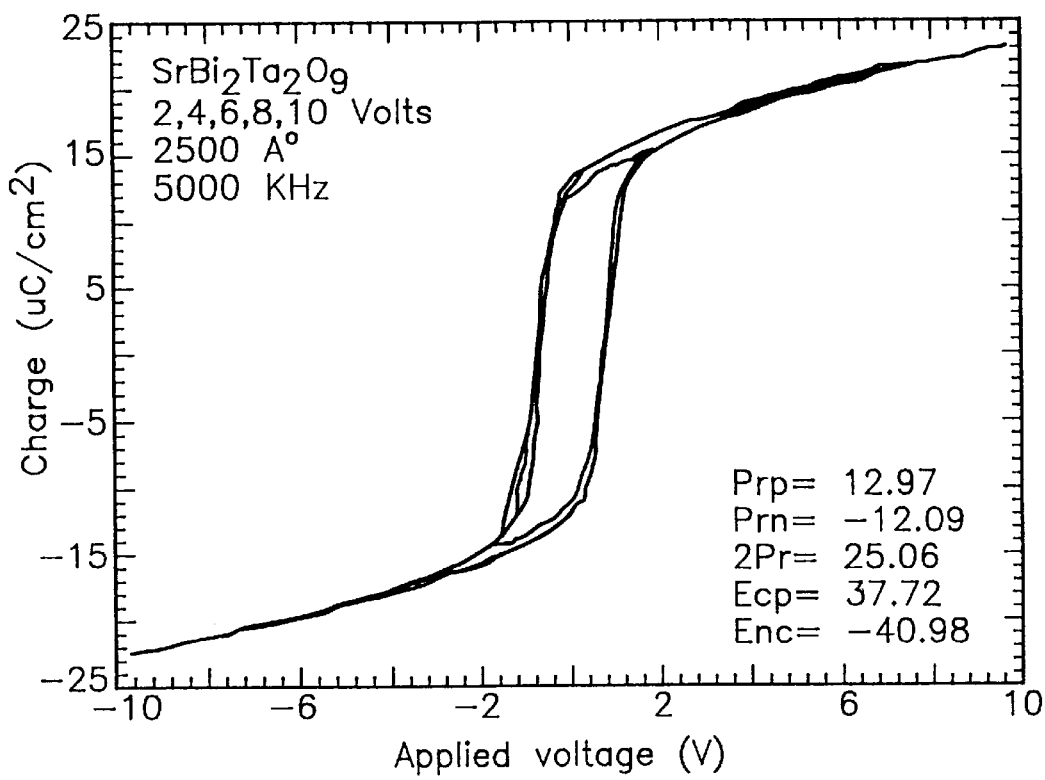
FIG. 6E shows hysteresis curves at 2, 4, 6, 8, and 10 volts for a further ferroelectric capacitor as shown in FIG. 2C also utilizing $SrBi_2Ta_2O_9$ as the ferroelectric material.

FIG. 6E shows hysteresis curves at 2, 4, 6, 8, and 10 volts for a further sample capacitor of the type shown in FIG. 2C utilizing strontium bismuth tantalate (SrBi$_2$Ta$_2$O$_9$) as the ferroelectric material. Again, this capacitor was made in a process as described in Example 3 above, except that 10% excess bismuth was used in the precursor solution and other process parameters were carefully controlled to ensure better stoichiometry. This hysteresis curves are boxier and more vertical than the previous curves, and the hysteresis curves for the five different voltages all overlap even more so. The value of 2Pr was 25.06, the best obtained to date for this material. This value of 2Pr is more than 4 times the value of Ps for strontium bismuth tantalate given in Appendix F on page 625 in the Lines and Glass reference given above!

EXAMPLE 4

Strontium Bismuth Niobate—SrBi$_2$Nb$_2$O$_9$

The compounds shown in Table IV were measured.

TABLE IV

| Compound | FW | g | mmole | Equiv. |
|---|---|---|---|---|
| strontium | 87.62 | 0.5625 | 6.4198 | 1.0000 |
| 2-ethylhex-anoic acid | 144.21 | 2.0940 | 14.520 | 2.2618 |
| bismuth 2-ethylhexanoate | (862.99) | 11.079 | 12.838 | 1.9998 |
| niobium butoxide | 458.48 | 5.8862 | 12.839 | 1.9999 |
| 2-ethylhex-anoic acid | 144.21 | 9.2911 | 64.428 | 10.036 |

The strontium was placed in 30 ml 2-methoxyethanol. The first measure of 2-ethylhexanoic acid was added and was allowed to react completely. The bismuth 2-ethylhexanoate was added, followed by 35 ml xylenes. The niobium butoxide and second measure of 2-ethylhexanoic acid was added, followed by 40 ml of xylenes. The mixture was heated and stirred, with a maximum temperature of 123° C., until all the butanol, water, and 2-methoxyethanol were removed. The final volume was 63 ml, and the final mass was 57.475 g. The concentration was 0.102 moles of SrBi$_2$Nb$_2$O$_9$ $_{per}$ liter, or 0.1117 mmoles of SrBi$_2$Nb$_2$O$_9$ per gram of solution. The wafer was baked at 140° C. in air for 30 minutes to dehydrate it. An eyedropper was used to place 1 ml of the SrBi$_2$Nb$_2$O$_9$ solution on a wafer as in FIG. 2C with the layers deposited up to and including the platinum bottom electrode 28. The wafer was spun at 1000 RPM for 20 seconds. The wafer was then placed on a hot plate and baked at 230° C. in air for two minutes and 30 seconds. The steps from using an eyedropper to deposit the SrBi$_2$Nb$_2$O$_9$ solution on the wafer through baking on the hot plate were repeated for another layer. The wafer was then transferred to a diffusion furnace and annealed at 750° C. in an oxygen flow of 5 l/m for 40 minutes. The top layer 32 of 2000 Å platinum was sputtered, a negative resist was applied followed by a standard photo mask process, an ion mill etch, an IPC strip and a final contact anneal at 750° C. in an oxygen flow of 5 l/m for 30 minutes. The resulting sample was tested with the results shown in FIGS. 7A through 7E.

Figure 7A:
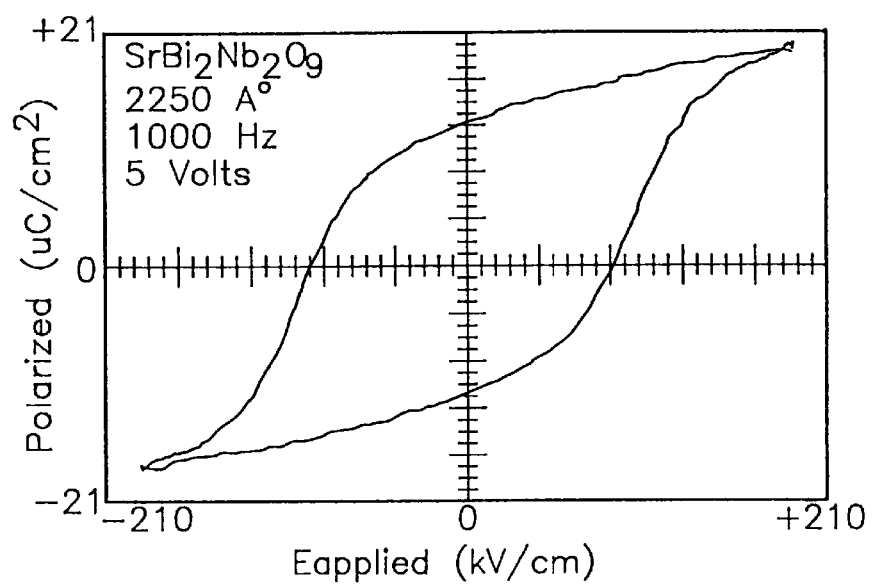
FIG. 7A is a hysteresis curve for a ferroelectric capacitor as shown in FIG. 2C utilizing $SrBi_2Nb_2O_9$ as the ferroelectric material and with the maximum applied voltage of 5 volts.
Figure 7B:
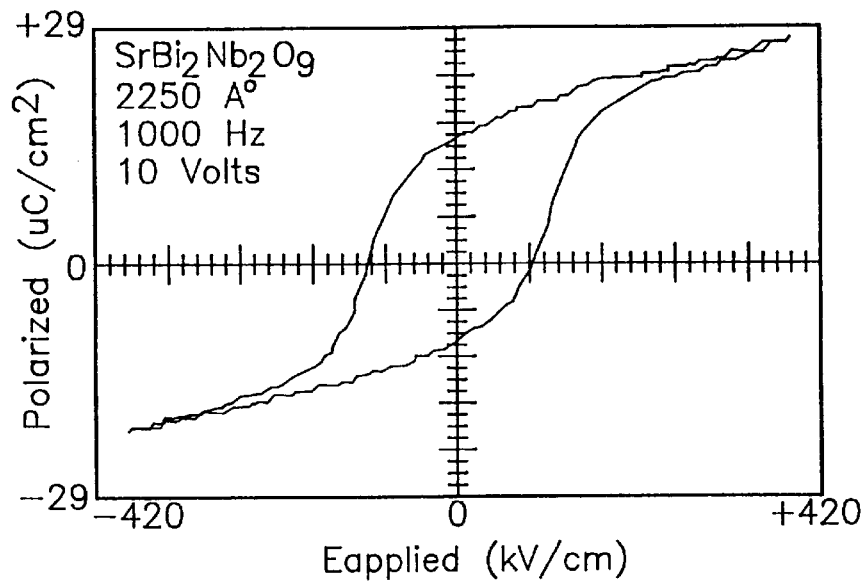
FIG. 7B is a hysteresis curve for the sample of FIG. 7A with a maximum applied voltage of 10 volts.
Figure 7C:
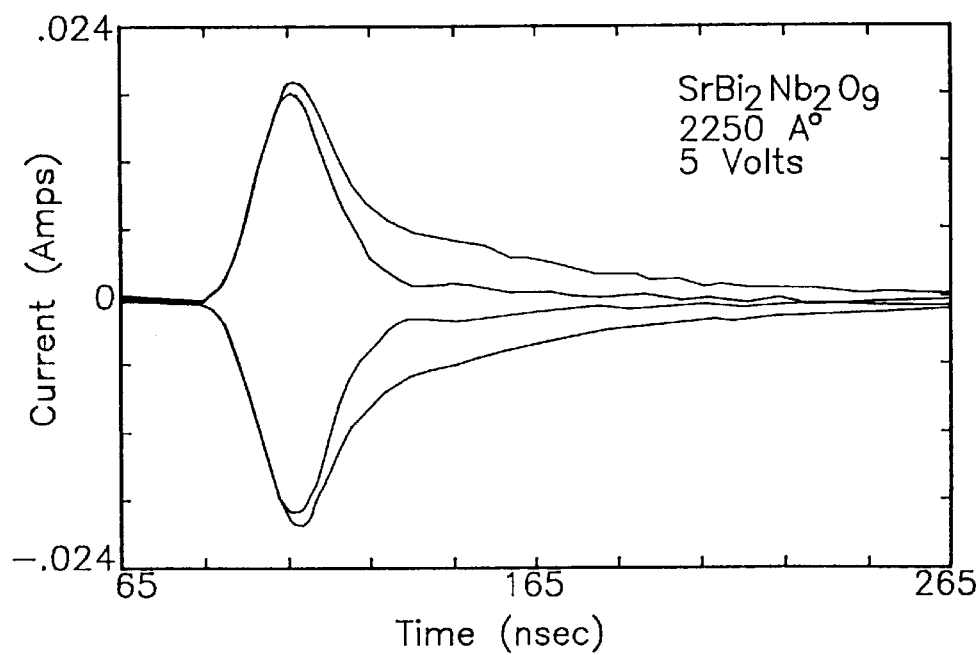
FIG. 7C is graph of a PUND switching pulse measurement for for the sample of FIG. 7A with a pulse voltage of 5 volts.
Figure 7D:
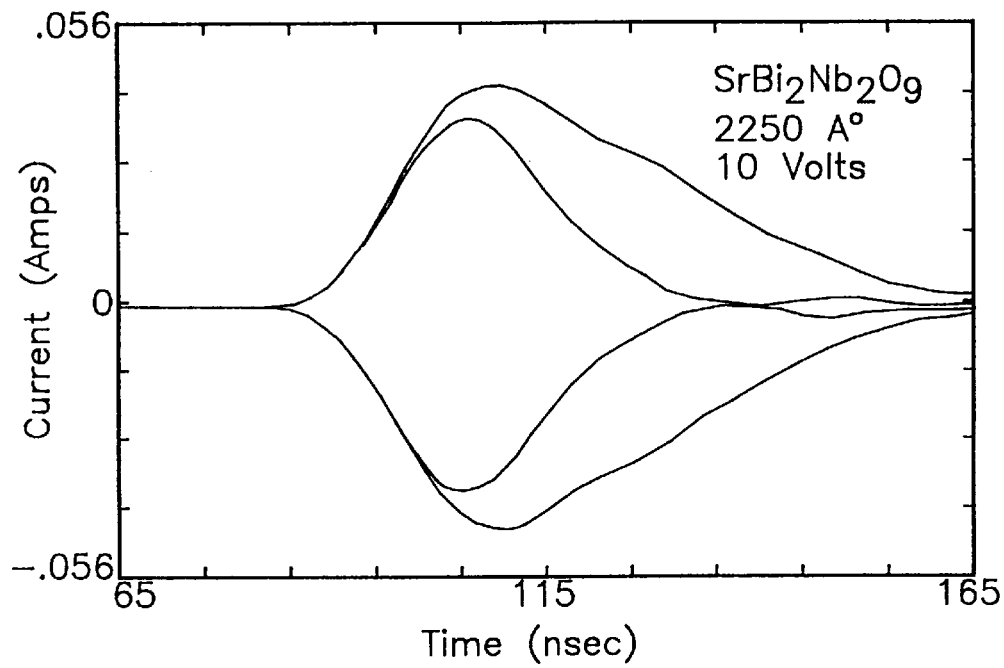
FIG. 7D is a PUND switching pulse measurement for the sample of FIG. 7A with a pulse voltage of 10 volts.
Figure 7E:
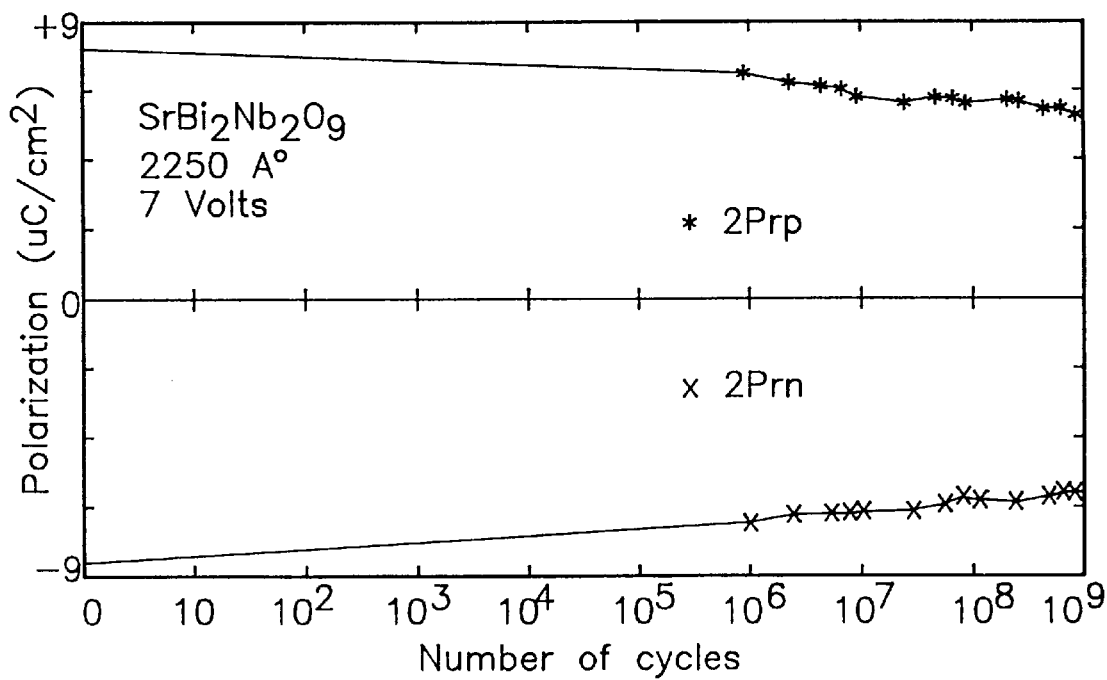
FIG. 7E is a graph of 2Prp and 2Prn versus number of switching cycles for the sample of FIG. 7A.

FIG. 7A is a graph of the hysteresis curve for SrBi$_2$Nb$_2$O$_9$ at five volts and FIG. 7B is a graph of the hysteresis curve at 10 volts. Both show the boxy, vertical, structures that are highly desirable in ferroelectrics since they indicate high polarizability. Further, the Pund switching curves shown in FIG. 7C for 5 volts and 7d for 10 volts show good differentiation in the switching pulses (the pulses that go most positive and negative) and the dielectric charge pulses (the other two pulses). Moreover, the current falls quickly into the background noise; that is, although there is a long tail on the pulses, the tail is down in the noise. This quick fall off indicates that the material is a relatively "fast" switching material. FIG. 7E is a graph of 2Prp and 2Prn versus number of switching cycles. This shows much lower fatigue than prior art materials, but not as low as that for strontium bismuth tantalate (SrBi$_2$Ta$_2$O$_9$) in FIG. 6C, although it is possible that the difference in the fatigue is due to less than optimum processing on this particular sample.

EXAMPLE 5

Strontium Bismuth Tantalum Niobate—SrBi$_2$TaNbO$_9$

The compounds shown in Table V were measured.

TABLE V

| Compound | FW | g | mmole | Equiv. |
|---|---|---|---|---|
| strontium | 87.62 | 0.5821 | 6.6435 | 1.0001 |
| 2-ethylhex-anoic acid | 144.21 | 1.9770 | 13.709 | 2.0635 |
| bismuth 2-ethylhexanoate | (862.99) | 11.4687 | 13.289 | 2.0005 |
| tantalum butoxide | 546.522 | 3.6303 | 6.6426 | 1.0000 |
| niobium butoxide | 458.48 | 3.0456 | 6.6428 | 1.0000 |
| 2-ethylhex-anoic acid | 144.21 | 9.6081 | 66.626 | 10.030 |

The strontium was placed in 30 ml of 2-methoxyethanol and the first measure of 2-ethylhexanoic acid was added and allowed to react completely. Then the bismuth 2-ethylhexanoate was added followed by 40 ml xylenes. the tantalum butoxide and the niobium butoxide were added, followed by the second portion of the 2-ethylhexanoic acid and 40 ml additional xylenes. The mixture was stirred and heated to a maximum temperature of 122° C. to distill out all water, butanol and 2-methoxyethanol until 65 ml of solution remained. The concentration was 0.102 moles of SrBi$_2$TaNbO$_9$ per liter. The wafer was baked at 140° C. in air for 30 minutes to dehydrate it. An eyedropper was used to place 1 ml of the SrBi$_2$TaNbO$_9$ solution on a wafer as in FIG. 2C with the layers deposited up to and including the platinum bottom electrode 28. The wafer was spun at 1000 RPM for 20 seconds. The wafer was then placed on a hot plate and baked at 250° C. in air for five minutes. The wafer was placed in a rapid thermal processor and annealed for 30 seconds in an oxygen flow of 3 l/m at a temperature of 700°

C. with a 125°/sec ramp rate. The steps from using an eyedropper to place $SrBi_2TaNbO_9$ solution on the wafer through the RTP were repeated for another layer. The wafer was then transferred to a diffusion furnace and annealed at 750° C. in an oxygen flow of 5 l/m for 2 hours. A top layer 32 of 2000 Å platinum was sputtered, a positive resist was applied, followed by a standard photo mask process, an ion mill etch, an IPC strip and a final contact anneal at 750° C. in an oxygen flow of 5 l/m for 30 minutes. The resulting sample was tested with the results shown in FIGS. 8A through 8F.

Figure 8A:
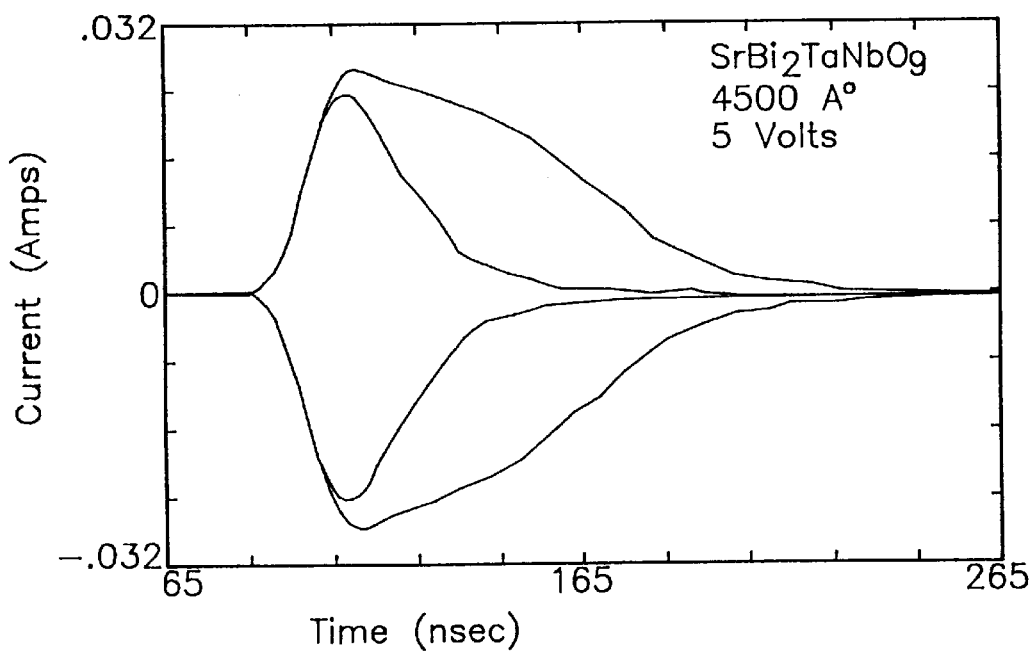
FIGS. 8A and 8B are PUND switching measurements taken of a ferroelectric capacitor as shown in FIG. 2C utilizing $SrBi_2TaNbO_9$ as the ferroelectric material with pulses of 5 volts and 10 volts respectively.
Figure 8B:
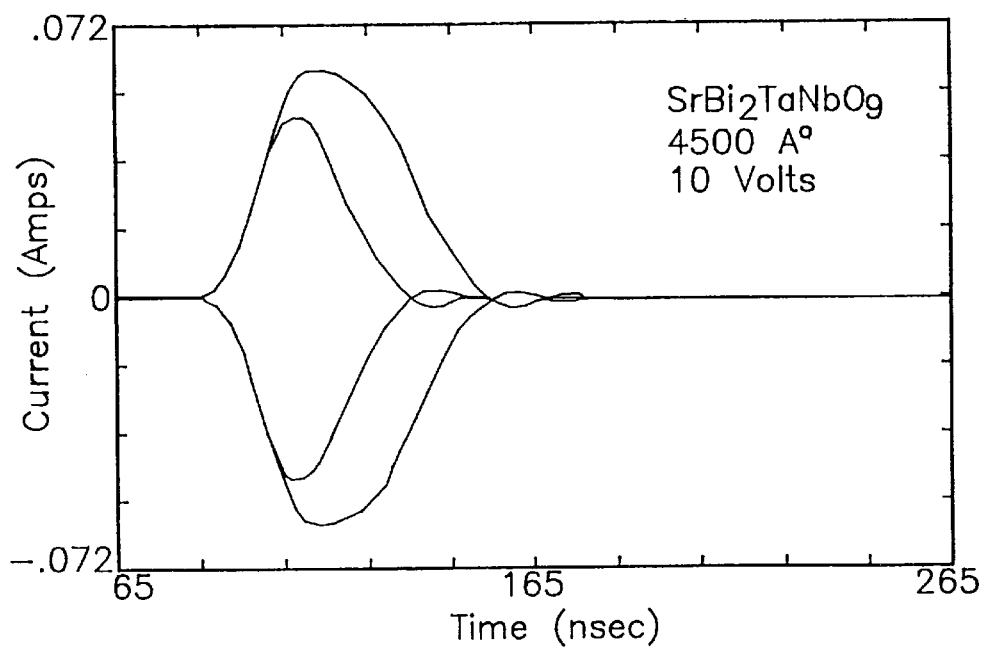
Figure 8C:
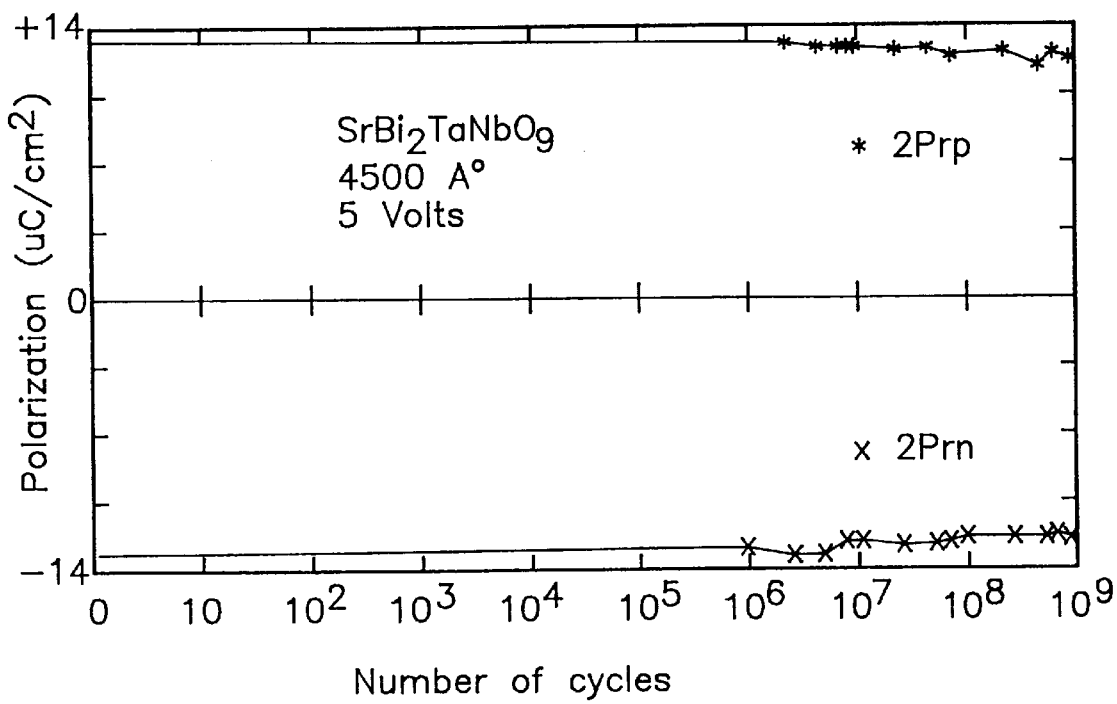
FIG. 8C is a graph of 2Prp and 2Prn versus number of switching cycles for the sample of FIGS. 8A and 8B.
Figure 8D:
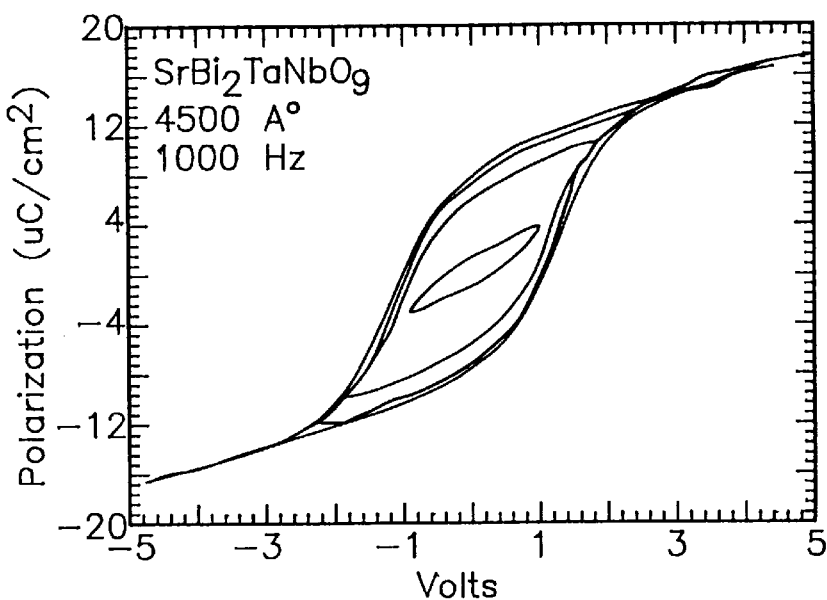
FIG. 8D shows hysteresis curves at five different voltages for the sample of FIGS. 8A through 8C.
Figure 8E:
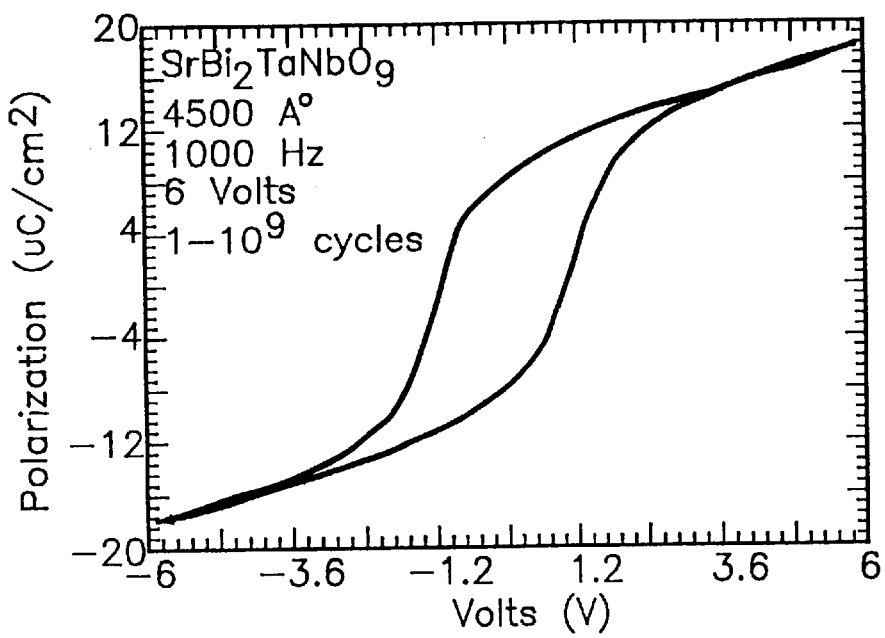
FIG. 8E shows hysteresis measurements performed on the sample of FIGS. 8A through 8D at twenty different data points over approximately $10^{10}$ hysteresis cycles.
Figure 8F:
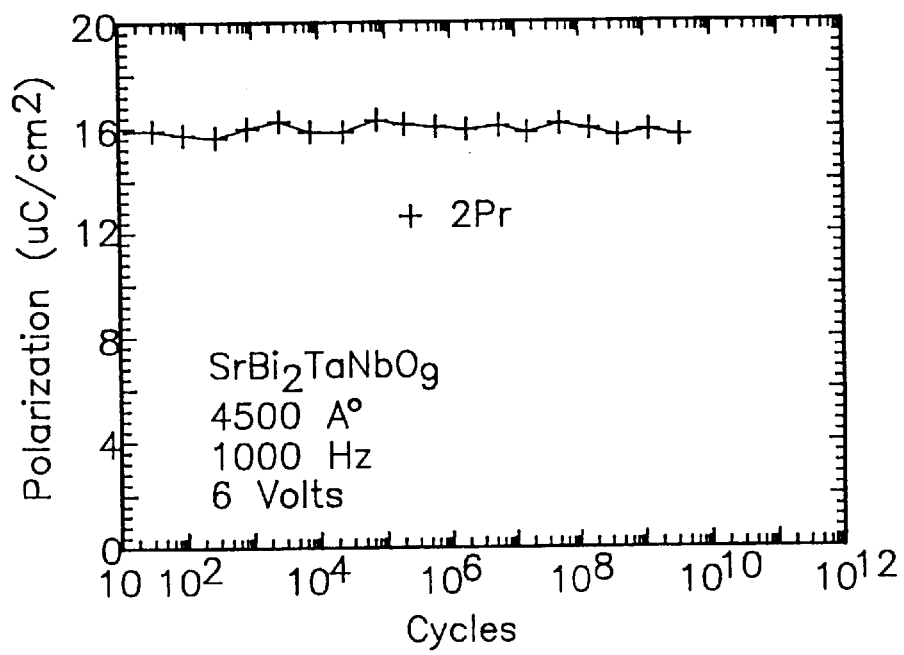
FIG. 8F is a graph of 2Pr versus number of cycles taken from the hysteresis curves of FIG. 8E.
Figure 8G:
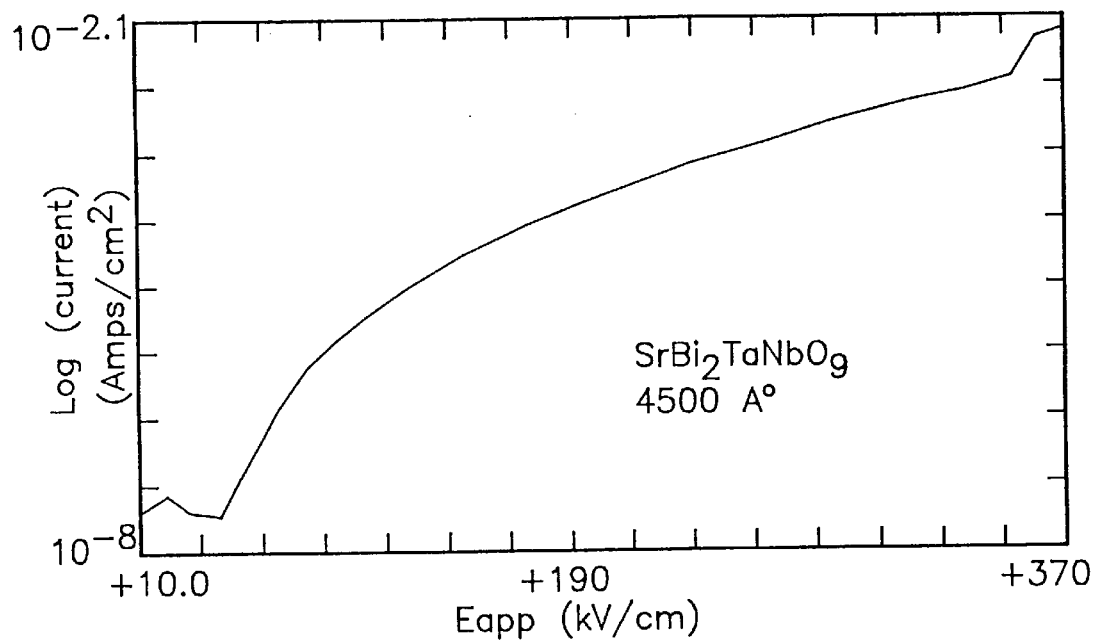
FIG. 8G is graph of the logarithm of the DC leakage current versus applied field for the sample of FIGS. 8A through 8F.

The first thing to note is that $SrBi_2TaNbO_9$ is a material with two B-site elements, tantalum and niobium. FIG. 8a shows the PUND switching test results for $SrBi_2TaNbO_9$ at 5 volts and FIG. 8B shows the PUND results at 10 volts. The results at 5 volts are very good, showing good differentiation between the switching curves and dielectric curves and a relatively fast fall off into the noise level indicating fast switching. The results for 10 volts are excellent, again showing good differentiation, and almost no tail, indicating very fast switching. One immediately thinks that if this material has low fatigue, it would be an excellent material for a ferroelectric switching application, such as a memory. FIG. 8C shows the curves of 2Prp and 2Prn versus switching cycles. While this shows a little more fatigue than the same curves for $SrBi_2Ta_2O_9$ (FIG. 6C), still the results must be considered to be phenomenal as compared to prior art materials. There is only about 5% fatigue over $10^9$ cycles, which is ten times better than even the best materials in the prior art. See, for example, FIG. 12 and the discussion thereof on page 19 of the article "Process Optimization and Characterization of Device Worthy Sol-Gel Based PZT for Ferroelectric Memories" referenced in the BACKGROUND OF THE INVENTION section above. The results show that $SrBi_2TaNbO_9$ should provide non-volatile ferroelectric memories that last indefinitely. Moreover, none of the elements in the compound are elements that cause compatibility problems with conventional integrated circuit technologies. FIG. 8D shows the superimposed hysteresis curves for $SrBi_2TaNbO_9$ at 1 (the smallest curve) 2, 3, 4, and 5 (the largest curve) volts. The curves at 2, 3, 4, and 5 volts all are boxy and vertical, with good polarizability. FIG. 8E is a graph in which the hysteresis curve at 6 volts was repeated on the same graph paper at 10, 100, 1000, switching cycles etc. up to $10^9$ switching cycles. The curve follows almost exactly the same line, again indicating an fatigue that was inconceivable in the prior art. FIG. 8F shows a graph of 2Pr versus number of hysteresis cycles taken from the same data as the curves of FIG. 8E, but going out to $10^{10}$ cycles. Again, there is almost no change over the entire $10^{10}$ cycles. It is noted that the voltages of the curves of FIGS. 8A through 8F are all within the range of voltages that are common in integrated circuits. The material shows excellent performance at 5 volts, the most common voltage used in integrated circuits, and has good performance all the way down to 2 volts, which shows promise of integrated circuits that can operate at even lower voltages than conventional circuits, which would result in low current consumption, long battery life in circuits that run on batteries, and enhanced reliability of circuit components. FIG. 8G is a graph of applied electric field versus the log of the measured current, commonly referred to as a leakage current curve, for $SrBi_2TaNbO_9$. The curve shows that the leakage current is extremely small, of the order of $10^{-8}$ amps/cm$^2$ up to about 2 volts across a 4500 Å thickness, then increases relatively steeply. The part of the curve from 10 to 190 kV/cm represents voltages of from 0.45 volts to 8.55 volts across the 4500 Å sample, about the range of voltages found in a conventional integrated circuit. At these voltages the leakage current remains below $10^{-5}$ amps/cm$^2$, which indicates that the material should not have leakage current problems in an integrated circuit operating at standard voltages.

EXAMPLE 6

Barium Bismuth Tantalate—$BaBi_2Ta_2O_9$

The compounds shown in Table VI were measured.

TABLE VI

| Compound | FW | g | mmole | Equiv. |
| --- | --- | --- | --- | --- |
| barium | 137.327 | 0.9323 | 6.7889 | 1.0000 |
| 2-ethylhexanoic acid | 144.21 | 1.9733 | 13.684 | 2.0156 |
| bismuth 2-ethylhexanoate | (862.99) | 11.717 | 13.577 | 1.9999 |
| tantalum butoxide | 546.522 | 7.4211 | 13.579 | 2.0002 |
| 2-ethylhexanoic acid | 144.21 | 9.9216 | 68.800 | 10.134 |

The barium was placed in 40 ml of 2-methoxyethanol and 20 ml of toluene, to slow the reaction, and the first measure of 2-ethylhexanoic acid were added and allowed to react completely. Then the bismuth 2-ethylhexanoate was added followed by 40 ml xylenes. The solution was stirred and heated to a maximum temperature of about 123° C. to distill out water, the toluene and the 2-methoxyethanol. The solution was allowed to cool to room temperature, then the tantalum butoxide was added, followed by the second portion of the 2-ethylhexanoic acid and 40 ml additional xylenes. The mixture was heated to a temperature of about 123° C. while stirring to distill out the butanol until 66 ml of solution remained. The concentration was 0.103 moles of $BaBi_2Ta_2O_9$ per liter. The wafer was baked at 140° C. in air for 30 minutes to dehydrate it. An eyedropper was used to place 1 ml of the $BaBi_2Ta_2O_9$ solution on a wafer as in FIG. 2C with the layers deposited up to and including the platinum bottom electrode 28. The wafer was spun at 1000 RPM for 20 seconds. The wafer was then placed on a hot plate and baked at 250° C. in air for five minutes. The wafer was placed in a rapid thermal processor and annealed for 30 seconds in an oxygen flow of 3 l/m at a temperature of 700° C. with a 125°/sec ramp rate. The steps from using an eyedropper to place $BaBi_2Ta_2O_9$ solution on the spinner to the RTP were repeated for another layer. The wafer was then transferred to a diffusion furnace and annealed at 750° C. in an oxygen flow of 5 l/m for 2 hours. A top layer 32 of 2000 Å platinum was sputtered, a positive resist was applied, followed by a standard photo mask process, an ion mill etch, an IPC strip and a final contact anneal at 750° C. in an oxygen flow of 5 l/m for 30 minutes. The resulting sample was tested with the results shown in FIG. 9.

The $BaBi_2Ta_2O_9$ was not a switching ferroelectric, but was a paraelectric with a dielectric constant of 166 at 1 megahertz. This is a very high dielectric constant as compared to the dielectric constant of 3.9 for silicon dioxide, the most commonly used dielectric in integrated circuits. FIG. 9 shows the leakage current curve for $BaBi_2Ta_2O_9$. At low voltages, the leakage current is negligible, of the order of $10^{-10}$ amps/cm$^2$. Over the range of voltages uses in conventional integrated circuits, i.e. 1–10 volts, the leakage current across the 2400 Å sample remains below about $10^{-8}$ amps/cm$^2$, which is still very small. The thickness of this sample is about the same thickness generally used for dielectrics in conventional integrated circuits. These results show that this material will be an excellent high dielectric material in integrated circuits. Moreover, none of the elements of which the material is composed create compatibility problems with conventional integrated circuit materials. In addition $BaBi_2Ta_2O_9$ should be much more resistant to radiation damage than conventional dielectrics because, except for the oxygen, the elements out of which is compounded are heavier than the elements such as silicon and nitrogen out of which conventional integrated circuit dielectrics are composed.

EXAMPLE 7

Lead Bismuth Tantalate—$PbBi_2Ta_2O_9$

The compounds shown in Table VII were measured.

TABLE VII

| Compound | FW | g | mmole | Equiv. |
|---|---|---|---|---|
| Lead 2-ethyl-hexanoate in xylenes | (1263.6) | 16.691 | 13.209 | 1.1000 |
| bismuth 2-ethylhexanoate | (753.35) | 18.095 | 24.019 | 2.0002 |
| tantalum butoxide | 546.52 | 13.126 | 24.017 | 2.0001 |
| 2-ethylhex-anoic acid | 144.21 | 17.967 | 124.59 | 10.375 |

The lead 2-ethylhexanoate in xylenes previously prepared stock solution and the bismuth 2-ethylhexanoate were combined, followed by 40 ml xylenes. Then the tantalum butoxide was added, followed by the 2-ethylhexanoic acid. The mixture was stirred on low heat of between about 70° C. and 90° C. for four hours, then raised to a maximum temperature of 114° C. to distill out the butanol until 66 ml of solution remained. The concentration was 0.172 moles of $PbBi_2Ta_2O9$ per liter with 10% excess lead. The wafer was baked at 140° C. in air for 30 minutes to dehydrate it. An eyedropper was used to place 1 ml of the $PbBi_2Ta_2O_9$ solution on a wafer as in FIG. 2C with the layers deposited up to and including the platinum bottom electrode 28. The wafer was spun at 1000 RPM for 20 seconds. The wafer was then placed on a hot plate and baked at 375° C. in air for two and a half minutes. The steps from using an eyedropper to place the $PbBi_2Ta_2O_9$ solution on the wafer through baking were repeated for another layer. The wafer was then transferred to a diffusion furnace and annealed at 750° C. in an oxygen flow of 5 l/m for 90 minutes. A top layer 32 of 2000 Å platinum was sputtered, a negative resist was applied followed by a standard photo mask process, an ion mill etch, an IPC strip and a final contact anneal at 750° C. in an oxygen flow of 5 l/m for 30 minutes. The sample was tested with the results shown in FIG. 10.

FIG. 10 is a leakage current graph for an approximately 2500 Å sample of $PbBi_2Ta_2O_9$. This material is of particular interest because the presence of lead makes it extremely resistant to radiation damage. The dielectric constant is 114 at 1 megahertz, which is smaller than that of $BaBi_2Ta_2O_9$, but still 30 to 40 times the dielectric constant of conventional semiconductor dielectrics. The leakage current is higher, but still excellent within the range of voltages common in integrated circuits. The elements from which the material is compounded are also relatively compatible with conventional integrated circuit materials.

EXAMPLE 8

Barium Bismuth Niobate—$BaBi_2Nb_2O_9$

The compounds shown in Table VIII were measured.

TABLE VIII

| Compound | FW | g | mmole | Equiv. |
|---|---|---|---|---|
| barium | 137.327 | 0.9419 | 6.8588 | 1.0000 |
| 2-ethylhex-anoic acid | 144.21 | 2.0538 | | |
| bismuth 2-ethylhexanoate | (862.99) | 11.838 | 13.717 | 1.9999 |
| niobium butoxide | 458.48 | 6.2894 | 13.718 | 2.0001 |
| 2-ethylhex-anoic acid | 144.21 | 10.051 | 69.697 | 10.162 |

The barium was placed in 30 ml of 2-methoxyethanol and 20 ml of toluene, to slow the reaction, and the first measure of 2-ethylhexanoic acid was added and allowed to react completely while stirring. Then the bismuth 2-ethylhexanoate was added followed by 50 ml xylenes. The mixture was stirred and heated with a maximum temperature of 118° C. to distill out all water, the toluene and the 2-methoxyethanol. The solution was allowed to cool to room temperature, then the niobium butoxide was added, followed by the second portion of the 2-ethylhexanoic acid and 30 ml additional xylenes. The mixture was heated to a temperature of 124° C. while stirring to distill out all butanol and water until 68 ml of solution remained. The concentration was 0.101 moles of $BaBi_2Nb_2O_9$ per liter. The wafer was baked at 140° C. in air for 30 minutes to dehydrate it. An eyedropper was used to place 1 ml of the $BaBi_2Nb_2O_9$ solution on a wafer as in FIG. 2C with the layers deposited up to and including the platinum bottom electrode 28. The wafer was spun at 1000 RPM for 20 seconds. The wafer was then placed on a hot plate and baked at 230° C. in air for two minutes. The wafer was placed in a rapid thermal processor and annealed for 30 seconds in an oxygen flow of 3 l/m at temperature of 700° C. with a 125°/sec ramp rate. The steps from using an eyedropper to place $BaBi_2Nb_2O_9$ solution on the wafer to the RTP were repeated for another layer. The wafer was then transferred to a diffusion furnace and annealed at 750° C. in an oxygen flow of 5 l/m for 0.1 hour. A top layer 32 of 2000 Å platinum was sputtered, a negative resist was applied, followed by a standard photo mask process, an ion mill etch, an IPC strip and a final contact anneal at 750° C. in an oxygen flow of 5 l/m for 30 minutes. The resulting sample was tested with the results shown in FIG. 11.

The measured dielectric constant for $BaBi_2Nb_2O_9$ was 103.46 at 1 megahertz. This is lower than the dielectric constants for $BaBi_2Ta_2O_9$ and $PbBi_2Ta_2O_9$, but still very high. FIG. 11 is a graph of the leakage current for $BaBi_2Nb_2O_9$. This leakage current result in again not as excellent as for $BaBi_2Ta_2O_9$ and $PbBi_2Ta_2O_9$, but still is good. Thus this material should be preferable to conventional integrated circuit dielectric materials. Again, this material should be relatively resistant to radiation damage as compared to conventional integrated circuit materials.

5. Discussion of the Ferroelectric Properties of the Layered Superlattice Materials While as a by-product of the ferroelectric research described herein it has been found that the layered superlattice materials have many advantageous properties outside the ferroelectric area, which advantages and properties are also included in the invention, the primary thrust of research and the expected benefit of the new materials is in ferroelectrics. In this section the ferroelectric properties and advantages of the layered superlattice material will be summarized, using strontium bismuth tantalate ($SrBi_2Ta_2O_9$) as an exemplary material.

Figure 16:
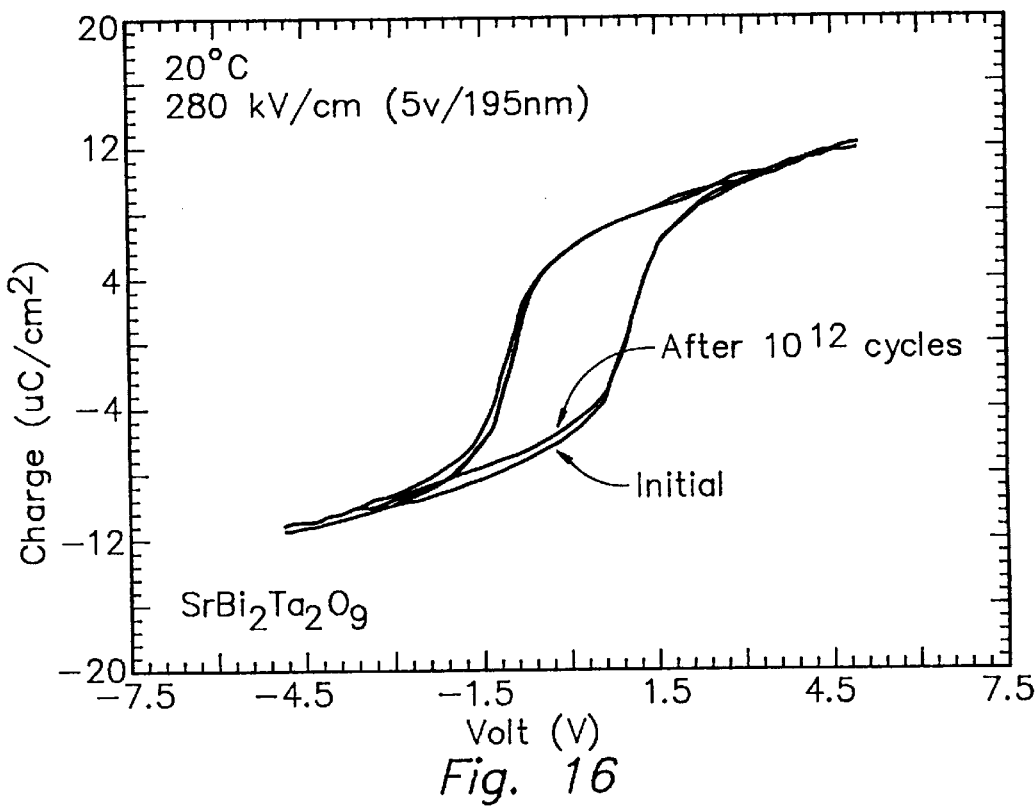
FIG. 16 shows a hysteresis curve for a sample of $SrBi_2Ta_2O_9$ $_{after\ 1012\ cycles}$ superimposed on an initial hysteresis curve for the same sample.
Figure 17:
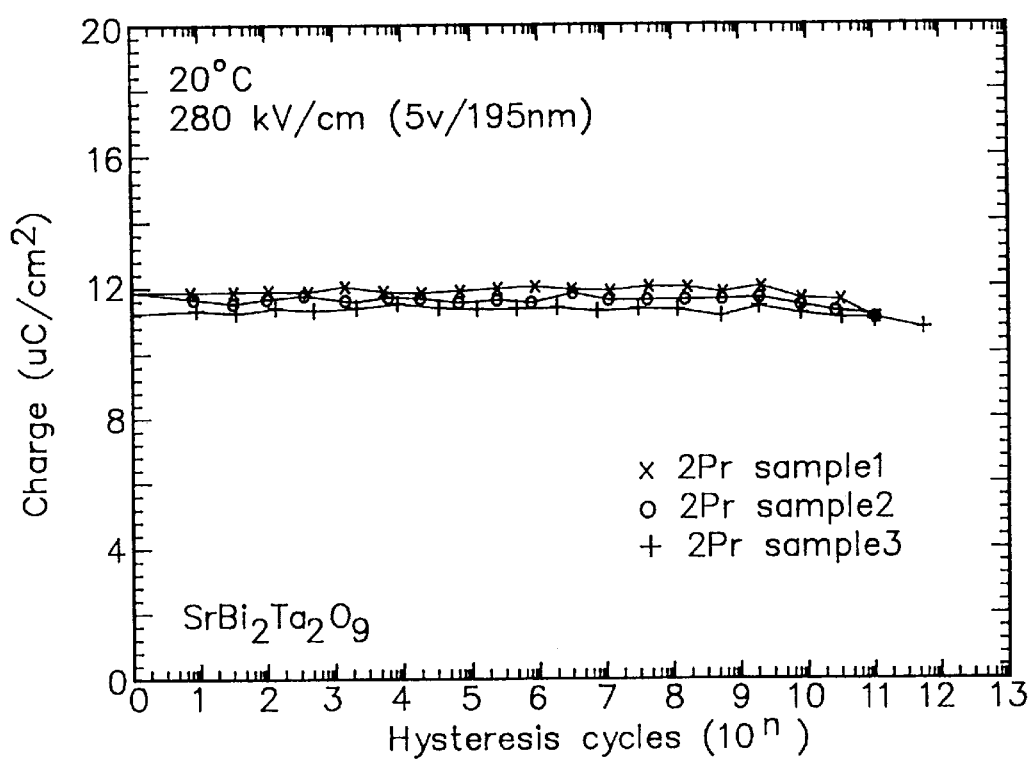
FIG. 17 shows 2PR versus number of hysteresis cycles for three samples of $SrBi_2Ta_2O_9$, with the test for one sample going out to $10^{12}$ cycles.

Turning to FIG. 16, a hysteresis curve for a sample of $SrBi_2Ta_2O_9$ after $10^{12}$ cycles superimposed on an initial hysteresis curve for the same sample is shown. $10^{12}$ cycles is roughly equivalent to device switching 1000 times a second for 25 years. This is far more switching than can be expected for a non-volatile memory cell. The two curves change so little that for about half the loop the curve for $10^{12}$ cycles retraces the initial curve. This is not an isolated, especially good sample. FIG. 17 shows 2Pr versus number of hysteresis cycles for three samples of $SrBi_2Ta_2O_9$, with the curve for one sample going out to $10^{12}$ cycles and the curve for the others going out to over $10^{11}$ cycles. The curves for all three samples are nearly superimposed. It is expected that as experience grows with the fabrication processes, the difference from one sample to the next will become even less. For the best of the prior art materials, PZT, 2Pr decreased more than 50% over only $10^9$ cycles, and varied widely from sample to sample.

Figure 18:
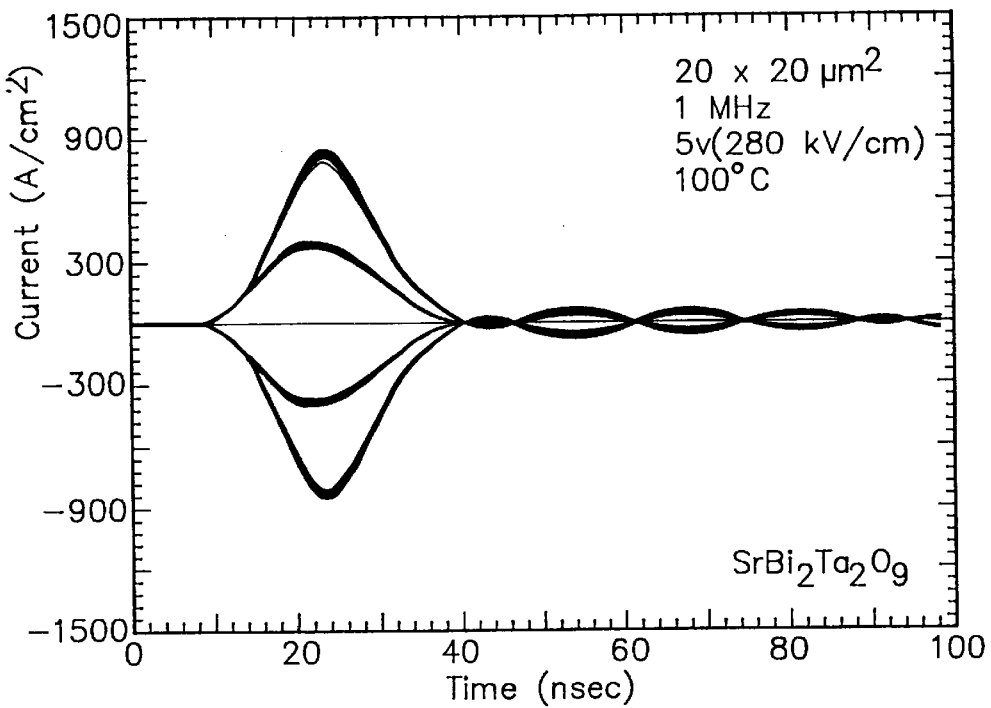
FIG. 18 shows superimposed PUND switching measurements performed on a sample of $SrBi_2Ta_2O_9$ at 17 data points over approximately $10^{10}$ switching cycles at a temperature of 100° C.
Figure 19:
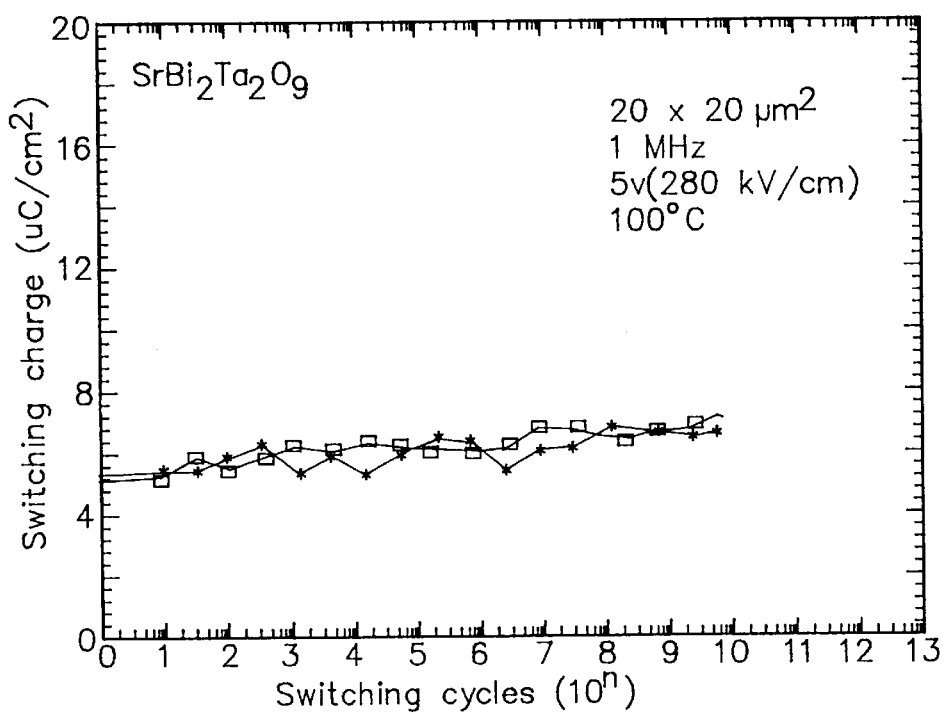
FIG. 19 shows the switching charge versus number of switching cycles for the PUND measurements of FIG. 18.
Figure 20:
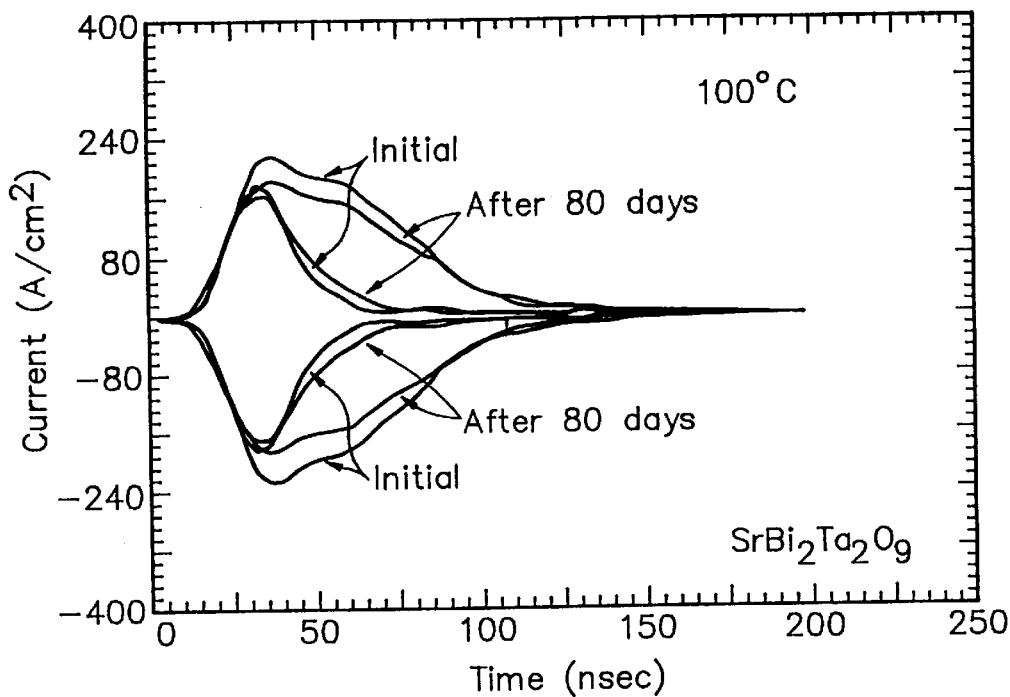
FIG. 20 shows PUND measurements for a sample of $SrBi_2Ta_2O_9$ taken after the sample had retained a polarization charge for 80 days at 100° C. superimposed on the initial PUND measurements for the same sample.
Figure 21:
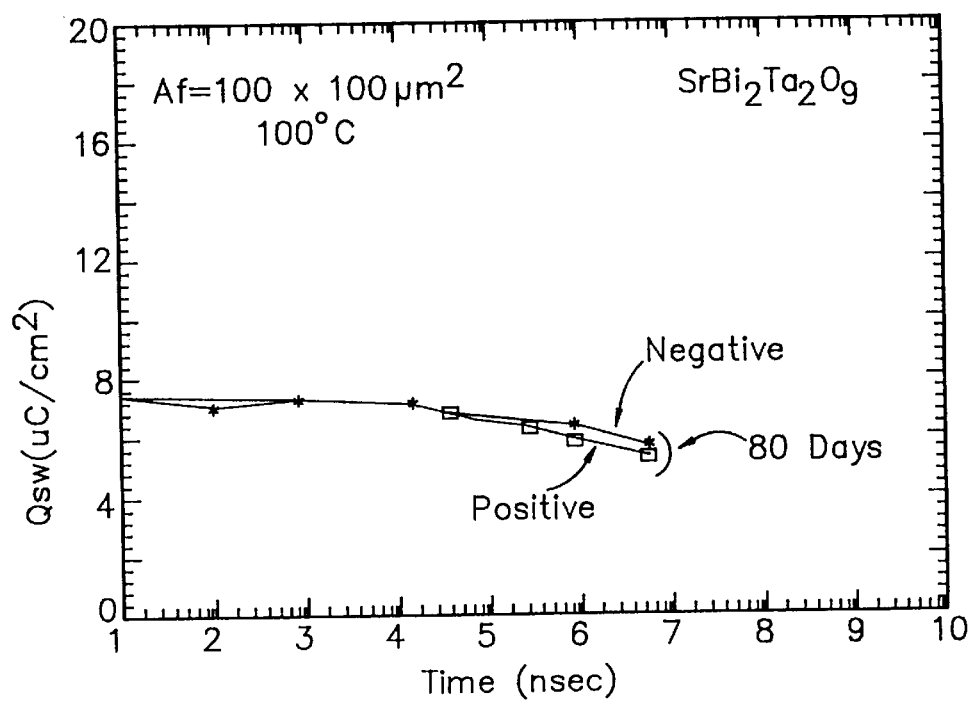
FIG. 21 shows the decay of a switching charge for a positive and negative polarization state for a sample of $SrBi_2Ta_2O_9$ illustrating data retention over an eighty day period at 100° C.

Because of the "shock absorber" feature of the layered superlattice materials, they also can perform under stressful conditions. FIG. 18 shows superimposed PUND switching measurements performed on a sample of $SrBi_2Ta_2O_9$ at 17 data points over approximately $10^{10}$ switching cycles at a temperature of 100° C., and FIG. 19 shows the switching charge versus number of switching cycles for the PUND measurements of FIG. 18. The PUND measurements are so consistent that the line of the curve merely grows thicker, without disturbing any of the features of the curve. FIG. 20 shows PUND measurements for a sample of $SrBi_2Ta_2O_9$ taken after the sample had retained a polarization charge for 80 days at 100° C. superimposed on the initial PUND measurements for the same sample. While there was significant change, the percentage change was relatively constant over the entire curves so that the shape of the curves stayed the same. The switching current still remains well within the range sufficient to operate a switching device. FIG. 21 shows the decay of a switching charge for the positive and negative polarization state for samples of $SrBi_2Ta_2O_9$ illustrating data retention over an eighty day period at 100° C. The graph was made by negatively polarizing, i.e. programming, seven samples of $SrBi_2Ta_2O_9$ and positively polarizing seven other samples, then placing them in a storage container and holding them at 100° C. About every ten days to twelve days one of the negatively charged samples and one of the positively charged samples were removed from storage and the switching charge measured. Thus the curve not only shows the retention of programming for eighty days at 100° C., but also shows consistency between samples. There clearly was sufficient charge remaining after 80 days to operate a memory function.

Figure 22A:
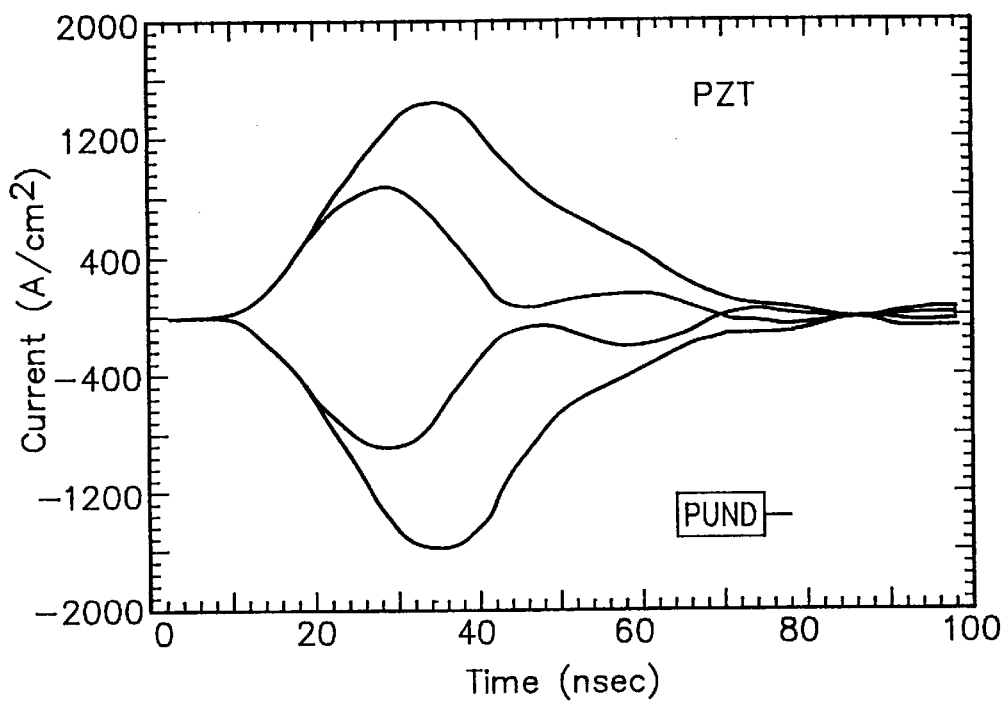
FIG. 22A shows the results of an initial PUND measurement for a sample of PZT prior art material.
Figure 22B:
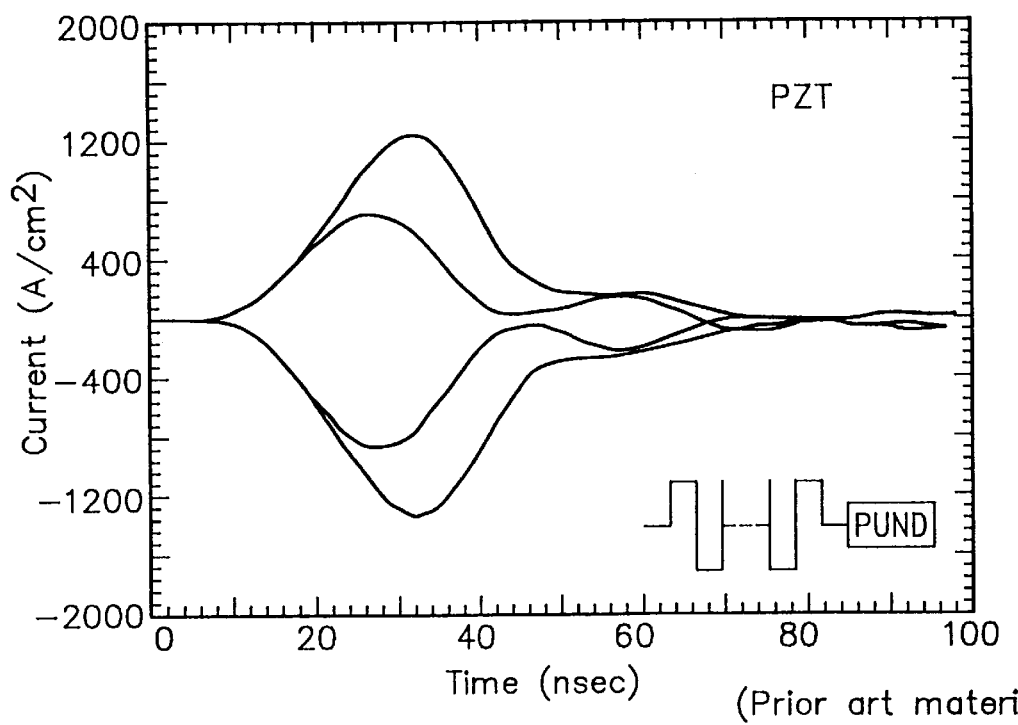
FIG. 22B shows the results of a PUND measurement taken on a sample of PZT prior art material after pulsing the sample with bipolar pulses at 1 MHZ for one hour at 84° C.
Figure 22C:
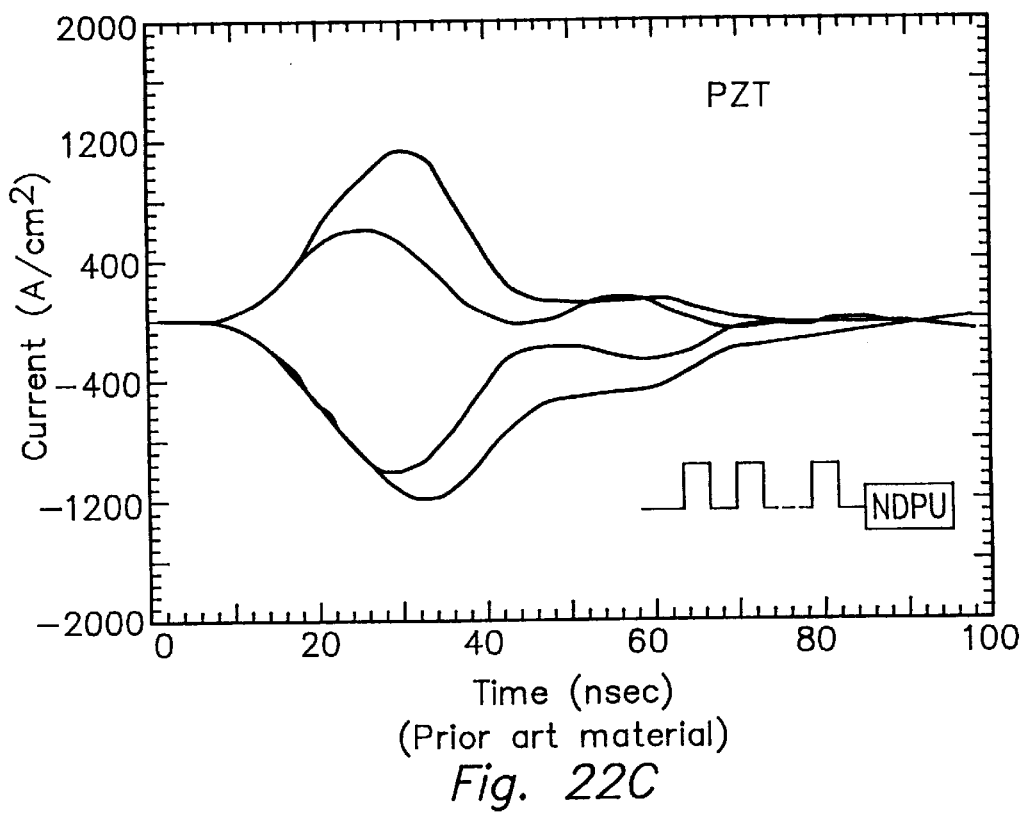
FIG. 22C shows the results of a PUND measurement taken on a sample of PZT prior art material after pulsing the sample with positive pulses at 1 MHZ for one hour at 84° C.
Figure 22D:
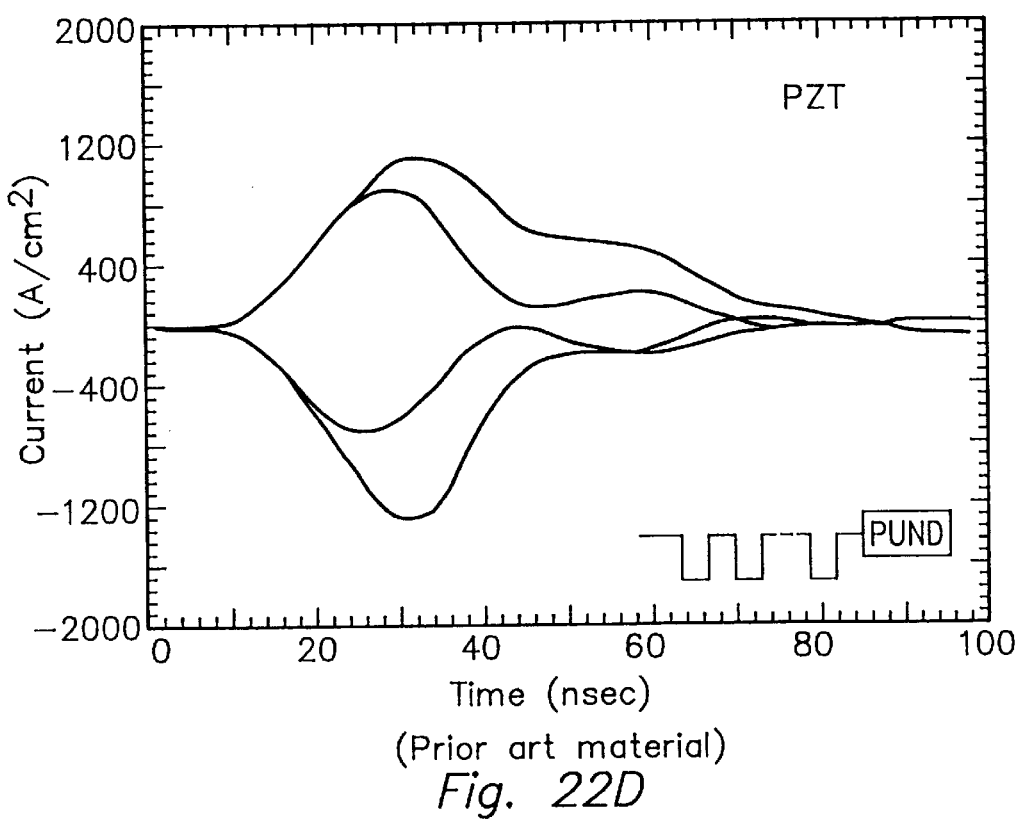
FIG. 22D shows the results of a PUND measurement taken on a sample of PZT prior art material after pulsing the sample with negative pulses at 1 MHZ for one hour at 84° C.
Figure 23A:
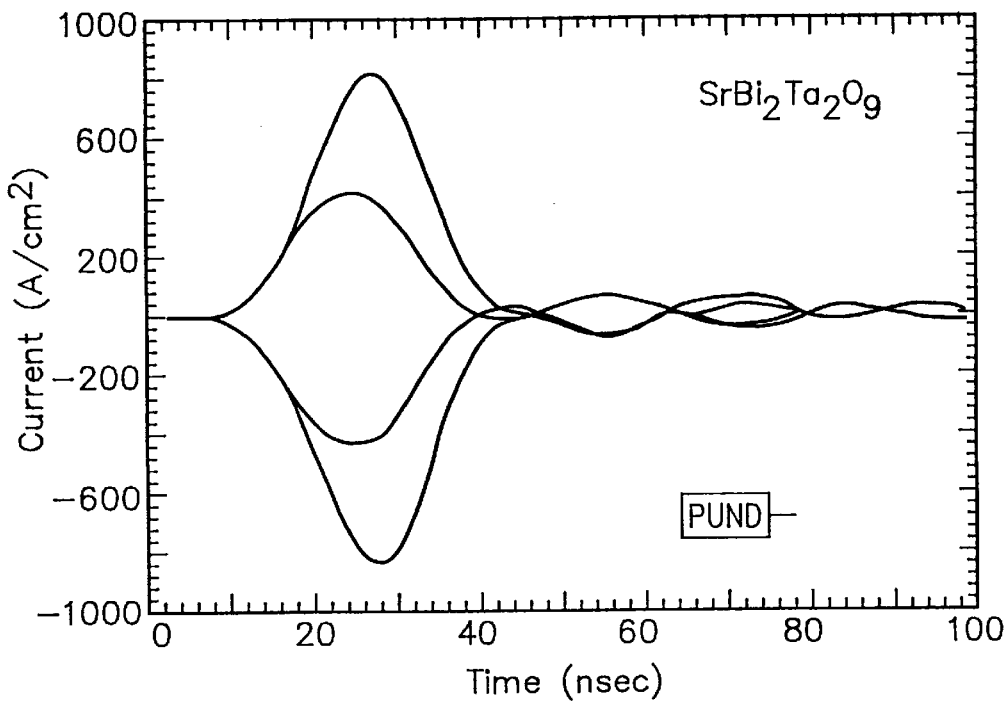
FIG. 23A shows the results of an initial PUND measurement for a sample of $SrBi_2Ta_2O_9$.
Figure 23B:
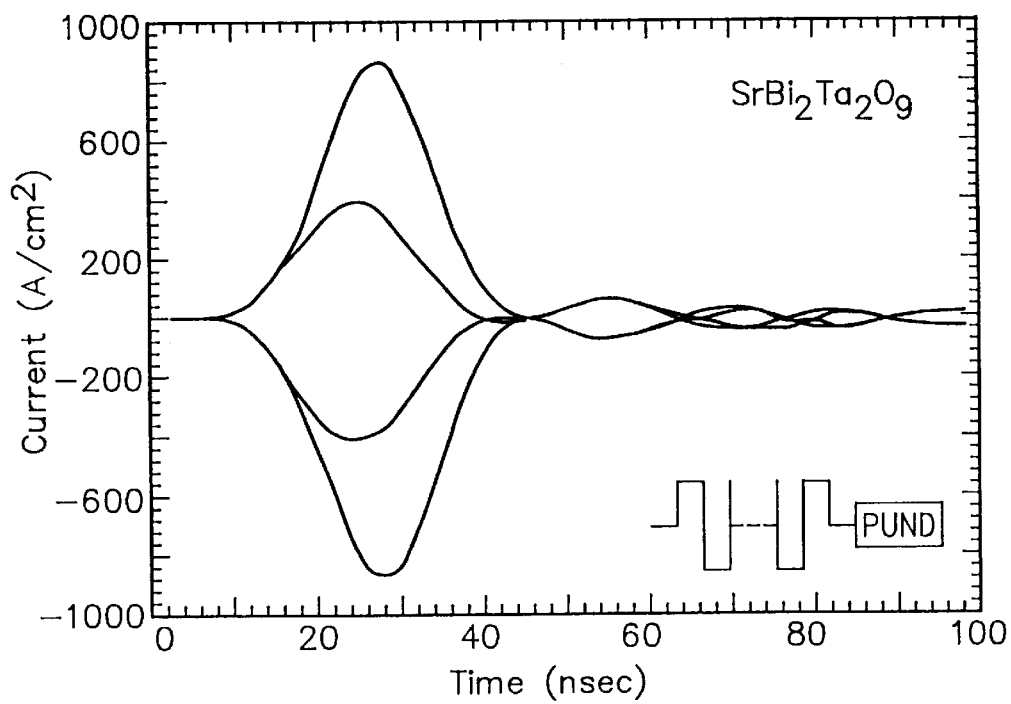
FIG. 23B shows the results of a PUND measurement taken on a sample of $SrBi_2Ta_2O_9$ after pulsing the sample with bipolar pulses at 1 MHZ for one hour at 84° C.
Figure 23C:
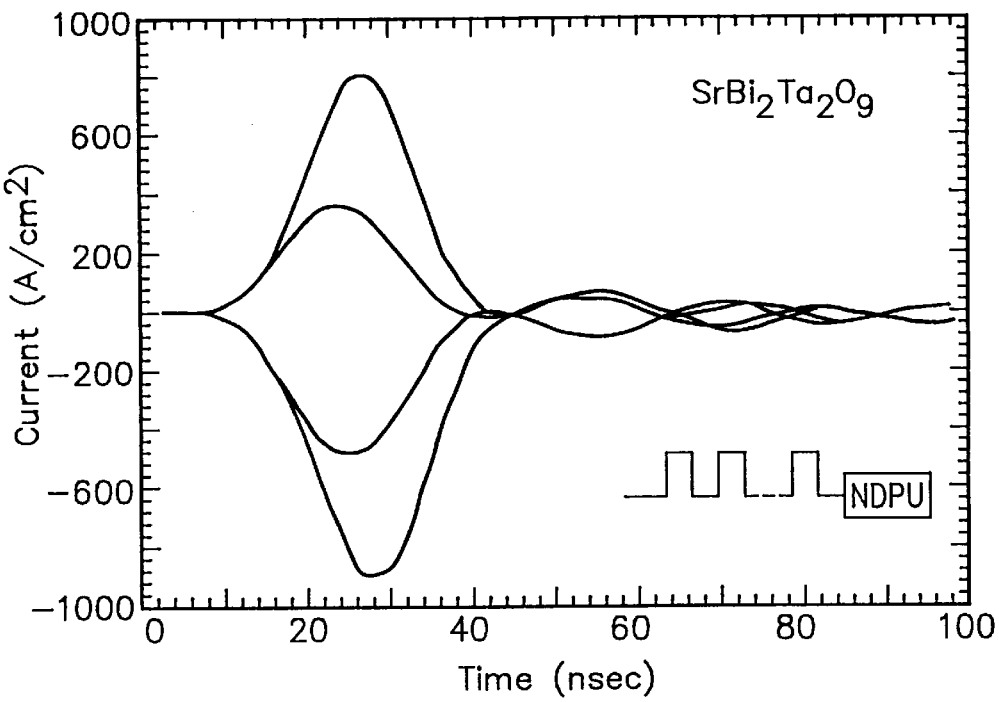
FIG. 23C shows the results of a PUND measurement taken on a sample of $SrBi_2Ta_2O_9$ after pulsing the sample with positive pulses at 1 MHZ for one hour at 84° C.
Figure 23D:
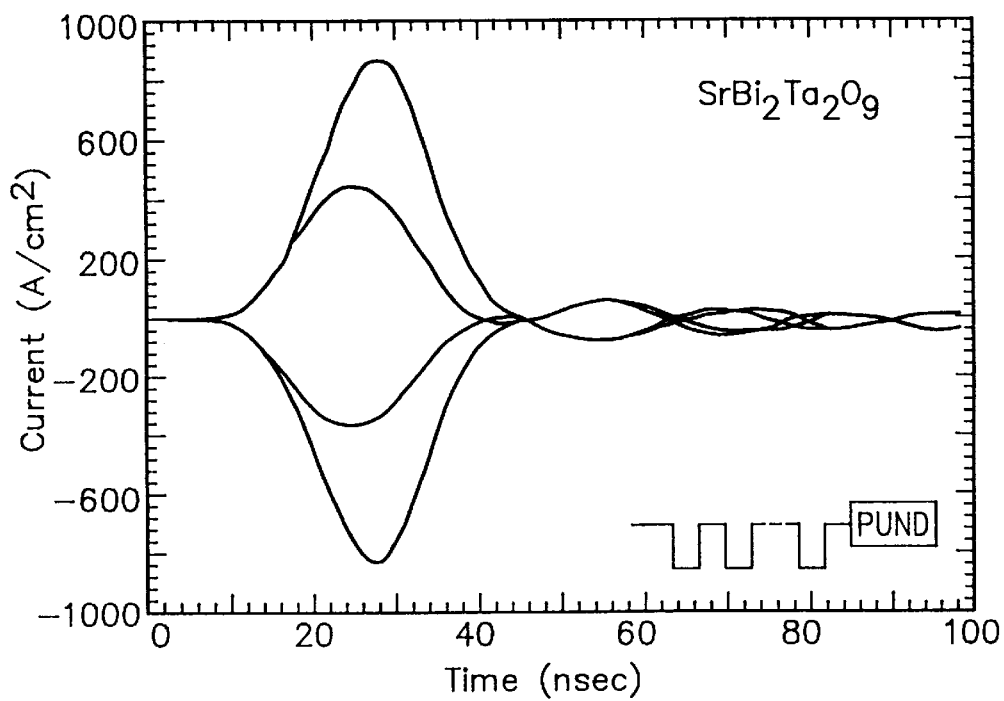
FIG. 23D shows the results of a PUND measurement taken on a sample of $SrBi_2Ta_2O_9$ after pulsing the sample with negative pulses at 1 MHZ for one hour at 84° C.

FIGS. 22A through 22D illustrate the imprinting characteristic of the prior art PZT material: FIG. 22A shows the results of an initial PUND measurement for a virgin sample of PZT prior art material; FIG. 22B shows the results of a PUND measurement taken on a sample of PZT after pulsing the sample with bipolar pulses at 1 MHZ for one hour at 84° C.; FIG. 22C shows the results of a PUND measurement taken on a sample of PZT after pulsing the sample with positive pulses at 1 MHZ for one hour at 84° C.; and FIG. 22D shows the results of a PUND measurement taken on a sample of PZT after pulsing the sample with negative pulses at 1 MHZ for one hour at 84° C. Comparing FIG. 22B with FIG. 22A, the overall level of the curves changes significantly, though the general shape of the curves remains the same. Comparing FIGS. 22C and 22D with FIG. 22A, the overall level of the curves drop by more than 30% and the shape of the curves changes so much that the reliability of the material in a memory would be compromised. It is noted that generally the hysteresis imprinting and fatigue in PZT is even more pronounced than the PUND fatigue. FIGS. 23A through 23D the results of an identical series of tests on $SrBi_2Ta_2O_9$ is shown. There is not significant change in either the level of the curves or the shape of the curves in any test. In fact that changes are so small that it would be difficult to guess which was the initial curve if one were not told. Thus the layered superlattice material shows little or no evidence of imprinting.

Figure 24:
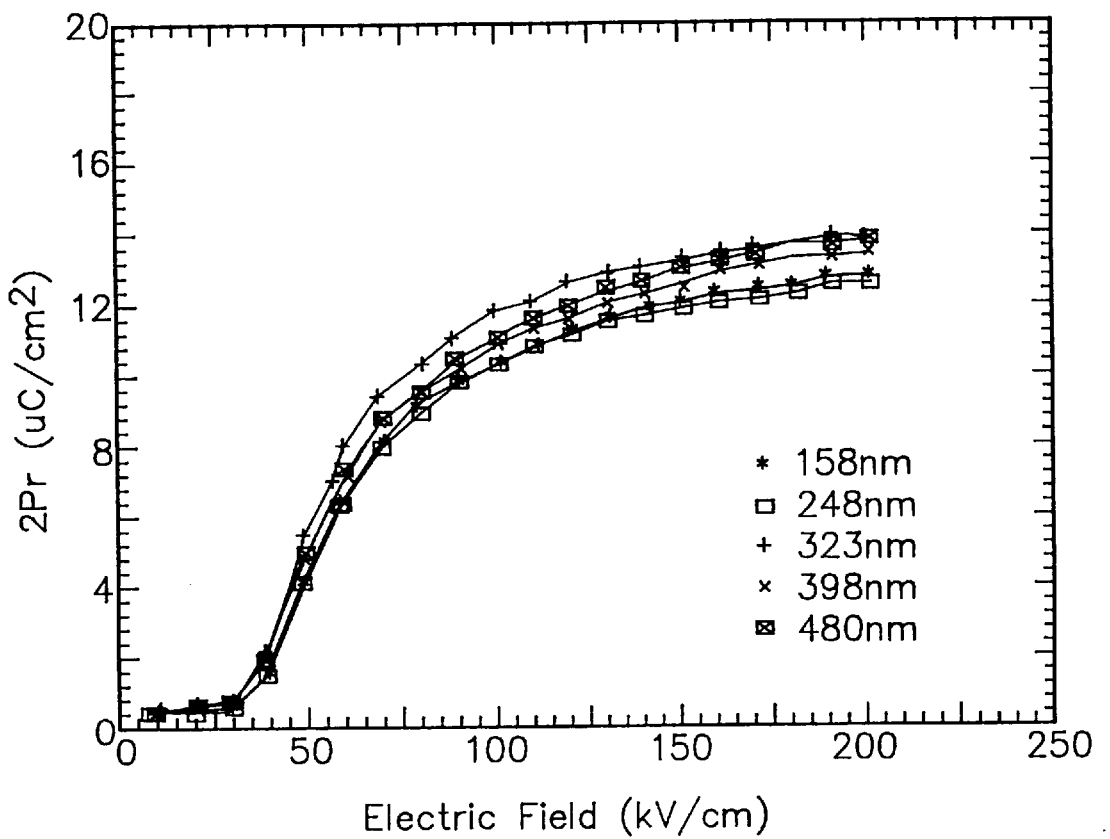
FIG. 24 shows 2Pr versus electric field for four different samples of $SrBi_2Ta_2O_9$ having a variety of thicknesses.
Figure 25:
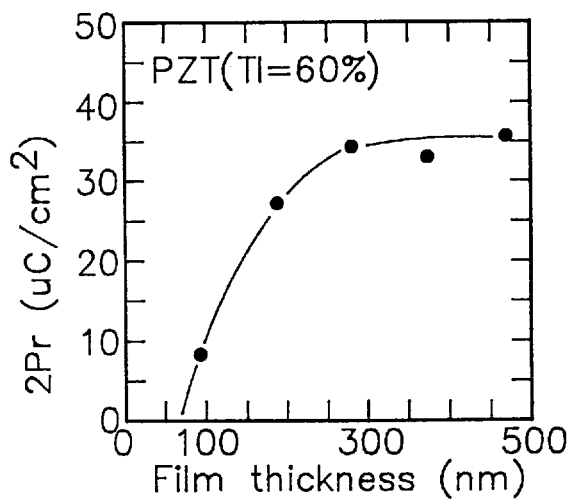
FIG. 25 shows a plot of 2Pr versus film thickness for PZT prior art material.
Figure 27:
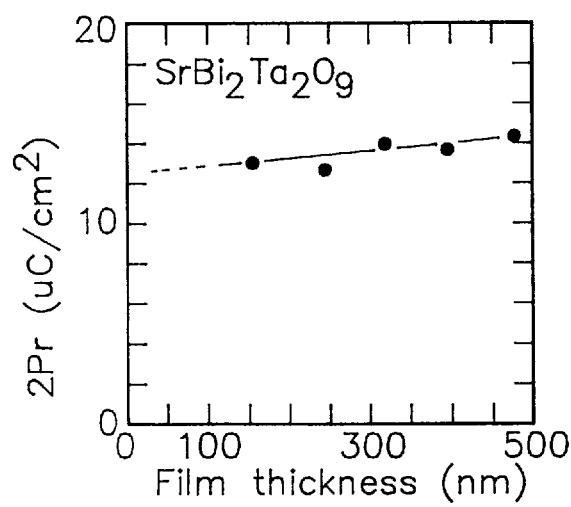
FIG. 27 shows a plot of 2Pr versus film thickness for the $SrBi_2Ta_2O_9$ samples of FIG. 24.

FIG. 24 shows 2Pr versus electric field for five different samples of $SrBi_2Ta_2O_9$ having a variety of thicknesses. Changing the thickness by a factor of three changes the polarizability by less than 20%. FIG. 25 shows a plot of 2Pr versus film thickness for PZT prior art material, while FIG. 27 shows essentially the same plot based on the results shown in FIG. 24 for $SrBi_2Ta_2O_9$. A comparison of the figures shows that the change for PZT is huge compared to that for the superlattice layered material. When fabricating thin film devices, it is difficult to control the thickness of the layers within about 10%. Thus is should be much easier to design and fabricate a layered thin film device, such as an integrated circuit, with predictable specifications out of the layered superlattice materials than it is for PZT.

Figure 26:
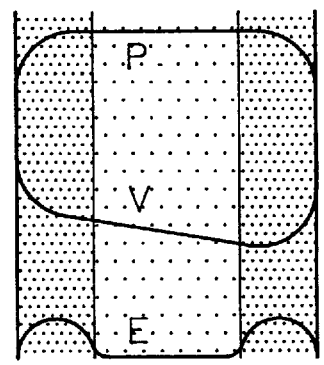
FIG. 26 illustrates the surface charge and resulting effect on the polarization, voltage and electric field when a polarizing field is applied to a sample of PZT having a 2Pr versus film thickness curve as in FIG. 25.
Figure 28:
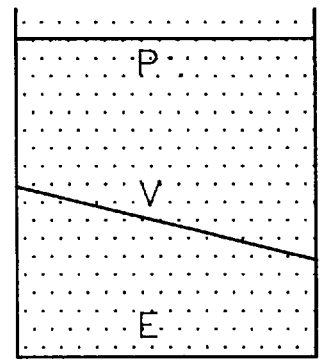
FIG. 28 illustrates the polarization, voltage and electric field when a polarizing field is applied to a sample of $SrBi_2Ta_2O_9$ having a 2Pr versus film thickness curve as in FIG. 27.

FIG. 26 illustrates the surface charge and resulting effect on the polarization (P), voltage (V), and electric field (E) when a polarizing field is applied to a sample of PZT having a 2Pr versus film thickness curve as in FIG. 25, while FIG. 28 illustrates the polarization (P), voltage (V), and electric field (E), when a polarizing field is applied to a sample of $SrBi_2Ta_2O_9$ having a 2Pr versus film thickness curve as in FIG. 27. In the prior art PZT material there is a large space charge at the surface that causes the polarizability, voltage and field to change sharply, while in the layered superlattice material the polarizabilty and field remain essentially flat throughout the device. In the layered superlattice material almost all of the polarizability effects measured take place within the bulk of the material. In thin samples of PZT less that 200 nm thick, most of the polarizability effect measured is due to space charge near the surface of the sample. This difference is believed to be due to the layered nature of the layered superlattice material compared to the continuous nature of the PZT. The layered superlattice material is characterized by short range order in a dilute pseudo spin system, while the PZT is characterized by long range order in a highly correlated system. That is, in PZT the polarization of the individual dipoles is correlated across the whole bulk of the material. Thus the dipoles act together to create a large ΔP, i.e. a large change in polarization, at the surface of the material, which results in a large space charge at the surface. Moreover, since there is long range correlation, any defect in the system has a relatively strong effect on the entire system. However, in the layered superlattice material each layer of ferroelectric material is very thin, on the order of 25 Å. Thus we have many small dipoles associated with each layer of ferroelectric material, with a discontinuity at each layer of non-ferroelectric material. This results in many small ΔP's distributed throughout the material and no concentration of space charge occurs. Further, each layer, or dipole, is strongly correlated with the next layer as the dielectric material between each layer of ferroelectric material acts like a small capacitor. However, there is little long range correlation between the dipoles corresponding to the layers. Thus if there is a defect in any one layer or dipole, it does not significantly effect the polarizability of the material as a whole. This brings us back to where the research started. The discovery of the unusual properties of the layered superlattice materials started with a search for a solution to the space charge phenomenon at the surface of the prior art ferroelectrics. A solution has been reached, though from an entirely unexpected direction.

There has been described a new class of ferroelectric and high dielectric constant materials and greatly improved dielectric capacitors, switching capacitors, and integrated circuit memories which have many advantages. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, now that it is seen that layered superlattice materials generally have much better ferroelectric and dielectric properties than corresponding non-layered materials, many more examples of these materials can be fabricated and used in electrical devices. These materials may be incorporated into many different devices other than capacitors, many different integrated circuits other than memories, and into many different memory architectures in addition to DRAMs. The materials may also be applied in other switching applications requiring low fatigue, such as pyroelectrics, electro-optics, etc. It is also evident that the steps recited in the fabrication processes may in some instances be performed in a different order. Or equivalent materials, structures, and processes may be substituted for the various materials, structures, and processes described. Different dimensions will certainly be used in other applications. Additional materials, structures, and process steps may be added. Consequently, the invention is to be construed as embracing each and every novel feature and novel combination of features present in and/or possessed by the ferroelectric and dielectric materials, structures, and processes described.

What is claimed is:

1. A method of fabricating a memory device having low fatigue, said method comprising the steps of:
providing a substrate;
forming on said substrate a memory cell,
said step of forming said memory cell on said substrate including a step of spontaneously forming a layered superlattice material structure in a thin film, said layered superlattice material structure having oxygen octahedra layers alternating with non-perovskite layers, with said oxygen octahedra layers and non-perovskite layers linked in an interdependent manner; and
completing said memory on said substrate.

2. A method as in claim 1 wherein said layered superlattice material comprises one of the elements from the group consisting of strontium, calcium, cadmium, lead, tantalum, hafnium, tungsten, niobium, zirconium, scandium, yttrium, lanthanum, antimony, chromium, and thallium.

3. A method as in claim 1 wherein said layered superlattice material comprises a material selected from the group consisting of: strontium bismuth tantalate, strontium bismuth niobate, strontium bismuth tantalum niobate, barium bismuth tantalate, lead bismuth tantalate, and barium bismuth niobate.

4. A method of fabricating a ferroelectric memory device having low fatigue, said method comprising the steps of:
providing a substrate;
forming on said substrate a memory cell including a thin film of a layered superlattice material having ferroelectric layers alternating with non-ferroelectric shock absorber layers, with said ferroelectric and non-ferroelectric layers linked in an interdependent manner; and
completing said memory on said substrate.

5. A method as in claim 4 wherein said layered superlattice material comprises one of the elements from the group consisting of strontium, calcium, cadmium, lead, tantalum, hafnium, tungsten, niobium, zirconium, scandium, yttrium, lanthanum, antimony, chromium, and thallium.

6. A method as in claim 4 wherein said layered superlattice material comprises a material selected from the group consisting of: strontium bismuth tantalate, strontium bismuth niobate, and strontium bismuth tantalum niobate.

7. A method of fabricating an integrated circuit memory device, said method comprising the steps of:
providing a substrate;
forming on said substrate a memory cell including a thin film of a material selected from the group of compounds consisting of strontium bismuth titanate, strontium bismuth tantalate, strontium bismuth niobate, strontium bismuth tantalum niobate, lead bismuth niobate, barium bismuth tantalate, lead bismuth tantalate, and barium bismuth niobate; and
completing an integrated circuit on said substrate, said integrated circuit including said memory cell.

8. A method as in claim 7 wherein said step of forming comprises forming a thin film of strontium bismuth titanate.

9. A method as in claim 7 wherein said step of forming comprises forming a thin film of strontium bismuth tantalate.

10. A method as in claim 7 wherein said step of forming comprises forming a thin film strontium bismuth niobate.

11. A method as in claim 7 wherein said step of forming comprises forming a thin film of strontium bismuth tantalum niobate.

12. A method as in claim 7 wherein said step of forming comprises forming a thin film of lead bismuth niobate.

13. A method as in claim 7 wherein said step of forming comprises forming a thin film of barium bismuth tantalate.

14. A method as in claim 7 wherein said step of forming comprises forming a thin film of lead bismuth tantalate.

15. A method as in claim 7 wherein said step of forming comprises forming a thin film of barium bismuth niobate.

16. A method as in claim 7 wherein said step of forming comprises forming a thin film of a solid solution of two or more compounds selected from said group.

17. A method of fabricating a ferroelectric memory, said method comprising the steps of:
forming a first electrode on a substrate;
forming a thin film of a layered superlattice ferroelectric material on said first electrode; and
forming a second electrode on said ferroelectric material.

18. A method of fabricating an integrated circuit memory device, said method comprising the steps of:
providing a substrate;
forming on said substrate a memory including a thin film consisting essentially of material selected from the group consisting of strontium bismuth titanate, strontium bismuth tantalate, strontium bismuth niobate, strontium bismuth tantalum niobate, lead bismuth niobate, barium bismuth tantalate, lead bismuth niobate, lead bismuth tantalate, barium bismuth niobate, and combinations thereof; and completing an integrated circuit on said substrate, said integrated circuit including said memory cell.

* * * * *